United States Patent
Futagawa et al.

(10) Patent No.: US 9,252,566 B2
(45) Date of Patent: Feb. 2, 2016

(54) METHOD OF MANUFACTURING LIGHT EMITTING ELEMENT

(71) Applicant: Sony Corporation, Tokyo (JP)

(72) Inventors: Noriyuki Futagawa, Kanagawa (JP); Tatsushi Hamaguchi, Kanagawa (JP); Masaru Kuramoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/449,804

(22) Filed: Aug. 1, 2014

(65) Prior Publication Data

US 2015/0044795 A1    Feb. 12, 2015

(30) Foreign Application Priority Data

Aug. 9, 2013  (JP) .................. 2013-166572

(51) Int. Cl.
*H01S 5/183* (2006.01)
*H01S 5/30* (2006.01)
*B82Y 20/00* (2011.01)
*H01S 5/02* (2006.01)
*H01S 5/042* (2006.01)
*H01S 5/343* (2006.01)

(52) U.S. Cl.
CPC ............ *H01S 5/18341* (2013.01); *B82Y 20/00* (2013.01); *H01S 5/18308* (2013.01); *H01S 5/3013* (2013.01); *H01S 5/0207* (2013.01); *H01S 5/0216* (2013.01); *H01S 5/0217* (2013.01); *H01S 5/0425* (2013.01); *H01S 5/34333* (2013.01); *H01S 2304/04* (2013.01)

(58) Field of Classification Search
None
See application file for complete search history.

(56) References Cited

U.S. PATENT DOCUMENTS

2003/0032210 A1* 2/2003 Takayama et al. ............... 438/30
2010/0098127 A1* 4/2010 Higuchi et al. ............ 372/50.11

FOREIGN PATENT DOCUMENTS

JP        2010-123921 A     6/2010

* cited by examiner

*Primary Examiner* — Pamela E Perkins
(74) *Attorney, Agent, or Firm* — Sheridan Ross P.C.

(57) ABSTRACT

A method of manufacturing a light emitting element includes, sequentially, (a) forming a mask layer for selective growth; (b) forming a layered structure body by layering a first compound semiconductor layer, an active layer, and a second compound semiconductor layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the mask layer; and (f) forming a first light reflecting layer formed from a multilayer film and a first electrode on the first surface of the first compound semiconductor layer.

6 Claims, 43 Drawing Sheets

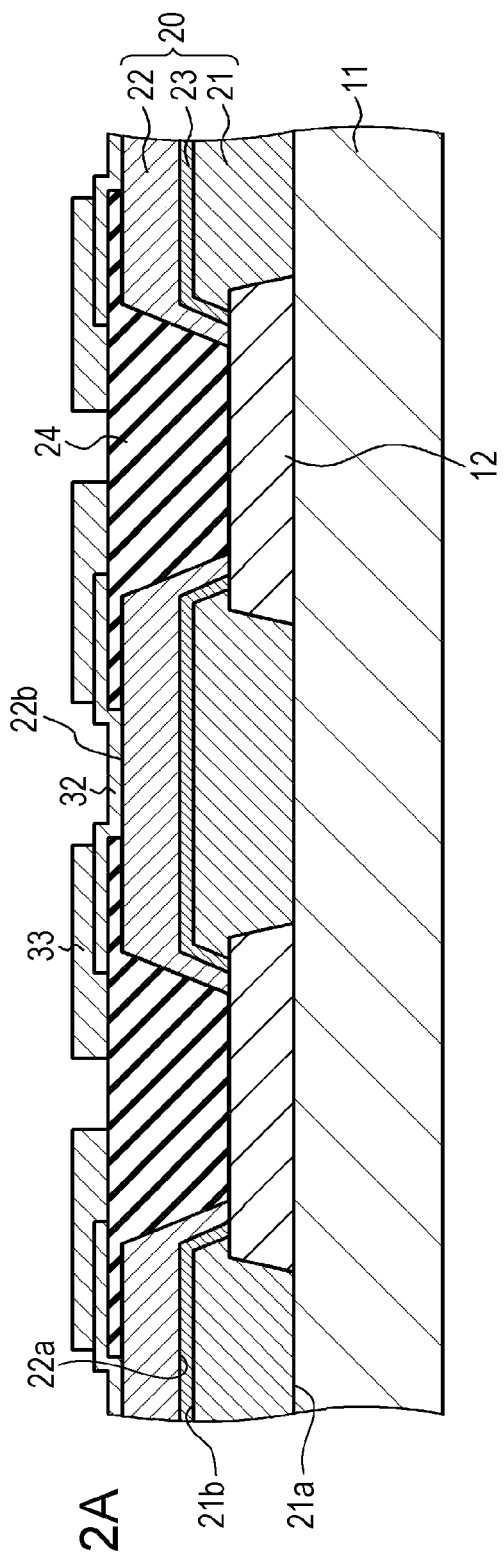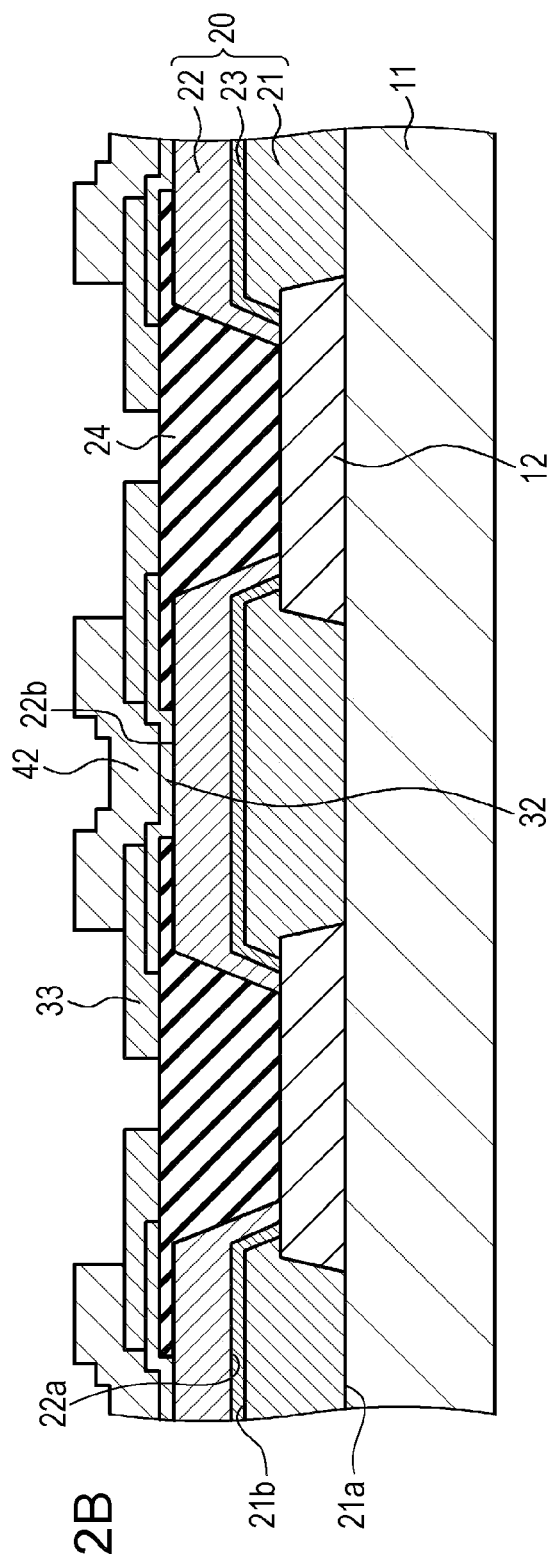

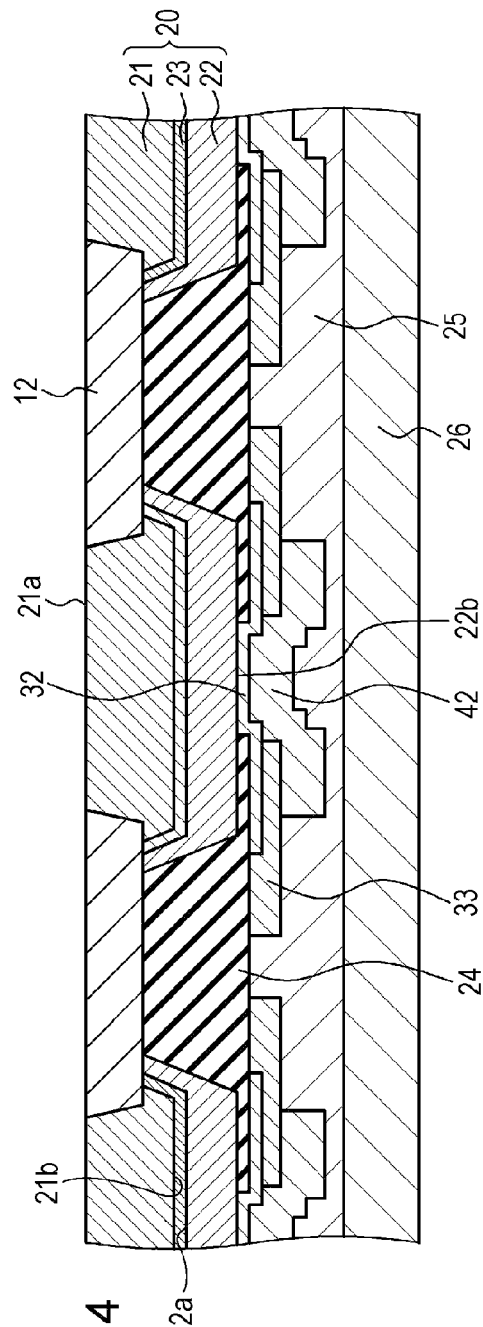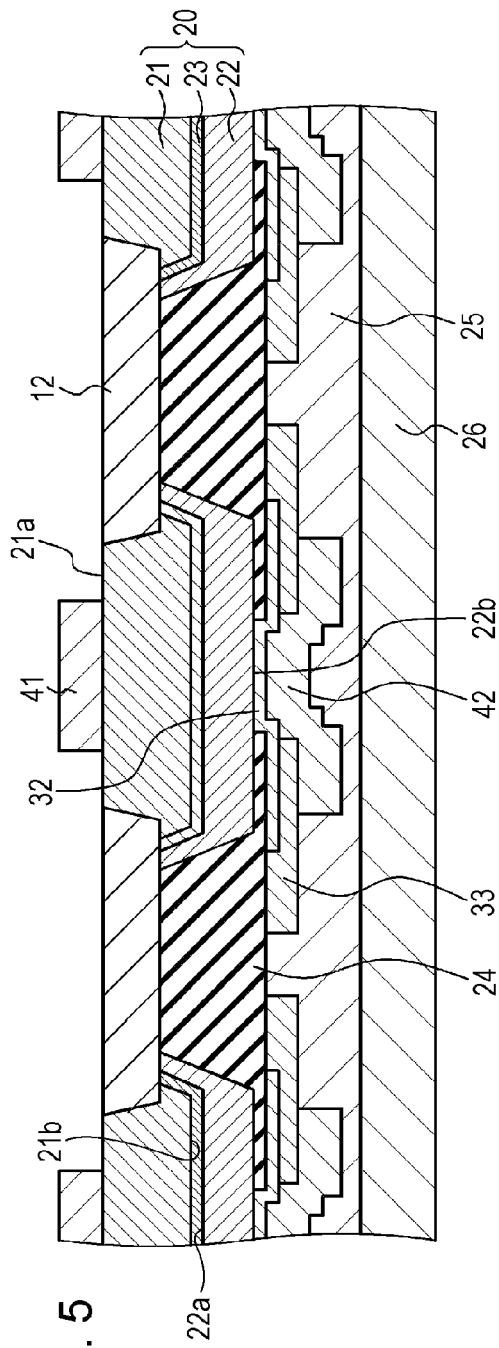

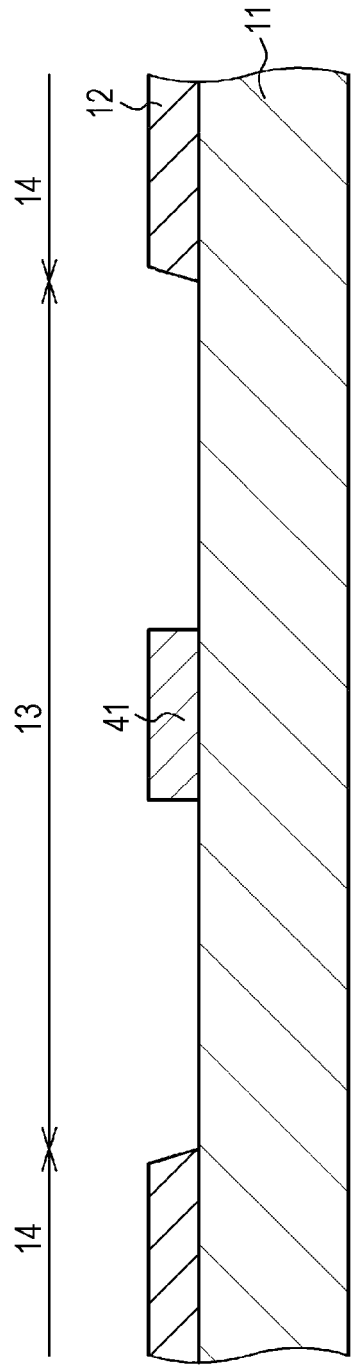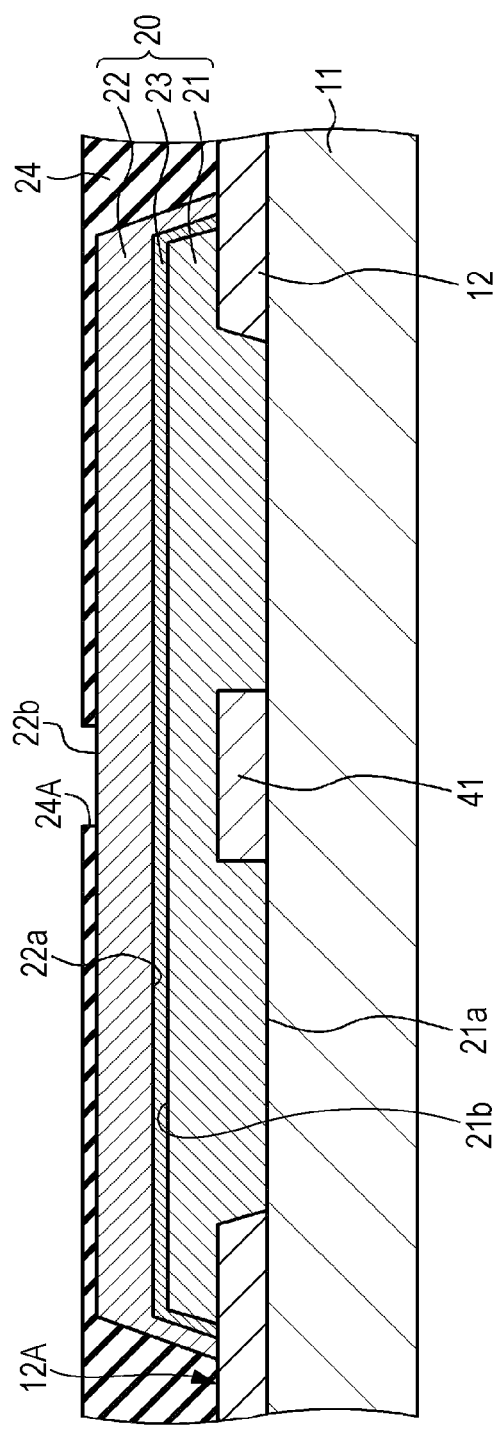
FIG. 19A
FIG. 19B

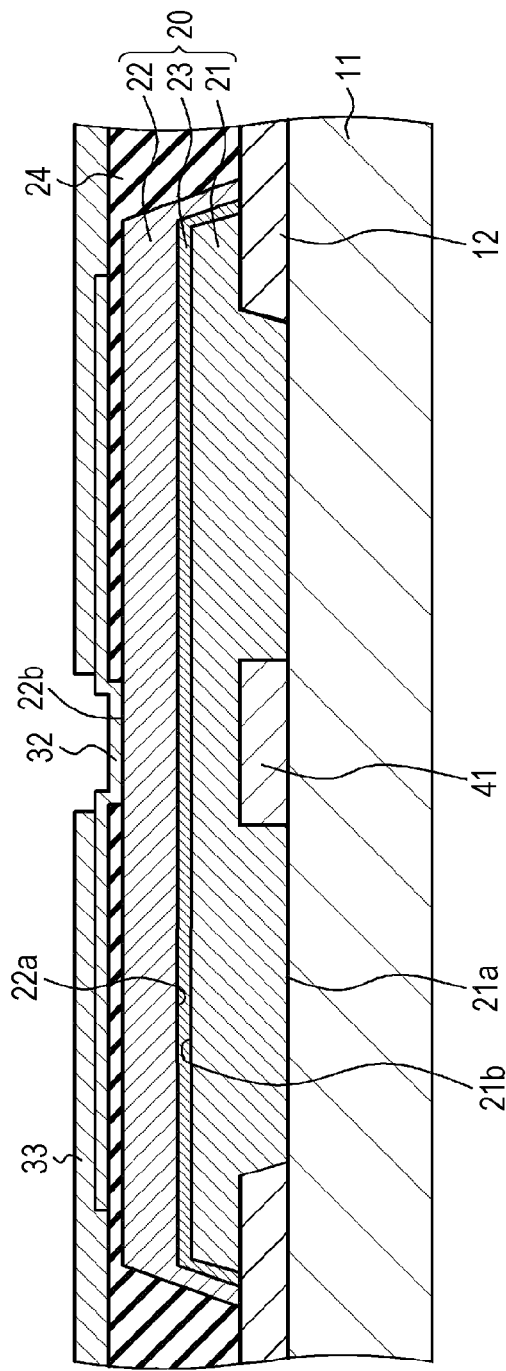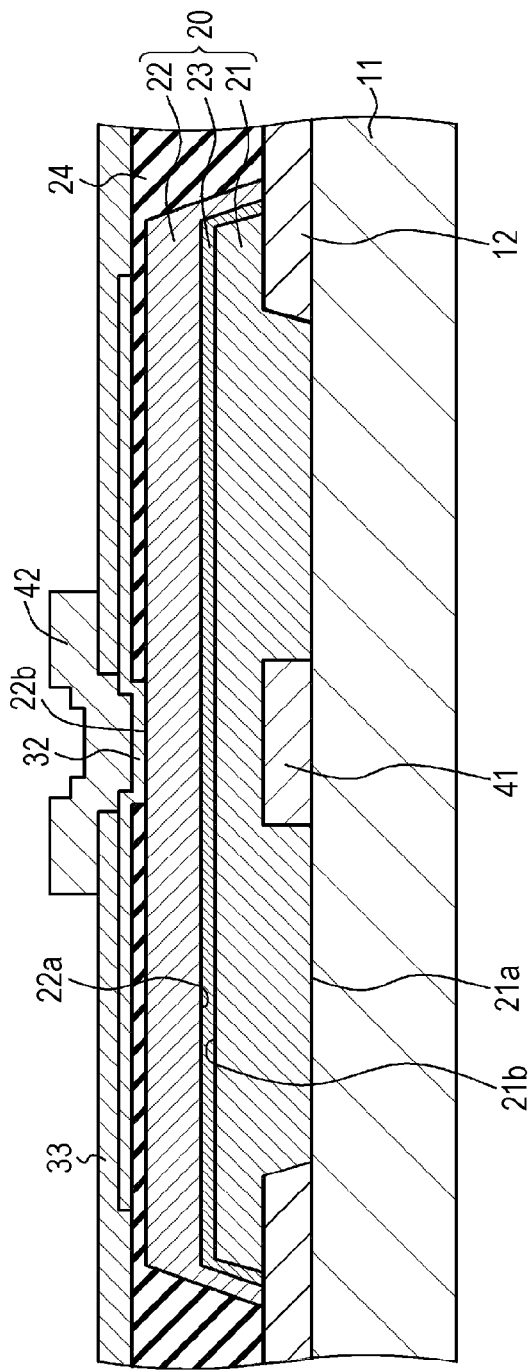
FIG. 20A
FIG. 20B

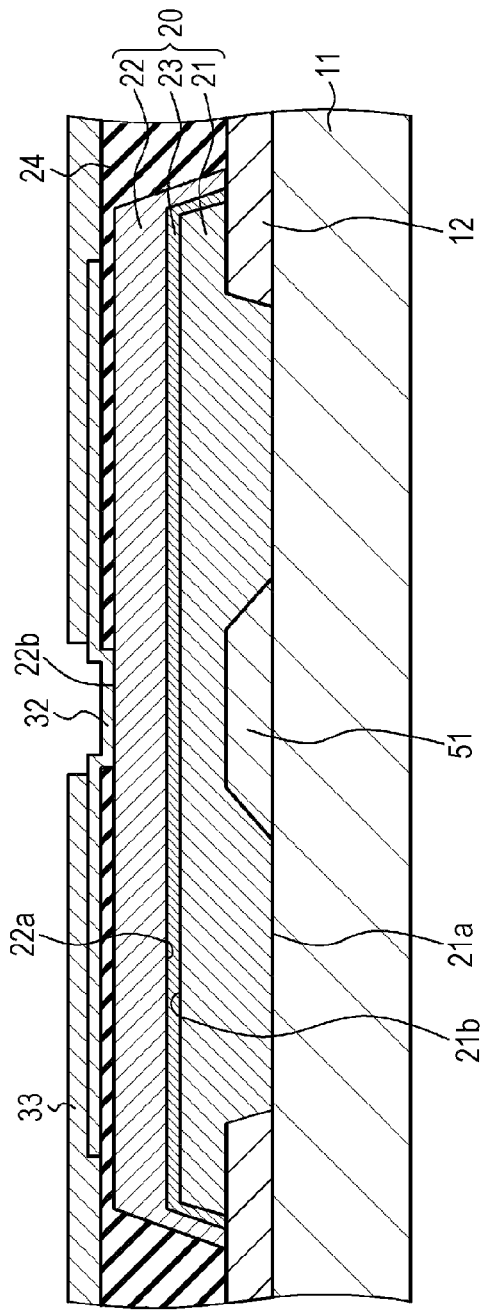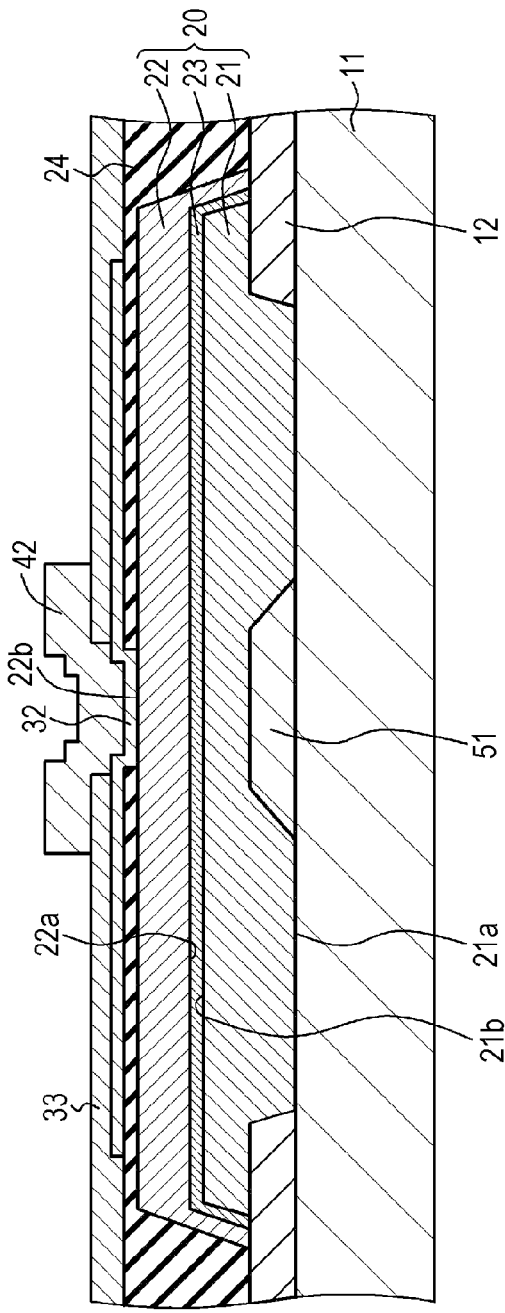

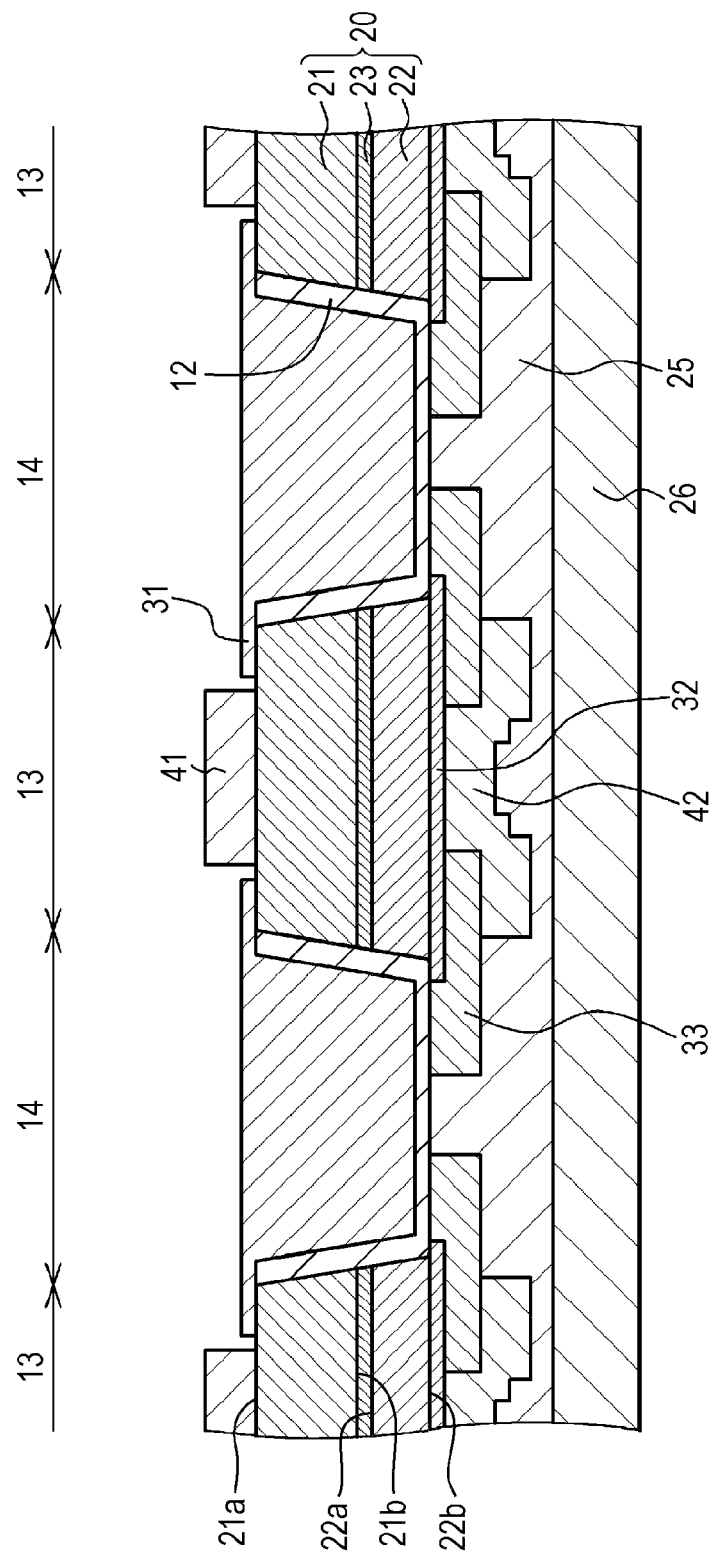

METHOD OF MANUFACTURING LIGHT EMITTING ELEMENT

CROSS REFERENCE TO RELATED APPLICATIONS

This application claims the benefit of Japanese Priority Patent Application JP 2013-166572 filed Aug. 9, 2013, the entire contents of which are incorporated herein by reference.

BACKGROUND

The present disclosure relates to a method of manufacturing a light emitting element.

Surface-emitting laser elements (vertical resonator laser, VCSEL) configured from a nitride semiconductor are known from, for example, Japanese Unexamined Patent Application Publication No. 2010-123921. The surface-emitting laser element disclosed in the unexamined patent publication is manufactured by forming a layered body of a nitride semiconductor in which a second conductivity type layer, a light emitting layer and a first conductivity type layer are layered in that order on a substrate, forming a first black reflector formed from a dielectric multilayer film on a first conductivity type layer, forming a first electrode electrically connected to the first conductivity type layer on the first black reflector, bonding the layered body to a support substrate via the first black reflector and the first electrode, exposing the second conductivity type layer by removing the substrate from the layered body, and forming a second electrode, and a second black reflector formed from a dielectric multilayer film and arranged to oppose the first black reflector on the surface in which the second conductivity type layer is exposed.

Although the second conductivity type layer is exposed by removing a part or all of the substrate from the layered body, a laser lift off method, polishing, etching or the like are used for the removal of the substrate. Scattering of light by the surface of the second conductivity type layer is suppressed to the lowest limit by mirror finishing the exposed surface of the second conductivity type layer based on a chemical/mechanical polishing (CMP) method using a suitable polishing agent, an etching method using a suitable etchant, or the like. A second electrode and a second black reflector are formed in an arbitrary order on the mirror finished surface of the second conductivity type layer.

SUMMARY

Incidentally, on the surface of the substrate, it is important to achieve uniformity in the lengths of the first black reflector in each surface-emitting laser element, the layered body, and the resonator formed from the second black reflector (more specifically, the thickness of the layered body). Therefore, it is important to suppress the occurrence of variations, for example, in the removal amount of the second conductivity type layer based on a CMP method on the surface of the substrate. However, there is no mention in the unexamined patent publication with respect to a means for suppressing the occurrence of variations in the removal amount of the second conductivity type layer on the surface of the substrate.

Accordingly, it is desirable to provide a method of manufacturing a light emitting element having a configuration and a structure able to achieve uniformity in the length of a resonator.

According to a first embodiment of the present disclosure, there is provided a method of manufacturing a light emitting element including, sequentially, (a) forming a mask layer for selective growth formed from a material different from a material that configures a first compound semiconductor layer on a region outside an element forming region on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the element forming region; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the mask layer; and (f) forming a first light reflecting layer formed from a multilayer film and a first electrode on the first surface of the first compound semiconductor layer.

According to a second embodiment of the present disclosure, there is provided a method of manufacturing a light emitting element including, sequentially (a) forming a mask layer for selective growth formed from a material different from a material that configures a first compound semiconductor layer on a region outside an element forming region on a substrate for manufacturing a light emitting element, and forming a first light reflecting layer formed from a multilayer film, which has a convex shape on the element forming region; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element including the first light reflecting layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer, the mask layer and the first light reflecting layer; and (f) forming a first electrode on at least the first surface of the first compound semiconductor layer.

According to a third embodiment of the present disclosure, there is provided a method of manufacturing a light emitting element including, sequentially, (a) forming a mask layer for selective growth formed from a material different from a material that configures a first compound semiconductor layer on a region outside an element forming region on a substrate for manufacturing a light emitting element, and forming a convexity formed from a material different to the material that configures the first compound semiconductor layer on the element forming region; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element that includes the convexity; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer, the mask layer, and the convexity; and (f) then removing the convexity, forming a first light reflecting layer formed from a multilayer film on at least a part of the first surface on the first compound semiconductor layer from which the convexity is removed, and forming a first electrode on at least a part of the first surface of the first compound semiconductor layer on which the first electrode is to be formed.

In the first embodiment of the present disclosure, the substrate for manufacturing a light emitting element is removed in a state in which a mask layer for selective growth is formed. In the second embodiment, the substrate for manufacturing a light emitting element is removed in a state in which a mask layer for selective growth and a first light reflecting layer are formed. In the third embodiment, the substrate for manufacturing a light emitting element is removed in a state in which a mask layer for selective growth and a concavity are formed. Therefore, when removing the substrate for manufacturing a light emitting element, since the mask layer, the first light reflecting layer or the convexity function as one type of stopper, it is possible to suppress the occurrence of removal variations in the substrate for manufacturing a light emitting element on the surface of the substrate for manufacturing a light emitting element, and further, the occurrence of thickness variations the first compound semiconductor layer, and since it is possible to achieve uniformity in the length of the resonator, it is possible to achieve stability in the characteristics of the obtained light emitting element. The effect described in the specification is merely an example and the disclosure is not limited thereto, and there may be additional effects.

BRIEF DESCRIPTION OF THE DRAWINGS

FIGS. 2A and 2B are schematic partial end face views of the layered structure body for illustrating the method of manufacturing a light emitting element of Embodiment 1, continued from FIG. 1B;

FIG. 4 is a schematic partial end face view of the layered structure body for illustrating the method of manufacturing a light emitting element of Embodiment 1, continued from FIG. 3;

FIG. 5 is a schematic partial end face view of the layered structure body for illustrating the method of manufacturing a light emitting element of Embodiment 1, continued from FIG. 4;

FIGS. 19A and 19B are schematic partial end face views of a layered structure body for illustrating a method of manufacturing a light emitting element of Embodiment 2;

FIGS. 20A and 20B are schematic partial end face views of the layered structure body for illustrating the method of manufacturing a light emitting element of Embodiment 2, continued from FIG. 19B;

FIGS. 26A and 26B are schematic partial end face views of the layered structure body for illustrating the method of manufacturing a light emitting element of Embodiment 3, continued from FIG. 25B;

FIG. 45 is a schematic partial end face view of still another modification example of the light emitting element of Embodiment 1.

DETAILED DESCRIPTION OF EMBODIMENTS

Figure 1A:
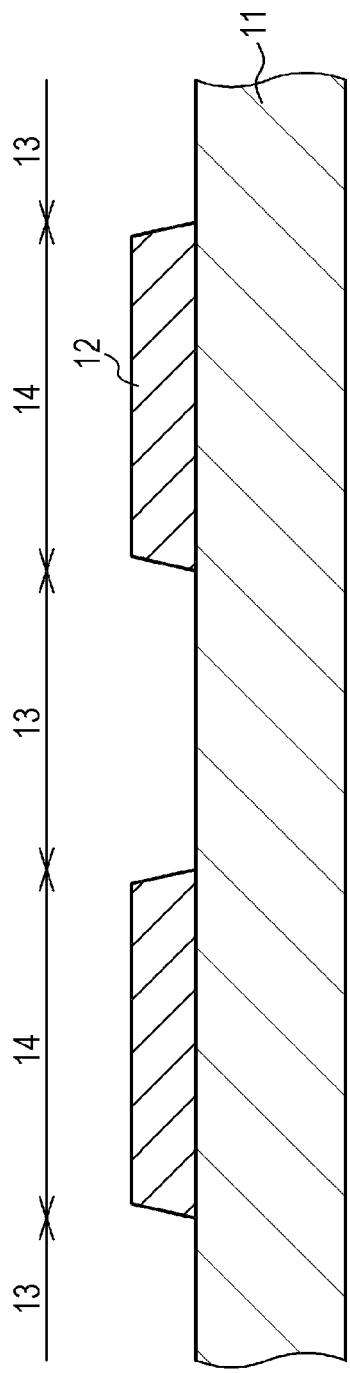
FIGS. 1A and 1B are schematic partial end face views of a layered structure body for illustrating a method of manufacturing a light emitting element of Embodiment 1.
Figure 1B:
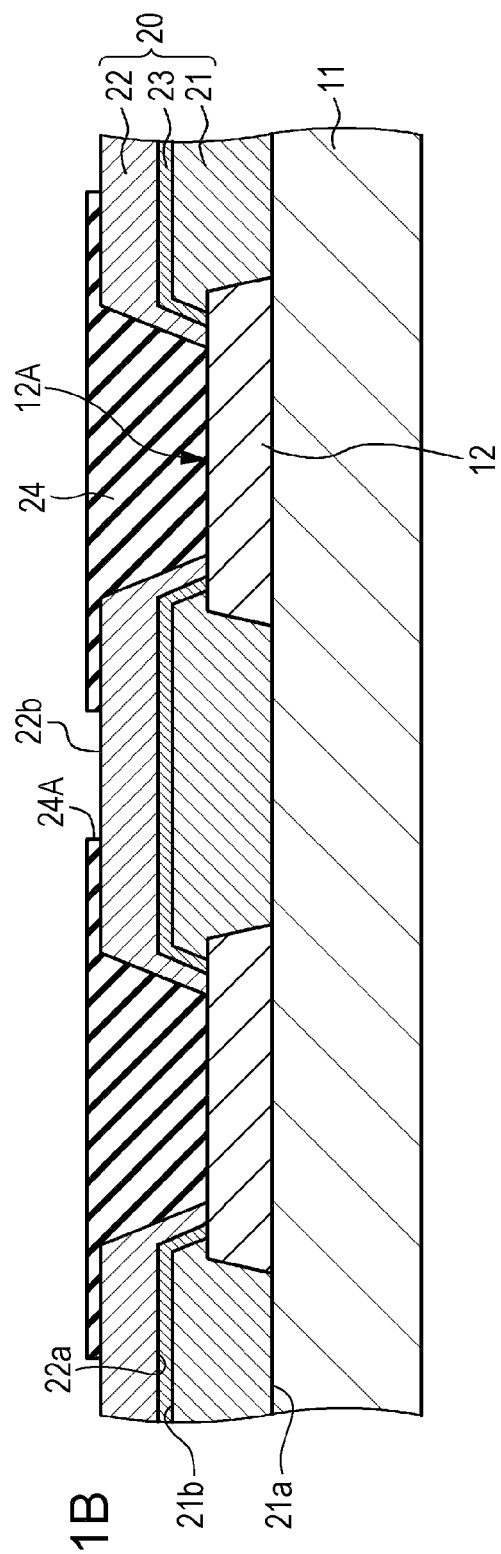
Figure 3:
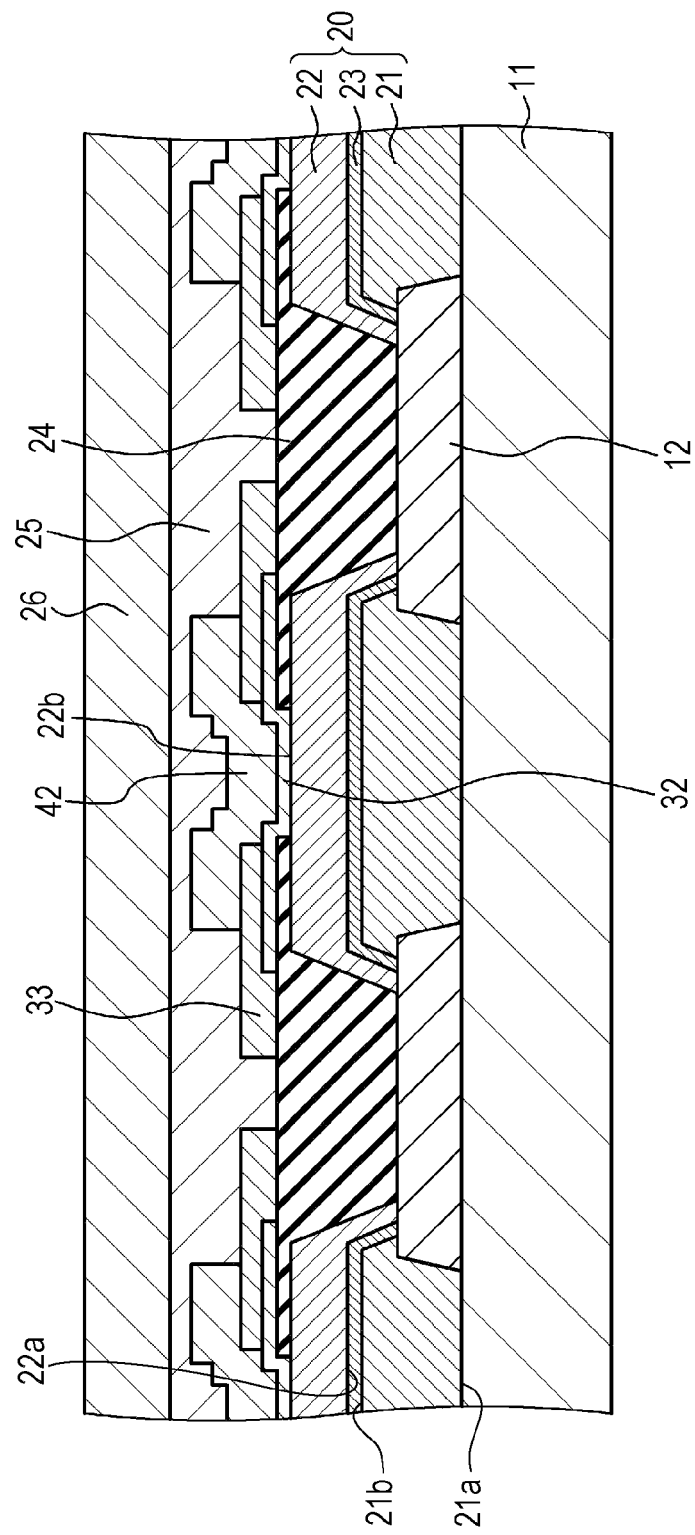
FIG. 3 is a schematic partial end face view of the layered structure body for illustrating the method of manufacturing a light emitting element of Embodiment 1, continued from FIG. 2B.

Below, although the present disclosure will be described based on the embodiments with reference to the diagrams, the disclosure is not limited to the embodiments, and various numerical values or materials are given as examples in the Embodiments. The description will be given in the following order.

1. Description Relating Generally To Method Of Manufacturing Light Emitting Element According To First, Second And Third Embodiments Of Disclosure
2. Embodiment 1 (Method Of Manufacturing Light Emitting Element According To First Embodiment Of Disclosure)
3. Embodiment 2 (Method Of Manufacturing Light Emitting Element According To Second Embodiment Of Disclosure)
4. Embodiment 3 (Method Of Manufacturing Light Emitting Element According To Third Embodiment Of Disclosure)
5. Embodiment 4 (Modification Of Embodiment 2 And Embodiment 3), Others Description Relating Generally to Method of Manufacturing Light Emitting Element According to First, Second and Third Embodiments of Disclosure In the method of manufacturing a light emitting element according to the first embodiment of the disclosure (below, referred to as "first embodiment of the disclosure"), it is possible to use a form in which the first surface of the first compound semiconductor layer and the mask layer are exposed in step (e) based on a chemical/mechanical polishing method. In the method of manufacturing a light emitting element according to the second embodiment of the disclosure (below, referred to as "second embodiment of the disclosure"), it is possible to use a form in which the first surface of the first compound semiconductor layer, the mask layer, and the first light reflecting layer are exposed in step (e) based on a chemical/mechanical polishing method. In the method of manufacturing a light emitting element according to the third embodiment of the disclosure (below, referred to as "third embodiment of the disclosure"), it is possible to use a form in which the first surface of the first compound semiconductor layer, the mask layer, and the convexity are exposed in step (e) based on a chemical/mechanical polishing method. First, removal of the substrate for manufacturing a light emitting element is performed by a wet etching method using an alkaline aqueous solution, such as an aqueous solution of potassium hydroxide or an aqueous solution of sodium hydroxide, an ammonia solution+a hydrogen peroxide, a sulfuric acid solution+a hydrogen peroxide, a hydrochloric acid solution+ hydrogen peroxide, a phosphoric acid solution+hydrogen peroxide, a dry etching method, a lift off method using a laser, mechanical polishing or the like, or by a combination thereof, or the thickness of the substrate for manufacturing a light emitting element is thinned, then the first surface or the like of the first compound semiconductor layer is exposed by performing a chemical/mechanical polishing method.

In the first embodiment of the disclosure including the preferred form, in step (f), although the first light reflecting layer formed from a multilayer film and the first electrode are formed on the first surface of the first compound semiconductor layer, the first electrode layer may be formed after the first light reflecting layer is formed, or the first light reflecting layer may be formed after the first electrode is formed. It is possible to adopt a form in which a step portion is formed on the first compound semiconductor layer is formed by etching a part of the first surface of the first compound semiconductor layer before the first electrode is formed on the first surface of the first compound semiconductor layer in step (f), and the first light reflecting layer is formed on at least an inside of the step portion, and the first electrode is formed on at least the outside of the step portion in step (f). Alternatively, in the first embodiment of the present disclosure, it is possible to adopt a form in which a part of the first surface of the first compound semiconductor layer on which the first electrode is to be formed is etched before forming the first electrode on the first surface of the first compound semiconductor layer in step (f). Alternatively, in the first embodiment of the disclosure, in step (f), it is possible to adopt a form in which a rough surface region is formed on the first compound semiconductor layer by etching a part of the first surface of the first compound semiconductor layer, then a first light reflecting layer is formed on at least a flat region that is a part of the first compound semiconductor layer surrounded by the rough surface region, and a first electrode is formed on at least the rough surface region. Alternatively, in the first embodiment of the disclosure, it is possible to adopt a form in which a part of the first surface of the first compound semiconductor layer is etched based on a reactive ion etching method (RIE method). It is possible to adopt a form in which the rough surface region surrounds the flat region.

In the second and third embodiments of the disclosure including the preferred form, it is possible to etch a part of the first surface of the first compound semiconductor layer on which the first electrode is to be formed before forming the first electrode on the first surface of the first compound semiconductor layer in step (f). Alternatively, in the second and third embodiments of the disclosure, it is possible to adopt a form in which a part of the first surface of the first compound semiconductor layer on which the first electrode is to be formed is etched based on a reactive ion etching method (RIE method).

Examples of the etching method include a reactive ion etching method (RIE method), as described above. However, it is also possible to use a reactive ion beam etching (RIBE) method, an electron cyclotron resonance (ECR) etching method, an ion beam etching method, or the like, instead of the reactive ion etching method. Examples of the etching gas include a fluorine-based gas, such as $CF_4$, a chlorine-based gas, such as $Cl_2$, $CCl_4$, $SiCl_4$, and an iodine-based gas, such as HI. The etching gas may be used singly, or may be mixed and used.

In the first embodiment of the disclosure, it is possible to adopt a form in which the step portion is configured from simple closed curve. The simple closed curve (also referred to as a Jordan closed curve) is not only a curve, but also encompasses a combination of line segments and a combination of curves and line segments.

In the first embodiment of the disclosure including the above-described various preferred forms, it is possible to adopt a form in which the first light reflecting layer is formed on a convexity of the first surface of the first compound semiconductor layer, and the first electrode is formed on a concavity of the first surface of the first compound semiconductor layer, and conversely, it is possible to adopt a form in which the first light reflecting layer is formed on the concavity of the first surface of the first compound semiconductor layer, and the first electrode is formed on the convexity of the first surface of the first compound semiconductor layer.

In the first to third embodiments of the disclosure including the above-described various preferred forms, it is preferable that the value of the surface roughness Ra of the first surface of the first compound semiconductor layer on the inside of the step portion (or, the value of the surface roughness Ra of the flat region, or the value of the surface roughness Ra of a part of the first surface of the first compound semiconductor layer that contacts the first light reflecting layer) be $3\times10^{-9}$ m or less, and the value of the surface roughness Ra of the first surface of the first compound semiconductor layer on the outside of the step portion (or the value of the surface roughness Ra of the rough surface region, or the value of the surface roughness Ra of a part of the first surface of the first compound semiconductor layer on which the first electrode is formed) exceed the value of the surface roughness Ra of the first surface of the first compound semiconductor layer on the inside of the step portion (or the value of the surface roughness Ra of the flat region, or the value of the surface roughness Ra of a part of the first surface of the first compound semiconductor layer that contacts the first light reflecting layer). The surface roughness Ra is stipulated by JIS B-610:2001. It is possible to measure the surface roughness Ra, more specifically, based on observation based on AFM or cross-sectional TEM.

In the first to third embodiments of the disclosure including the above-described various preferred forms, it is desirable that $R_2/R_1 \leq 1$ be satisfied, where the contact resistance value of the first surface of the first compound semiconductor layer on the inside of the step portion is $R_1$ (or the contact resistance value in the flat region is $R_1$, or the contact resistance value of a part of the first surface of the first compound semiconductor layer that contacts the first light reflecting layer is $R_1$) and the contact resistance value of the first surface of the first compound semiconductor layer on the outside of the step portion is $R_2$ (or the contact resistance value in the rough surface region is $R_2$, or the contact resistance value of a part of the first surface of the first compound semiconductor layer on which the first electrode is formed is $R_2$).

In the first embodiment of the disclosure including the above-described various preferred forms, it is possible to adopt a form in which the height of the step portion is less than the thickness of the first compound semiconductor layer, or possible to adopt a form in which the height of the step portion is $1\times10^{-8}$ m or more and $1\times10^{-5}$ m or less.

In the third embodiment of the disclosure including the above-described various preferred forms, it is possible to adopt a form in which the convexity formed in step (a) has a top surface smaller than the bottom surface.

In the second or third embodiment of the disclosure including the above-described various preferred forms, it is possible to adopt a form in which an area centroid of the second light reflecting layer is not present on a normal line with respect to the first light reflecting layer passing through area centroid of the first light reflecting layer.

In the second or third embodiment of the disclosure including the above-described various preferred forms, it is possible to adopt a form in which an area centroid of the active layer is not present on a normal line with respect to the first light reflecting layer passing through area centroid of the first light reflecting layer.

On the substrate for manufacturing a light emitting element on which the first light reflecting layer or the concavity is formed, when the first compound semiconductor layer is formed using horizontal growth using a method in which epitaxial growth is caused in the horizontal direction, such as an epitaxial lateral overgrowth (ELO) method, if the first compound semiconductor layers that are epitaxially grown from the edge portion of the first light reflecting layer or the convexity towards the center portion of the first light reflecting layer or the convexities meet, there are cases in which numerous crystal defects occur in the meeting part. If the meeting parts in which numerous crystal defects are present are positioned at the center portion of the element region (described later), there is concern of an adverse influence being exerted on the characteristics of the light emitting element. It is possible to reliably suppress the occurrence an adverse influence on the characteristics of the light emitting element, by attaining a state in which the area centroid of the second light reflecting layer is not present on the normal line with respect to the first light reflecting layer passing through the area centroid of the first light reflecting layer, and a state in which the area centroid of the active layer is not present on the normal line with respect to the first light reflecting layer passing through the area centroid of the first light reflecting layer.

In the first embodiment of the disclosure, in step (f), the rough surface region is formed on the first surface of the first compound semiconductor layer, a first light reflecting layer formed from a multilayer film is formed on the flat region that is a part of the first surface of the first compound semiconductor layer surrounded by the rough surface region, and a first electrode is formed on at least the rough surface region; however, specifically, the following formation procedure is given as an example.

(f-1) formation of the first light reflecting layer, formation of rough surface region on the first surface of the first compound semiconductor layer, formation of the first electrode (f-2) formation of rough surface region on the first surface of the first compound semiconductor layer, formation of the first electrode, formation of the first light reflecting layer (f-3) formation of rough surface region on the first surface of the first compound semiconductor layer, formation of the first light reflecting layer, formation of the first electrode In the first embodiment of the disclosure, in step (f), a step portion is formed on the first surface of the first compound semiconductor layer, the first light reflecting layer formed from a multilayer film is formed on at least the inside of the step portion, and the first electrode is formed on at least the outside of the step portion; however, specifically, the following formation procedure is given as an example.

(f-4) formation of the first light reflecting layer, formation of step portion on the first surface of the first compound semiconductor layer, formation of the first electrode (f-5) formation of step portion on the first surface of the first compound semiconductor layer, formation of the first electrode, formation of the first light reflecting layer (f-6) formation of step portion on the first surface of the first compound semiconductor layer, formation of the first light reflecting layer, formation of the first electrode In the third embodiment of the disclosure including the preferred form, it is possible to etch a part of the first surface of the first compound semiconductor layer on which the first electrode is to be formed before forming the first electrode on the first surface of the first compound semiconductor layer in step (f). In this case, the following procedures are given as examples of the procedure of removal of the convexity, formation of the first light reflecting layer, etching of the first compound semiconductor layer, and formation of the first electrode in step (f).

(f-1) removal of the convexity, formation of the first light reflecting layer, etching of the first compound semiconductor layer, formation of the first electrode (f-2) removal of the convexity, etching of the first compound semiconductor layer, formation of the first light reflecting layer, formation of the first electrode (f-3) removal of the convexity, etching of the first compound semiconductor layer, formation of the first electrode, formation of the first light reflecting layer (f-4) etching of the first compound semiconductor layer, removal of the convexity, formation of the first light reflecting layer, formation of the first electrode (f-5) etching of the first compound semiconductor layer, removal of the convexity, formation of the first electrode, formation of the first light reflecting layer (f-6) etching of the first compound semiconductor layer, formation of the first electrode, removal of the convexity, formation of the first light reflecting layer In the method of manufacturing a light emitting element according to the first, second or third embodiment of the disclosure including the above-described various preferred forms (below, these may be collectively referred to as simply "the disclosure"), it is possible to adopt a configuration in which the first light reflecting layer and the first electrode are in contact. Alternatively, it is possible to use a configuration in which the first light reflecting layer and the first electrode are separated, that is, an offset is provided, and the separation distance is within 1 mm. In this case, in the third embodiment of the disclosure, it is possible to adopt a configuration in which a protrusion part of the first compound semiconductor layer is present between the first light reflecting layer and the first electrode. If the element region (described later) positioned in the first light reflecting layer and the first electrode are separated, a current flows across a long distance in the first compound semiconductor layer. Therefore, it is preferable that the separation distance be within 1 mm in order to suppress the electrical resistance occurring in the current path to be low.

In the disclosure including the above-described various preferred forms and configuration, it is preferable that the distance from the first light reflecting layer to the second light reflecting layer be 0.15 µm or more and 50 µm or less.

In the disclosure including the above-described various preferred forms and configuration, it is possible to adopt a form in which light generated in the active layer is emitted to the outside via the first light reflecting layer. In this case, it is desirable that $S_1 > S_2$ be satisfied, where the area of a part of the first light reflecting layer that contacts the first surface of the first compound semiconductor layer (part of the first light reflecting layer opposing the second light reflecting layer) is $S_1$, and the area of a part of the second light reflecting layer opposing the second surface of the second compound semiconductor layer (part of the second light reflecting layer opposing the first light reflecting layer) is $S_2$.

In a form in which the area centroid of the second light reflecting layer is not present on the normal line with respect to the first light reflecting layer passing through the area centroid of the first light reflecting layer, and a state in which the area centroid of the active layer is not present on the normal line with respect to the first light reflecting layer passing through the area centroid of the first light reflecting layer, it is desirable that $S_3 > S_4$ be satisfied, where the area of a part that configures the element region (described later), and is a part of the first light reflecting layer that contacts the first surface of the first compound semiconductor layer (part of the first light reflecting layer opposing the second light reflecting layer) is $S_3$, and the area of a part that configures the element region that is a part of the second light reflecting layer opposing the second surface of the second compound semiconductor layer (part of the second light reflecting layer opposing the first light reflecting layer) is $S_4$.

Examples of the arrangement state of the first light reflecting layer and first electrode on the first surface of the first compound semiconductor layer may include the state in which the first light reflecting layer and the first electrode are in contact, or the state in which the first light reflecting layer and the first electrode are separated, as described above. Examples may also include a state in which the first electrode is formed up to the edge portion of the first light reflecting layer, and a state in which the first light reflecting layer is formed up to on the edge portion of the first electrode, according to the circumstances. In a case in which the first light reflecting layer is formed up to on the edge portion of the first electrode, it is necessary that the first electrode have an opening portion with given size so that basic mode light of laser oscillation is absorbed as little as possible. Since the size of the opening portion changes according to wavelength of the basic mode or the optical confinement structure in the horizontal direction (in-plane direction of the first compound semiconductor layer), although not limited thereto, the size is preferably on the order of approximately several times the oscillation wavelength $\lambda$.

In the disclosure including the above-described various preferred forms and configuration, it is possible to adopt a form which the first electrode is formed from a metal or an alloy, and to adopt a form in which the second electrode is formed from a transparent conductive material. By configuring the second electrode from a transparent conductive material, it is possible for the current to spread in the horizontal direction (in-plane direction of the second compound semiconductor layer), and possible to efficiently supply a current to the element region (described next). It is preferable that the second electrode be formed on the second surface of the second compound semiconductor layer, and the second light reflecting layer be formed on the second electrode.

The term "element region" indicates a region in which a constricted current is introduced, or a region in which light is confined by a difference in refractive index or the like, or a region in which laser oscillation occurs in a region interposed between the first light reflecting layer and the second light reflecting layer, or a region practically contributing to laser oscillation in a region interposed between the first light reflecting layer and the second light reflecting layer.

The light emitting element may have a structure formed from a surface-emitting laser element (vertical resonator laser, VCSEL) that emits light from the top surface of the first compound semiconductor layer via the first light reflecting layer, or may have a structure formed from a surface-emitting laser element that emits light from the top surface of the second compound semiconductor layer via the second light reflecting layer.

In the disclosure including the above-described various preferred forms and configuration, it is possible to adopt a form in which the layered structure body, specifically, is formed from an AlGaInN-based compound semiconductor. Examples of the AlGaInN-based compound semiconductor, more specifically, include GaN, AlGaN, GaInN, and AlGaInN. These compound semiconductors may include boron (B) atoms, thallium (Tl) atoms, arsenic (As) atoms, phosphorus (P) atoms, and antimony (Sb) atoms as desired. It is desirable that the active layer have a quantum well structure. More specifically, the active layer may has a single quantum well structure (QW structure), or may have a multiple quantum well structure (MQW structure). Although the active layer having a quantum well structure includes a well layer and a barrier layer having a structure in which at least one layer is layered, examples of the combination of (compound semiconductor that configures the well layer, compound semiconductor that configures the barrier layer) includes $(In_yGa_{(1-y)}N, GaN)$, $(In_yGa_{(1-y)}N, In_zGa_{(1-x)}N)$ [where y>z], and $(In_yGa_{(1-y)}N, AlGaN)$. It is possible to configure the first compound semiconductor layer from a first conductive type (for example, n-type) compound semiconductor, and configure the second compound semiconductor layer from a second conductive type (for example, p-type) compound semiconductor different from the first conductive type. The first compound semiconductor layer and the second compound semiconductor layer are also referred to as a first cladding layer and a second cladding layer. It is preferable that a current constriction structure be formed between the second electrode and the second compound semiconductor layer. The first compound semiconductor layer and the second compound semiconductor layer may be a single structure layer, may be a multi-layer structure layer, or may be a super-lattice structure layer. Furthermore, it is also possible to use a layer including a composition gradient layer and a concentration gradient layer.

In order to obtain a current constriction structure, a current constriction layer formed from an insulating material (for example, $SiO_2$, SiN, or $Al_2O_3$) may be formed between the second electrode and the second compound semiconductor layer, or a mesa structure may be formed by etching the second compound semiconductor layer with an RIE method, or the like, or a current constriction region may be formed by partially oxidizing a portion of the layer of the layered second compound semiconductor layer from the lateral direction, and a region with lowered conductivity may be formed by ion implantation of impurities in the second compound semiconductor layer, or these may be combined, as appropriate. However, it is necessary that the second electrode be electrically connected with the part of the second compound semiconductor layer in which a current flows due to current constriction.

Examples of the substrate for manufacturing a light emitting element include a GaN substrate, a sapphire substrate, a GaAs substrate, an SiC substrate, an alumina substrate, a ZnS substrate, a ZnO substrate, an AlN substrate, an LiMgO substrate, an $LiGaO_2$ substrate, an $MgAl_2O_4$ substrate, an InP substrate, and an Si substrate, and substrates on which an underlayer or a buffer layer is formed on the surface (main surface) of these substrates. In a case of forming a GaN-based compound semiconductor layer on the substrate, the using a GaN substrate is preferable in light of a low density of defects. Although it is known that the polarity/non-polarity/semi-polarity and characteristics of the GaN substrate change according to the growth surface, it is possible to use any of the main surfaces of the GaN substrate in forming the compound semiconductor layer. With respect to the main surface of these substrates, depending on the crystal structure (for example, cubical crystal-type, hexagonal crystal, or the like), it is possible to use the crystal orientation surfaces referred to by names such as the so-called A plane, B plane, C plane, R plane, M plane, N plane and S plane, or a surface offset in a specified direction therefrom. Examples of the method of forming the various compound semiconductor layers that configure the light emitting element include a metal organic chemical vapor deposition method (MOCVD method, MOVPE method), a molecular beam epitaxy method (MBE method), and a hydride vapor deposition method in which a halogen contributes to transportation or reaction.

Examples of the organogallium source gas in the MOCVD method include trimethyl gallium (TMG) gas and triethyl gallium (TEG) GAS, and examples of the nitrogen source gas include ammonia gas and hydrazine gas. In the formation of a GaN-based compound semiconductor layer having an n-type conductivity type, for example, silicon (Si) may be added as an n-type impurity (n-type dopant), and in the formation of a GaN-based compound semiconductor layer having a p-type conductivity type, for example, magnesium (Mg) may be added as a p-type impurity (p-type dopant). In a case where the GaN-based compound semiconductor layer includes aluminum (Al) or indium (In) as a constituent atom, trimethylaluminum (TMA) gas may be used as an Al source and trimethylindium (TMI) gas may be used as an In source. Monosilane gas (SiH4 gas) may be used as an Si source, and cyclopentadienylmagnesium gas, methylcyclopentadienyl magnesium, and biscyclopentadienylmagnesioum (Cp$_2$Mg) may be used as an Mg source. Examples of the n-type impurity (n-type dopant) include Ge, Se, Sn, C, Te, S, O, Pd and Po, in addition to Si, and examples of the p-type impurity (p-type dopant) include Zn, Cd, Be, Ca, Ba, C, Hg, and Sr, in addition to Mg.

Although the support substrate, for example, may be configured from various substrates given as examples of the substrate for manufacturing a light emitting element, or it is possible to configure the support substrate from an insulating substrate formed from AlN or the like, a semiconductor substrate formed from, Si, SiC Ge or the like, a metallic substrate or an alloy substrate, it is preferable to use a substrate having conductivity, or preferable to use a metallic substrate or alloy substrate from the viewpoint of mechanical properties, elastic deformation, plastic deformation, heat dissipation or the like. Examples of the thickness of the support substrate, for example, may be 0.05 mm to 0.5 mm. Although examples of the method of fixing the second light reflecting layer to the support substrate include existing methods, such as a bonding method including a soldering method, room temperature welding method, bonding methods using adhesive tape, and bonding methods using wax bonding, it is desirable that a soldering method or a room temperature welding method be adopted from the viewpoint of ensuring conductivity. In a case of using a silicon semiconductor substrate, which is a conductive substrate, as the support substrate, it is desirable that a method in which bonding is possible at low temperatures of 400° C. or less be adopted in order to suppress warping due to differences in the thermal expansion coefficients. In a case of using a GaN substrate as the support substrate, the boding temperature may be 400° C. or more.

It is preferable that the first electrode have a single layer structure or a multilayer structure including at least one type of metal including alloys selected from a group consisting of, for example, gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn) and indium (In). More specifically, examples include, for example, Tl/Au, Ti/Al, Ti/Al/Au, Ti/Pt/AU, Ni/Au, Ni/Au/Pt, Ni/Pt, Ni/Pt, Pd/Pt, and Ag/Pd. The further to the front of the "/" a layer is in the multilayer structure, the further the layer is positioned to the active layer side. The same applies in the description below. It is possible to form the film of the first electrode, for example, with a PVD method, such as a vacuum deposition method or a sputtering method.

Examples of the transparent conductive material that configures the second electrode include indium tin oxide (ITO, including Sn doped In$_2$O$_2$, crystalline ITO and amorphous ITO), indium zinc oxide (IZO), IFO (F doped In$_2$O$_2$), tin oxide (SnO$_2$), ATO (Sb doped SnO$_2$), FTO (F doped SnO$_2$), and zinc oxide (including ZnO, Al doped ZnO and B doped ZnO). Alternatively, examples of the second electrode include transparent conductive films in which the mother layer is made from gallium oxide, titanium oxide, niobium oxide, nickel oxide or the like. However, although dependent on the arrangement state of the second light reflecting layer and the second electrode, the material that configures the second electrode is not limited to transparent conductive materials, and it is possible to use metals, such as palladium (Pd), platinum (Pt), nickel (Ni), gold (Au), cobalt (Co) and rhodium (Rh). The second electrode may be from at least one type of these materials. It is possible to form the film of the second electrode, for example, with a PVD method, such as a vacuum deposition method or a sputtering method.

A pad electrode may be formed on the first electrode or the second electrode in order to electrically connect an external electrode or a circuit. It is desirable that the pad electrode have a single layer structure or a multilayer structure including at least one type of metal selected from a group consisting of titanium (Ti), aluminum (Al), platinum (Pt), gold (Au), nickel (Ni) and palladium (Pd). Alternatively, it is possible to configure the pad electrode with a multilayer structure, examples of which include a multilayer structure of Ti/Pt/Au, a multilayer structure of Ti/Au, a multilayer structure of Ti/Pd/Au, a multilayer structure of Ti/Ni/Au, or a multilayer structure of Ti/Ni/Au/Cr/Au. In a case of configuring the first electrode from an Ag layer or an Ag/Pd layer, it is preferable that a cover metal layer formed from, for example, Ni/TiW/Pd/TiW/Ni be formed on the surface of the first electrode, and, for example, a pad electrode formed from a multilayer structure of Ti/Ni/Au or a multilayer structure of Ti/Ni/Au/Cr/Au be formed on the cover metal layer.

The light reflecting layer (distributed Bragg reflector layer, DBR layer) is composed of, for example, a semiconductor multilayer film or a dielectric multilayer film. Examples of the dielectric material include, for example, oxides of Si, Mg, Al, Hf, Nb, Zr, Sc, Ta, Ga, Zn, Y, B, Ti or the like, a nitride (for example, AlN, AlGaN, GaN, Bn, or the like) or a fluoride. More specifically, examples include SiO$_2$, TiO$_2$, Nb$_2$O$_5$, ZrO$_2$, Ta$_2$O$_5$, ZnO, Al$_2$O$_3$, HfO$_2$, and AlN. It is possible to obtain a light reflecting layer by alternately layering two or more types of dielectric film formed from dielectric materials with different reflectivities from among these dielectric materials. For example, a multilayer film such as SiO$_2$/SiN, SiO$_2$/Nb$_2$O$_5$, SiO$_2$/ZrO$_2$ and SiO$_2$/AlN is preferable. In order to obtain the desired reflectivity, the material configuring each dielectric film, the film thickness, the number of layers and the like maybe selected as appropriate. It is possible to adjust the thickness of each dielectric film, as appropriate, according to the material used, and thickness is determined according to the oscillation wavelength λ, and the reflectivity n with the oscillation wavelength λ of the material used. More specifically, it is preferable that the thickness be an odd number multiple of λ/(4n). For example, in a light emitting element with an oscillation wavelength λ of 410 nm, in a case of configuring the light reflecting layer from SiO$_2$/Nb$_2$O$_5$, examples of the thickness include approximately 40 nm to 70 nm. Examples of the number of layers are two or more, and preferably approximately 5 to 20. Examples of the overall thickness of the light reflecting layer include, for example, approximately 0.6 μm to 1.7 μm.

Alternatively, it is desirable that the first light reflecting layer include a dielectric film including at least an N (nitrogen) atom, and it is more desirable that the dielectric layer including the N atom be the uppermost layer of the dielectric multilayer film. Alternatively, it is desirable that the first light reflecting layer be covered by a dielectric material layer including at least an N (nitrogen) atom. Alternatively, it is desirable that the surface of the first light reflecting layer be made a layer including at least an N (nitrogen) atom (below, referred to as a "surface layer", as a matter of convenience) by subjecting the surface of the first light reflecting layer to a nitriding treatment. The thickness of the dielectric film or the dielectric material layer including at least an N atom and the surface layer is preferably set to an odd numbered multiple of λ/(4n). Examples of the material that configures the dielectric film or the dielectric material layer including at least an N atoms specifically include SiN$_y$ and SiO$_x$N$_y$. In this way, by forming the dielectric film or dielectric material layer including at least an N atom, and the surface layer, when the compound semiconductor layer that covers the first light reflecting layer is formed, it is possible to reduce shifting of the crystal axis of the compound semiconductor layer that covers the first light reflecting layer and the crystal axis of the substrate for manufacturing a light emitting element, and possible to improve the quality of the layered structure body that is a resonator.

The size and shape of the light reflecting layer is not particularly limited, as long as the layer covers the element region. Examples of the planar shape of the opening provided in the element region, the first light reflecting layer, the second light reflecting layer, and the current constriction layer similarly include, specifically, a circle, an ellipse, a rectangle, and a polygon (triangle, quadrangle, hexagon or the like). Examples of the planar shape of the first electrode include a ring shape. It is desirable that the planar shape of the opening provided in the element region, the first light reflecting layer, the second light reflecting layer, and the current constriction layer, the planar shape of the inside ring portion of the annular first electrode, and further the planar shape of the convexity described later be similar shapes. In the case of a circular shape, it is preferable that the diameter be approximately 2 μm to 70 μm.

It is possible for the light reflecting layer to be formed based on an existing method, and specific examples include PVD methods, such as a vacuum deposition method, a sputtering method, a reactive sputtering method, an ECR plasma sputtering method, a magnetron sputtering method, an ion beam assisted deposition method, an ion plating method, a laser ablation method; various CVD methods; coating methods, such as a spray method, a spin coating method, and a dipping method; a method in which two or more of these methods are combined; and a method combining these methods with one or more of any of a complete or partial preprocessing, irradiation of inactive gas (Ar, He, Xe or the like) or plasma, irradiation of oxygen gas, ozone gas and plasma, oxidation treatment (heat treatment), and exposure treatment.

Examples of the material that configures the mask layer having a function of the compound semiconductor layer is not being formed thereupon and the convexity include semiconductor oxides or semiconductor nitrides such as $SiO_2$, SiN, SiON; $Nb_2O_5$, $Ta_2O_5$, $ZrO_2$, AlN, $Al_2O_3$; metals or high melting point metals such as Ti, W, Ni, Au, and Pt or an alloy in which the composition of these metals is appropriately adjusted (for example, TiW, TiWCr, TiWNi, NiCr, TiNiCr, or alloys of these alloys and Au, or of these alloys and Pt, or the like); high melting point metal (alloy) oxides; high melting point metal (alloy) nitrides; a multilayer structure in which materials different to these, metals, alloys, alloy oxides, alloy nitrides (for example, a layered structure of, from below, a silicon oxide layer and a silicon nitride layer) are combined; and a resist material. Examples of the method of forming the mask layer and the convexity include physical vapor-phase growth methods (PVD method), such as a sputtering method, a chemical vapor-phase growth method (CVD method), and a combination of a coating method, and a lithography technology or an etching technology. Removal of the convexity depends on the material that configures the convexity, and a wet etching method may be adopted, a dry etching method may be adopted, or an asking technology may be used. The convexity may have a one dimensional arrangement, such as a band-shape, or may have a two-dimensional arrangement having a curved shape (circle, ellipse or the like) scattered, or a combination of curves, a combination of cures and line segments, or a polygonal shape (triangle, quadrangle, hexagon or the like). The mask layer may have a one dimensional arrangement, such as a band-shape, or may have a scattered curved shape (circle, ellipse or the like) or a combination of curves defining the element region, a combination of curves and line segments, or a complementary shape to a polygonal shape (triangle, quadrangle, hexagon or the like). Here, the complementary shape, for example, in the case in which the element region is a two-dimensionally arranged circle, signifies shape in which the circular element formation region is removed from these. Alternatively, in other words, when the element region is an "island", the mask region corresponds to a "sea" in a so-called "sea and island structure". Alternatively, the mask layer may have a two-dimensional arrangement having a scattered curve shape (circle, ellipse or the like) or a combination of curves, a combination of curves and line segments, and a polygonal shape (triangle, quadrangle, hexagon, or the like). The thickness of the mask layer may be thinner than the layered structure body, may be the same thickness as the layered structure body, may be substantially the same thickness as the layered structure body, or may be thicker than the layered structure body. The thickness of the mask layer may be thinner than the first light reflecting layer or the convexity, may be the same thickness as the first light reflecting layer or the convexity, or may be thicker than the first light reflecting layer or the convexity. The side surface of the mask layer may be forward tapered, may be vertical, or may be reverse tapered. The entire surface of the mask layer may be covered by the layered structure body, a portion of the top surface of the mask layer may be covered by the layered structure body, or the entire side surface or a portion of the side surface (lower portion of the side surface) of the mask layer may be covered by the layered structure body.

The side surface or exposed surface of the layered structure body may be covered with an insulating film. Forming the insulating film may be performed based an existing method. It is preferable that the refractive index of the material that configures the insulating film be lower than the refractive index of the material that configures the layered structure body. Examples of the material that configures the insulating film include a $SiO_x$-based material including $SiO_2$, $SiN_y$-based material, a $SiO_xN_y$-based material, $Ta_2O_5$, $ZrO_2$, AlN, $Al_2O_3$, and $Ga_2O_3$, or an organic material, such as a polyimide resin. Examples of the method of forming the insulating film include PVD methods, such as a vacuum deposition method or a sputtering method, or a CVD method, or the film may be formed based on a coating method.

Embodiment 1

Embodiment 1 relates to a method of manufacturing a light emitting element according to the first embodiment of the disclosure.

Figure 6:
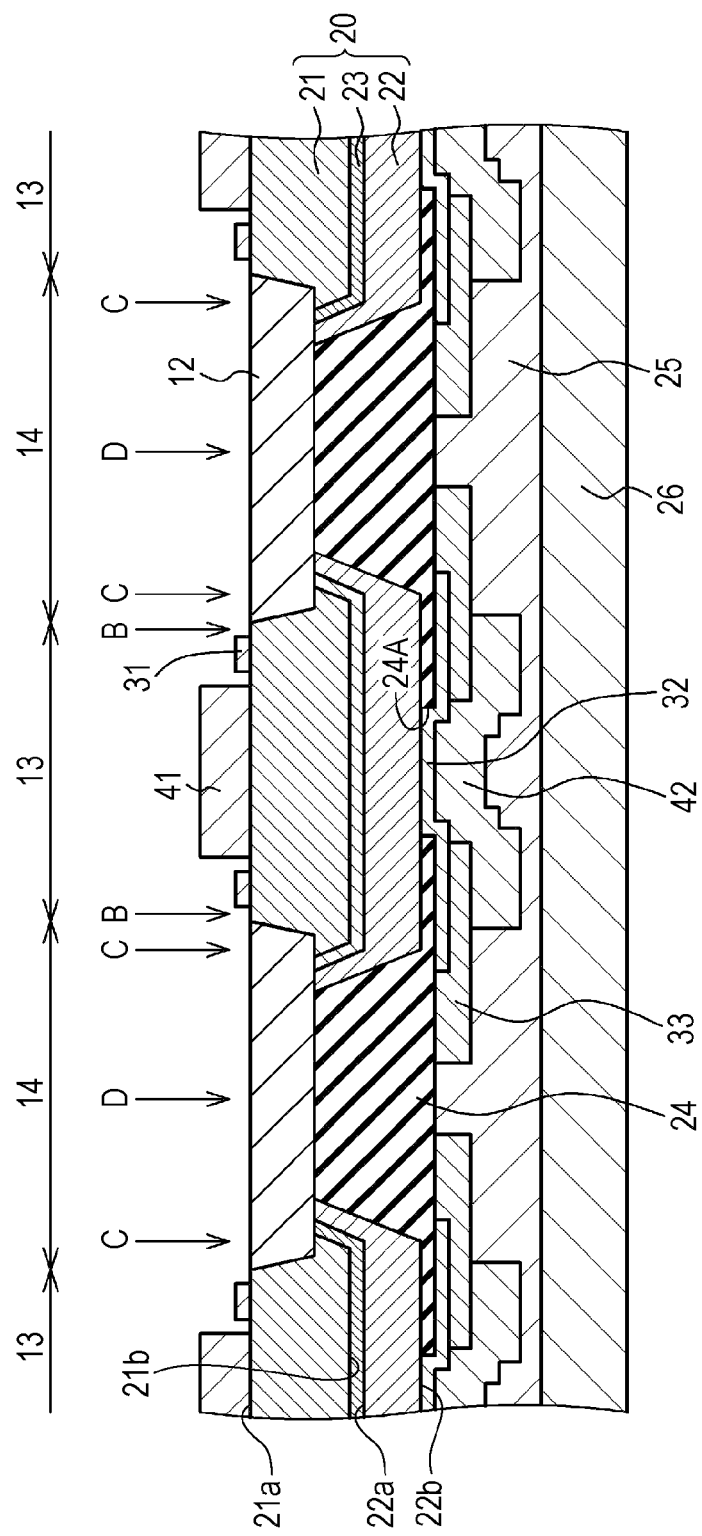
FIG. 6 is a schematic partial end face view of the layered structure body for illustrating the method of manufacturing a light emitting element of Embodiment 1, continued from FIG. 5.
Figure 7A:
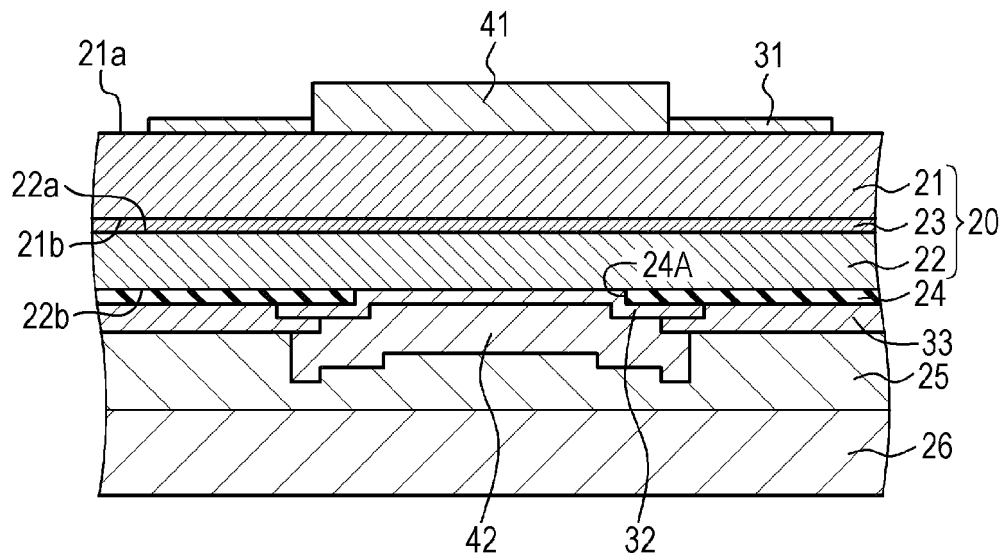
FIGS. 7A and 7B are both schematic partial end face views of a modification example of the light emitting element of Embodiment 1.
Figure 7B:
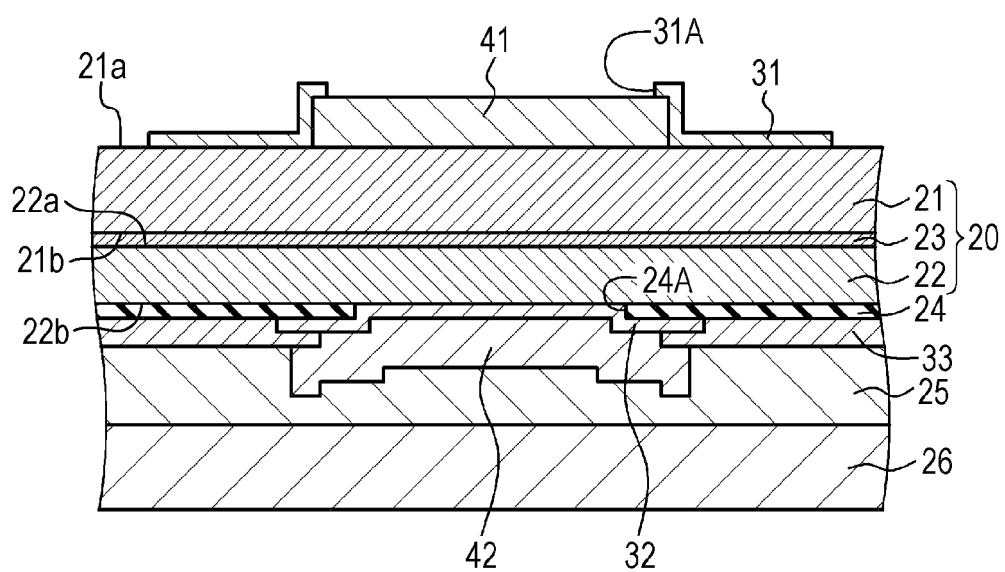

The light emitting element obtained by the method of manufacturing a light emitting element of Embodiment 1 shown in the schematic partial end face view in FIG. 6 or the light emitting element of Embodiments 2 to 4 described later includes (a) a layered structure body 20 formed by layering a first compound semiconductor layer 21 formed from a GaN-based compound semiconductor, and having a first surface 21a and a second surface 21b opposing the first surface 21a, an active layer (light emitting layer) 23 formed from a GaN-based compound semiconductor, and that contacts the second surface 21b of the first compound semiconductor layer 21, and a second compound semiconductor layer 22 formed from a GaN-based compound semiconductor, having a first surface 22a and a second surface 22b opposing the first surface 22a, and in which the first surface 22a contacts the active layer 23; (b) a first electrode 31 and a first light reflecting layer 41; and (c) a second electrode 32 and a second light reflecting layer 42 formed from a multilayer film formed on the second surface 22b of the second compound semiconductor layer 22.

In the light emitting element of Embodiment 1, or Embodiments 2 to 4 described later, the first electrode 31 is formed on at least the first surface 21a of the first compound semiconductor layer 21, and the first light reflecting layer 41 formed from a multilayer film is formed on the first surface 21a of the first compound semiconductor layer 21.

The light emitting element of Embodiment 1, or Embodiments 2 to 4 described later is specifically formed from a surface-emitting laser element (vertical resonator laser, VCSEL) that emits light from the top surface of the first compound semiconductor layer 21 via the first light reflecting layer 41.

In the light emitting element of Embodiment 1, or Embodiments 2 to 4 described later, the current constriction layer 24 formed from an insulating material, such as $SiO_2$, is formed between the second electrode 32 and the second compound semiconductor layer 22. The thickness of the current constriction layer 24 on the second compound semiconductor layer 22 is 0.2 μm. A circular opening 24A is formed in the current constriction layer 24, and the second compound semiconductor layer 22 is exposed in the bottom portion of the opening 24A. The second electrode 32 is formed from over the second surface 22b of the second compound semiconductor layer 22 to over the current constriction layer 24, and the second light reflecting layer 42 is formed on the second electrode 32. A pad electrode 33 for electrically connecting an external electrode or a circuit is connected on edge portion of the second electrode 32. In the light emitting element of Embodiment 1, or Embodiments 2 and 3 described later, the planar shape of the element region is a circle, and the planar shape of the opening 24A provided in the first light reflecting layer 41, the second light reflecting layer 42, and the current constriction layer 24 is also a circle. Meanwhile, the planar shape of the first electrode 31 is annular (ring-like). Although the first light reflecting layer 41 and the second light reflecting layer 42 have a multilayer structure, for the sake of simplicity in the drawings, the layers are depicted by one layer. Forming the current constriction layer 24 is not necessary.

In the light emitting element of Embodiment 1, the first light reflecting layer 41 and the first electrode 31 are separated, that is, an offset is provided, and the separation distance is within 1 mm, specifically, for example, an average of 0.05 mm.

In the light emitting element of Embodiment 1, or Embodiments 2 to 4 described later, the second light reflecting layer 42 is fixed based on a soldering method to the support substrate 26 formed from a silicon semiconductor substrate via a bonding layer 25 formed from a solder layer including a gold (Au) layer or a tin (Sn) layer.

In the light emitting element of Embodiment 1, or Embodiments 2 to 4 described later, light generated in the active layer 23 is emitted to the outside via the first light reflecting layer 41. $S_1 > S_2$ is satisfied, where the area of a part of the first light reflecting layer 41 that contacts the first surface 21a of the first compound semiconductor layer 21 (part of the first light reflecting layer 41 opposing the second light reflecting layer 42) is $S_1$, and the area of a part of the second light reflecting layer 42 opposing the second surface of the second compound semiconductor layer 22 (part of the second light reflecting layer 42 opposing the first light reflecting layer 41) is $S_2$. The distance from the first light reflecting layer 42 to the second light reflecting layer 42 is 0.15 μm or more and 50 μm or less, and, specifically, is, for example, 10 μm.

The first compound semiconductor layer 21 is formed from a 1 μm thick n-GaN layer, the 180 nm thick active layer 23 is formed from a quintuple multiple quantum well structure in which an $In_{0.04}Ga_{0.96}N$ layer (barrier layer) and an $In_{0.16}Ga_{0.84}N$ layer (well layer) are layered, and the second compound semiconductor layer 22 is formed from layered structure body with an electron barrier layer formed from p-AlGaN and a p-GaN layer. The first electrode 31 is formed from Ti/Pt/Au, the second electrode 32 is formed from a transparent conductive material, specifically, ITO (thickness: 50 nm), the pad electrode 33 is formed from Ti/Pd/Au or Ti/Pd/Au, the first light reflecting layer 41 and the second light reflecting layer 42 are formed from a layer structure of an SiN layer and an $SiO_2$ layer (total number of layers of dielectric film: 20 layers).

Below, the method of manufacturing a light emitting element of Embodiment 1 will be described with reference to FIGS. 1A, 1B, 2A, 2B, 3, 4, 5, and 6 which are schematic partial end face views of a layered structure body or the like.

Step-100

First, a mask layer for selective growth 12 formed from a material different to the material that configures the first compound semiconductor layer 21 is formed on the region 14 outside the element forming region 13 on the substrate for manufacturing a light emitting element 11. Specifically, a patterned mask layer 12 formed from $SiO_2$ is formed, based on an existing method, on the substrate for manufacturing a light emitting element 11 formed from a GaN substrate. In this way, it is possible to obtain the structure shown in FIG. 1A. The external shape of the element forming region 13 is a circle. Accordingly, the shape of the mask layer 12 has a complementary shape from which the circular element forming region 13 is removed. However, the shape of the mask layer 12 is not limited thereto.

Step-110

Next, a layered structure body 20 in which a first compound semiconductor layer 21 formed from a GaN-based compound semiconductor, and having a first surface 21a and a second surface 21b opposing the first surface 21a, an active layer 23 formed from a GaN-based compound semiconductor, that contacts the second surface 21b of the first compound semiconductor layer 21, and a second compound semiconductor layer 22 formed from a GaN-based compound semiconductor, having a first surface 22a and a second surface 22b opposing the first surface 22a, and in which the first surface 22a contacts the active layer 23 are layered is formed on the element forming region 13 of the substrate for manufacturing a light emitting element 11. Specifically, it is possible to obtain a layered structure body 20 by forming the first compound semiconductor layer 21 formed from n-GaN by lateral direction growth using a method that causes epitaxial growth in the lateral direction, such as an ELO method, and forming the active layer 23 and the second compound semiconductor layer 22 thereupon, based on an epitaxial growth method. Although the layered structure body 20 is formed on the outer edge portion of the mask layer 12, the layered structure body is not formed on the entire mask layer 12. That is, even after forming the layered structure body 20, the center region 12A of the mask layer 12 is in an exposed state. Then, the current constriction layer 24 having an opening 24A is formed, based on an existing method, on the second surface 22b of the second compound semiconductor layer 22. The current constriction layer 24 is formed on the mask layer 12 on which the layered structure body 20 is not formed. In this way, it is possible to obtain the structure shown in FIG. 1B.

Step-120

Thereafter, the second electrode 32 and the second light reflecting layer 42 formed from a multilayer film are formed on the second surface 22b of the second compound semiconductor layer 22. Specifically, for example, the second electrode 32 is formed from over the second surface 22b of the second compound semiconductor layer 22 to over the current constriction layer 24 based on a lift-off method and the pad electrode 33 is further formed from over the second electrode 32 to over the current constriction layer 24 based on an existing method. In this way, it is possible to obtain the structure shown in FIG. 2A. Thereafter, the second light reflecting layer 42 is formed from over the second electrode 32 to over the pad electrode 33 based on an existing method. In this way, it is possible to obtain the structure shown in FIG. 2B.

Step-130

Thereafter, the second light reflecting layer 42 is fixed to the support substrate 26 via a bonding layer 25. In this way, it is possible to obtain the structure shown in FIG. 3.

Step-140

Next, the substrate for manufacturing a light emitting element 11 is removed, and the first surface 21a of the first compound semiconductor layer 21 and the mask layer 12 are exposed. Specifically, first the thickness of the substrate for manufacturing a light emitting element 11 is thinned based on a mechanical polishing method, then the remainder of the substrate for manufacturing a light emitting element 11 is removed based on a CMP method. In this way, the first surface 21a of the first compound semiconductor layer 21 and the mask layer 12 are exposed, and it is possible to obtain the structure shown in FIG. 4.

Step-150

Thereafter, the first light reflecting layer 41 formed from a multilayer film and the first electrode 31 are formed on the first surface 21a of the first compound semiconductor layer 21 based on an existing method. The first electrode 31 may be formed after the first light reflecting layer 41 is formed (refer to FIGS. 5 and 6), or the first light reflecting layer 41 may be formed after the first electrode 31 is formed.

Step-160

Thereafter, the light emitting element is separated by performing so-called element separation as necessary, and the exposed surface or the side surface of the layered structure body is covered with an insulating film formed from, for example, $SiO_2$. Since each of the element forming regions that configure the light emitting element are separated by the mask layer, element separation is not necessary. The same applies to Embodiments 2 to 4 below. Thereafter, a terminal or the like for connecting the first electrode 31 and the pad electrode 33 to an external circuit or the like is formed based on an existing method, and the light emitting element of Embodiment 1 is completed by packaging or sealing. Cases of separating a light emitting element from another light emitting element, for example, may be performed along the arrow B in FIG. 6, or may be performed along the arrows C and D.

In the method of manufacturing a light emitting element of Embodiment 1, the substrate for manufacturing a light emitting element is removed in a state in which the mask layer is formed. Therefore, the mask layer functions as a polishing stopper when removing the substrate for manufacturing a light emitting element, and as a result it is possible to suppress variations in the removal of the substrate for manufacturing a light emitting element in the surface of the substrate for manufacturing a light emitting element, and, further, variations in the thickness of the first compound semiconductor layer, and it is possible achieve uniformity in the length of the resonator, and as a result it is possible to achieve stability in the characteristics of the obtained light emitting element. Because the first surface of the first compound semiconductor layer in the interface between the first light reflecting layer and the first compound semiconductor layer is flat, it is possible to suppress scattering of light by the first surface of the first compound semiconductor layer to a minimal level.

Below, a modification example of the light emitting element of Embodiment 1 shown in FIG. 6 will be described. Only the element forming region 13 (refer to FIG. 6) is depicted in FIGS. 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A and 18B described below.

In the example of the light emitting element described above and shown in FIG. 6, the end portion of the first electrode 31 is separated from the first light reflecting layer 41. Meanwhile, in the example of the light emitting element shown in FIG. 7A, the end portion of the first electrode 31 contacts the first light reflecting layer 41. In the example of the light emitting element shown in FIG. 7B, the end portion of the first electrode 31 is formed over the edge portion of the first light reflecting layer 41. In a case in which the first electrode 31 is extended up to the edge portion of the first light reflecting layer 41, an opening portion 31A, for example, an opening portion 31A with a diameter of 5 μm to 50 μm is formed on the first electrode 31 such that basic mode light of laser oscillation is absorbed as little as possible. The same applies in the description below.

Alternatively, the step portion 21C is formed on the first surface 21a of the first compound semiconductor layer 21, the first light reflecting layer 41 is formed on at least the inside 21D of the step portion 21C, and the first electrode 31 is formed on at least the outside 21E of the step portion 21C. Here, the step portion 21C is configured from a simple closed curve. The first light reflecting layer 41 is formed on the convexity of the first surface 21a of the first compound semiconductor layer 21, and the first electrode 31 is formed on the concavity of the first surface 21a of the first compound semiconductor layer 21. The height of the step portion 21C is less than the thickness of the first compound semiconductor layer 21, or is $1 \times 10^{-8}$ m or more and $1 \times 10^{-5}$ m or less, and specifically, for example, is $2 \times 10^{-6}$ m.

Specifically, between [Step-140] and [Step-150], the step portion 21C is formed on the first compound semiconductor layer 21 by etching a part of the first surface 21a of the first compound semiconductor layer 21 before forming the first electrode 31 on the first surface 21a of the first compound semiconductor layer 21. In [Step-150], the first light reflecting layer 41 is formed on at least the inside 21D of the step portion 21C, and the first electrode 31 is formed on at least the outside 21E of the step portion 21C.

Alternatively, between [Step-140] and [Step-150], the rough surface region 21B is formed on the first compound semiconductor layer 21 by etching a part of the first surface 21a of the first compound semiconductor layer 21. In [Step-150], the first light reflecting layer 41 is formed on at least a flat region 21A that is a part of the first compound semiconductor layer 21 surrounded by the rough surface region 21B, and the first electrode 31 is formed on at least the rough surface region 21B. The rough surface region 21B surrounds the flat region 21A.

The part of the first surface 21a of the first compound semiconductor layer 21 on which the first electrode 31 is to be formed may be etched based on a reactive ion etching method (RIE method).

The procedure of forming the rough surface region 21B (step portion 21C) in the first surface 21a of the first compound semiconductor layer 21, forming the first light reflecting layer 41, and forming the first electrode 31 is not limited to the above-described procedure, such as forming the first light reflecting layer 41, forming the rough surface region 21B (step portion 21C) in the first surface 21a of the first compound semiconductor layer 21, and forming the first electrode 31, and may be a procedure of forming the first light reflecting layer 41, forming the rough surface region 21B (step portion 21C) in the first surface 21a of the first compound semiconductor layer 21, and forming the first electrode 31, or may be a procedure of forming the rough surface region 21B (step portion 21C) in the first surface 21a of the first compound semiconductor layer 21, forming the first electrode 31 and forming the first light reflecting layer 41.

In the example shown in FIGS. 8A, 8B, 9A, 9B, 10A, 10B, 11A, 11B, 12A, 12B, 13A, and 13B, the first light reflecting layer 41 is formed on the convexity of the first surface 21a of the first compound semiconductor layer 21, and the first electrode 31 is formed on the concavity of the first surface 21a of the first compound semiconductor layer 21.

In these cases, the value of the surface roughness Ra of the first surface 21a of the first compound semiconductor layer 21 on the inside 21D of the step portion 21C (or, the value of the surface roughness Ra of the flat region, or the value of the surface roughness Ra of a part of the first surface 21a of the first compound semiconductor layer 21 that contacts the first light reflecting layer) is $3 \times 10^{-9}$ m or less, and the value of the surface roughness Ra of the first surface 21a of the first compound semiconductor layer 21 on the outside 21E of the step portion 21C (or the value of the surface roughness Ra of the rough surface region, or the value of the surface roughness Ra of a part of the first surface 21a of the first compound semiconductor layer 21 on which the first electrode is formed) exceeds the value of the surface roughness Ra of the first surface 21a of the first compound semiconductor layer 21 on the inside 21D of the step portion 21C (or the value of the surface roughness Ra of the flat region, or the value of the surface roughness Ra of a part of the first surface 21a of the first compound semiconductor layer 21 that contacts the first light reflecting layer). Specifically, the value of the surface roughness Ra of the flat region 21A is 0.2 nm, and the value of the surface roughness Ra of the rough surface region 21B is 3.1 nm.

Alternatively, $R_2/R_1 \leq 1$ is satisfied, where the contact resistance value of the first surface 21a of the first compound semiconductor layer 21 on the inside 21D of the step portion 21C is $R_1$ (or the contact resistance value in the flat region is $R_1$, or the contact resistance value of a part of the first surface 21a of the first compound semiconductor layer 21 that contacts the first light reflecting layer is $R_1$) and the contact resistance value of the first surface 21a of the first compound semiconductor layer 21 on the outside 21E of the step portion 21C is $R_2$ (or the contact resistance value in the rough surface region is $R_2$, or the contact resistance value of a part of the first surface 21a of the first compound semiconductor layer 21 on which the first electrode is formed is $R_2$). Specifically, the IV curve on the inside 21D of the step portion 21C is a Schottky-type, and the IV curve on the outside 21E of the step portion 21C is an ohmic-type.

In this way, the first surface 21a of the first compound semiconductor layer 21 has the flat region 21A and the rough surface region 21B, the first light reflecting layer 41 is formed on at least the flat region 21A, and the first electrode 31 is formed on at least the rough surface region 21B. Alternatively, the step portion 21C is formed on the first surface 21a of the first compound semiconductor layer 21, the first light reflecting layer 41 is formed on at least the inside 21D of the step portion 21C, and the first electrode 31 is formed on at least the outside 21E of the step portion 21C. Therefore, it is possible to suppress the scattering of light by the surface (first surface 21a) of the first compound semiconductor layer 21 to a minimal limit, and possible to suppress a rise in the contact resistance between the first compound semiconductor layer 21 and the first electrode 31.

Figure 8A:
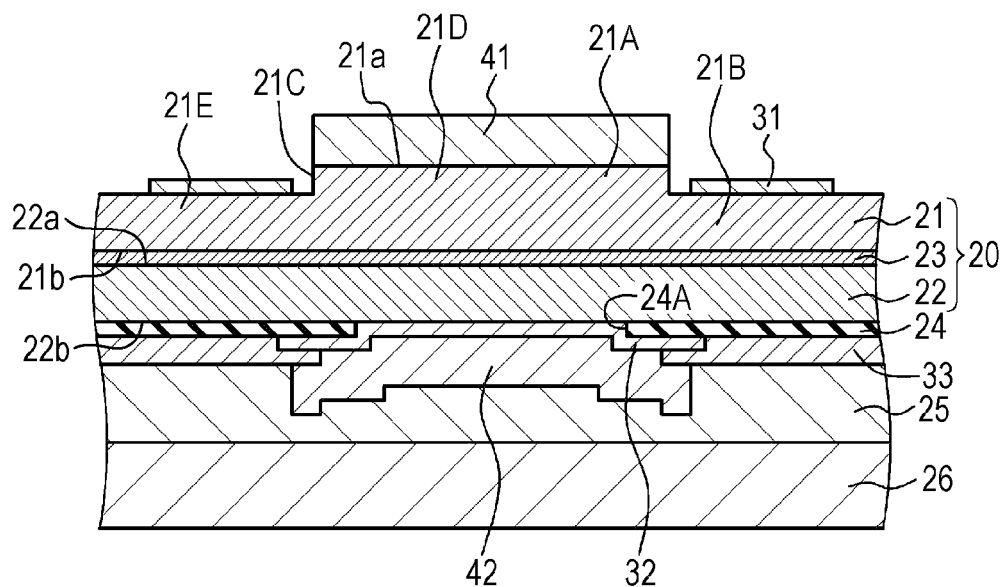
FIGS. 8A and 8B are both schematic partial end face views of a modification example of the light emitting element of Embodiment 1.
Figure 8B:
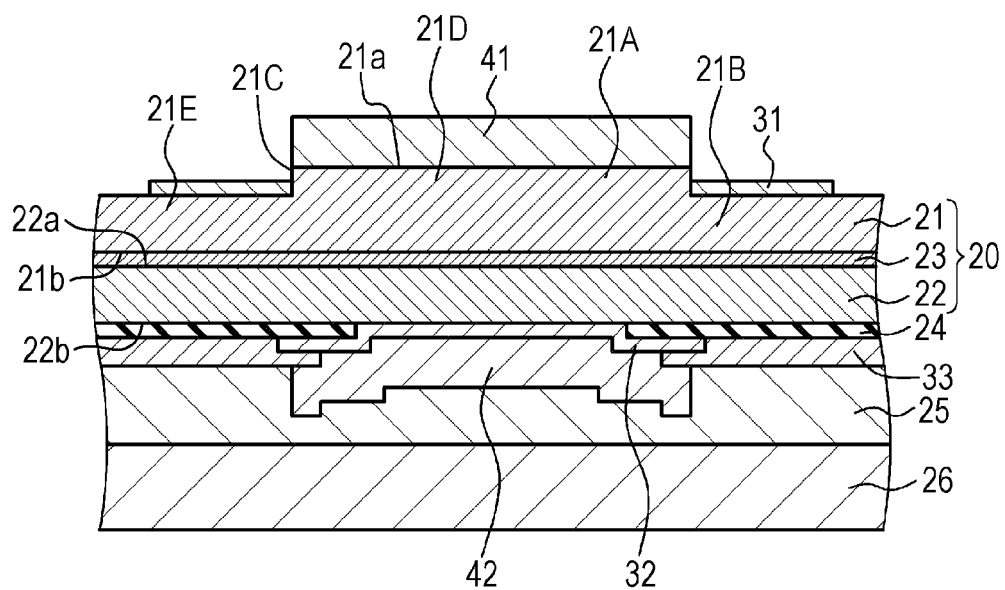
Figure 9A:
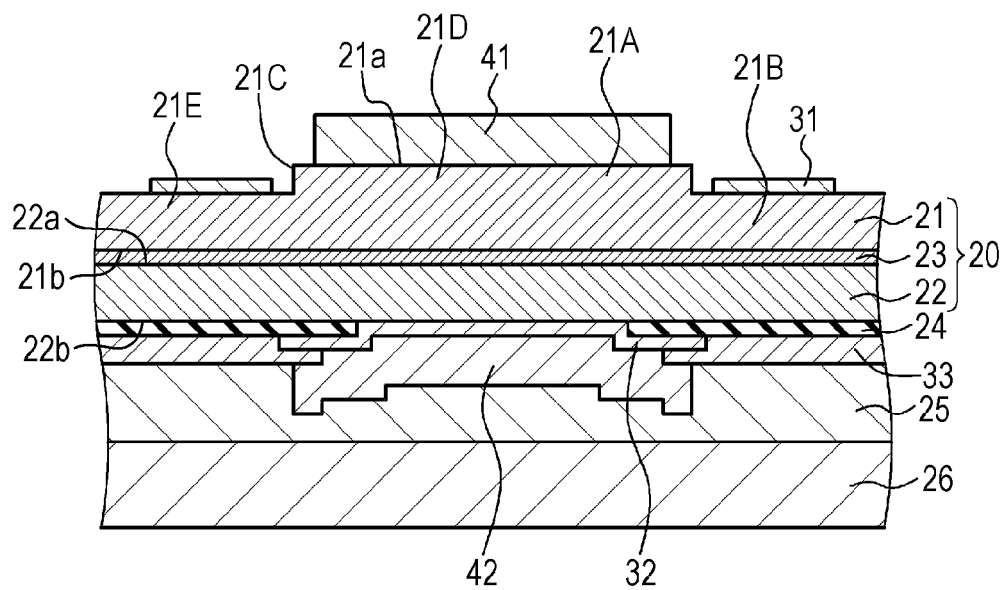
FIGS. 9A and 9B are both schematic partial end face views of a modification example of the light emitting element of Embodiment 1.
Figure 9B:
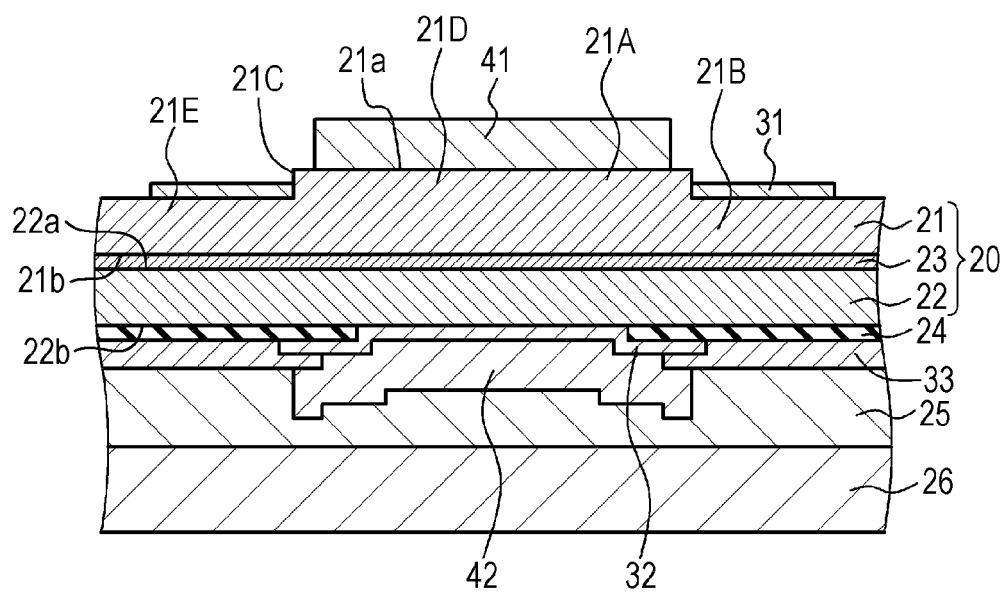

In the example of a light emitting element shown in FIG. 8A, the first light reflecting layer 41 includes the flat region 21A or all of the inside 21D of the step portion 21C, and the end portion of the first electrode 31 is separated from the step portion 21C. In the example of a light emitting element shown in FIG. 8A, the first light reflecting layer 41 includes the flat region 21A or all of the inside 21D of the step portion 21C, and the end portion of the first electrode 31 contacts the step portion 21C. In the example of the light emitting element shown in FIGS. 9A and 9B, the first light reflecting layer 41 includes the flat region 21A or a part of the inside 21D of the step portion 21C. The end portion of the first electrode 31 is separated from the step portion 21C (refer to FIG. 9A), or the end portion of the first electrode 31 contacts the step portion 21C (refer to FIG. 9B).

Figure 10A:
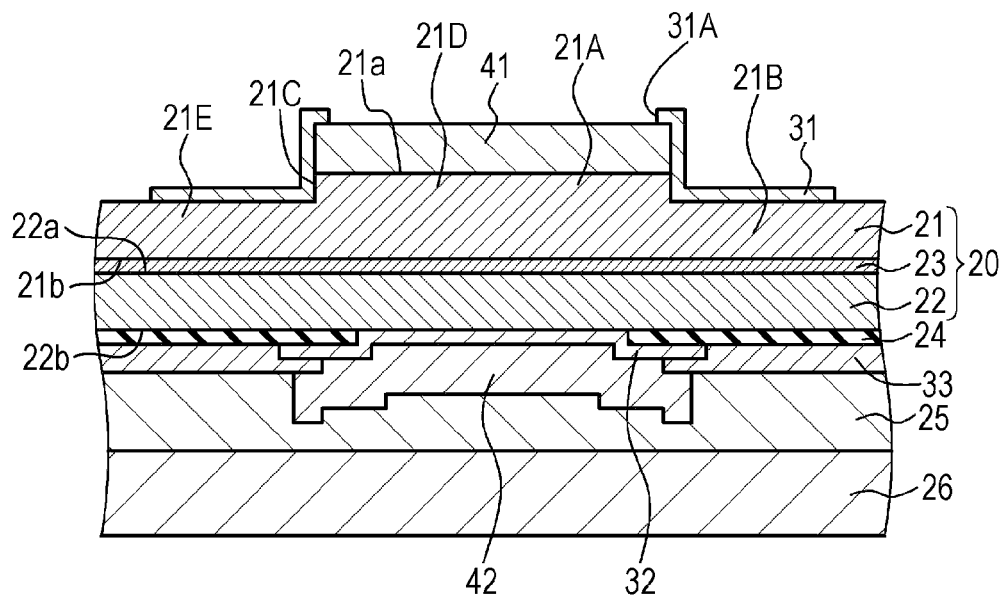
FIGS. 10A and 10B are both schematic partial end face views of a modification example of the light emitting element of Embodiment 1.
Figure 10B:
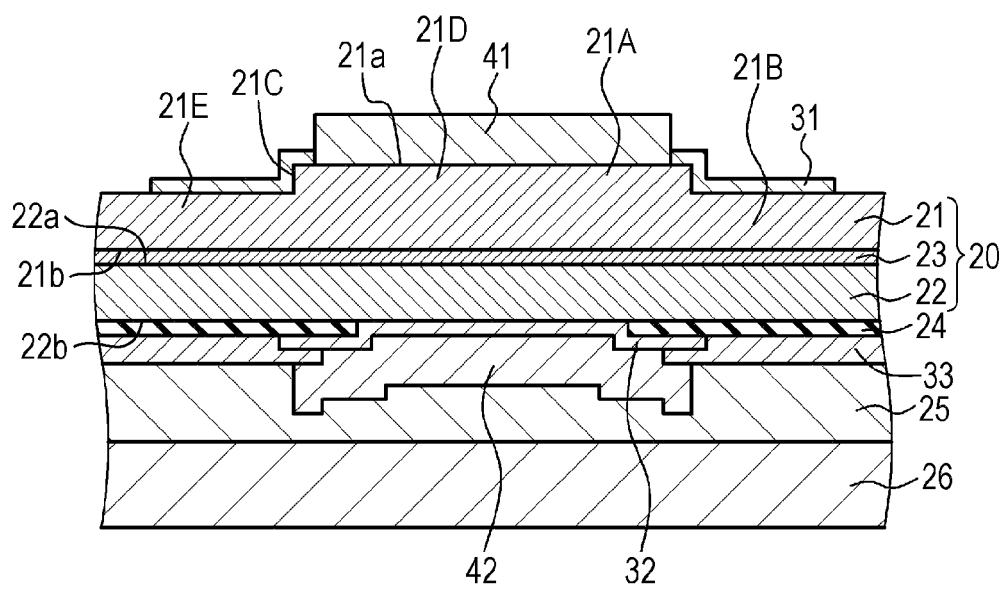
Figure 11A:
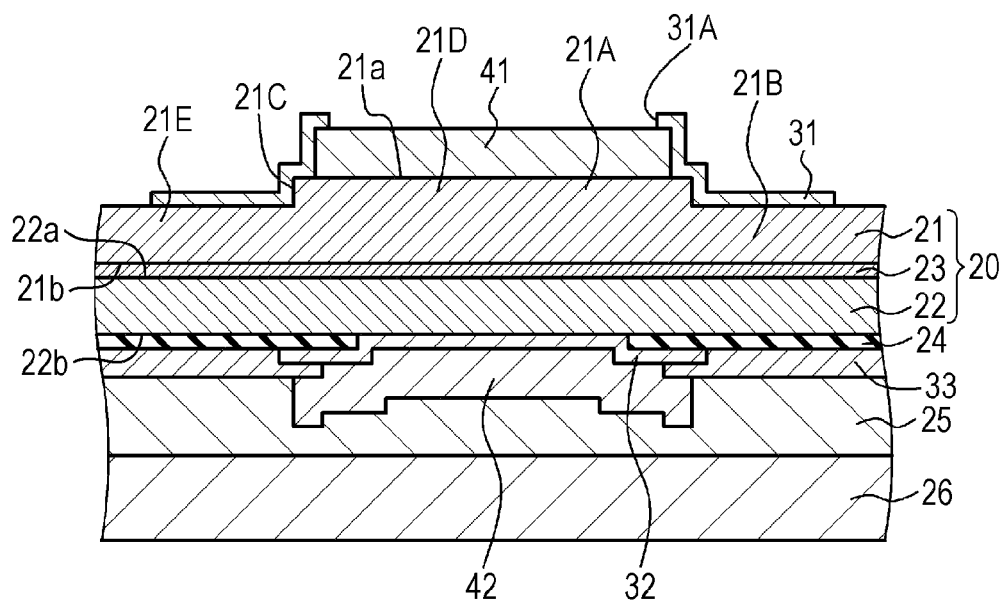
FIGS. 11A and 11B are both schematic partial end face views of a modification example of the light emitting element of Embodiment 1.
Figure 11B:
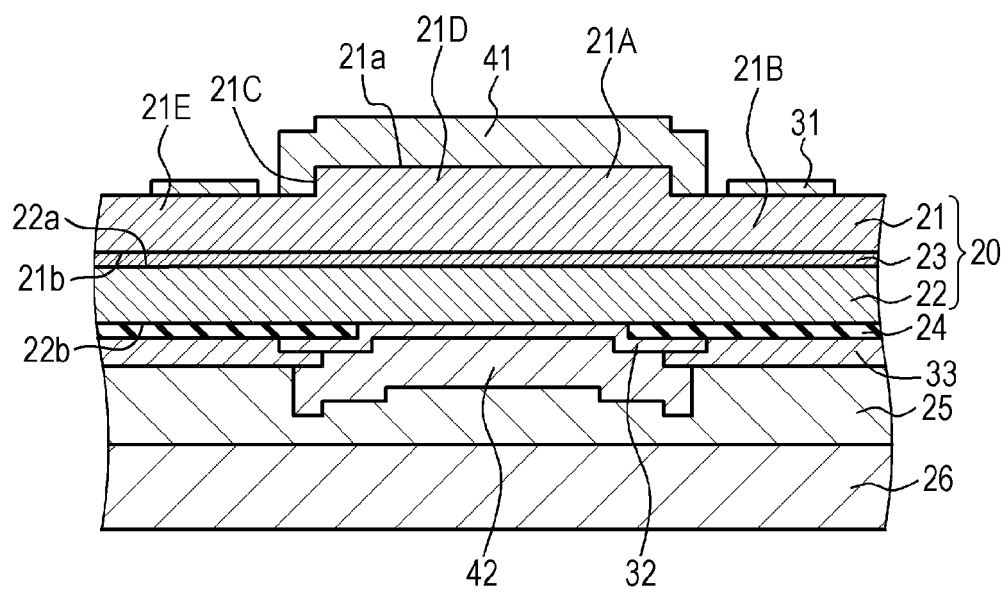
Figure 12A:
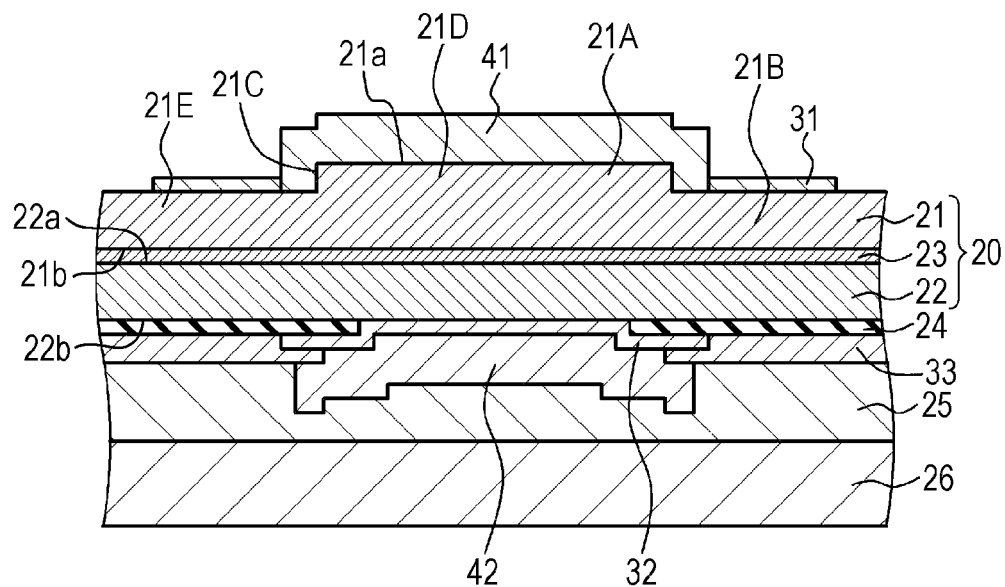
FIGS. 12A and 12B are both schematic partial end face views of a modification example of the light emitting element of Embodiment 1.
Figure 12B:
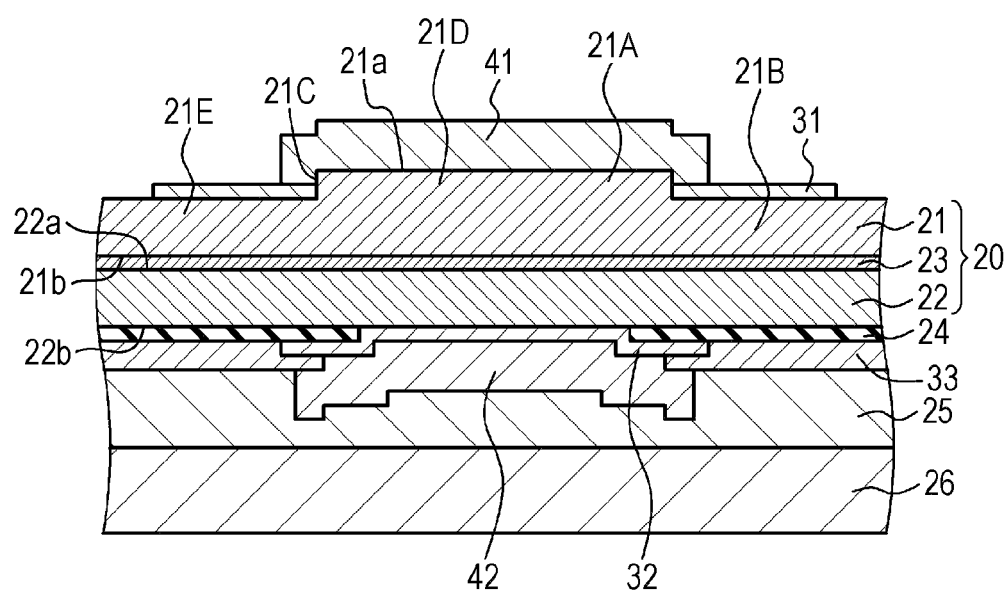
Figure 13A:
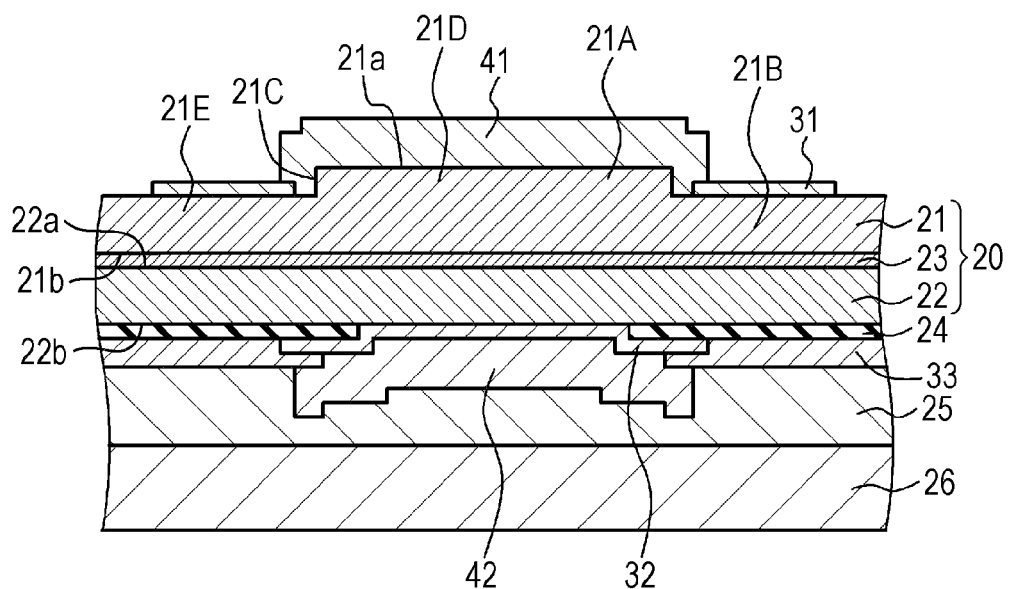
FIGS. 13A and 13B are both schematic partial end face views of a modification example of the light emitting element of Embodiment 1.
Figure 13B:
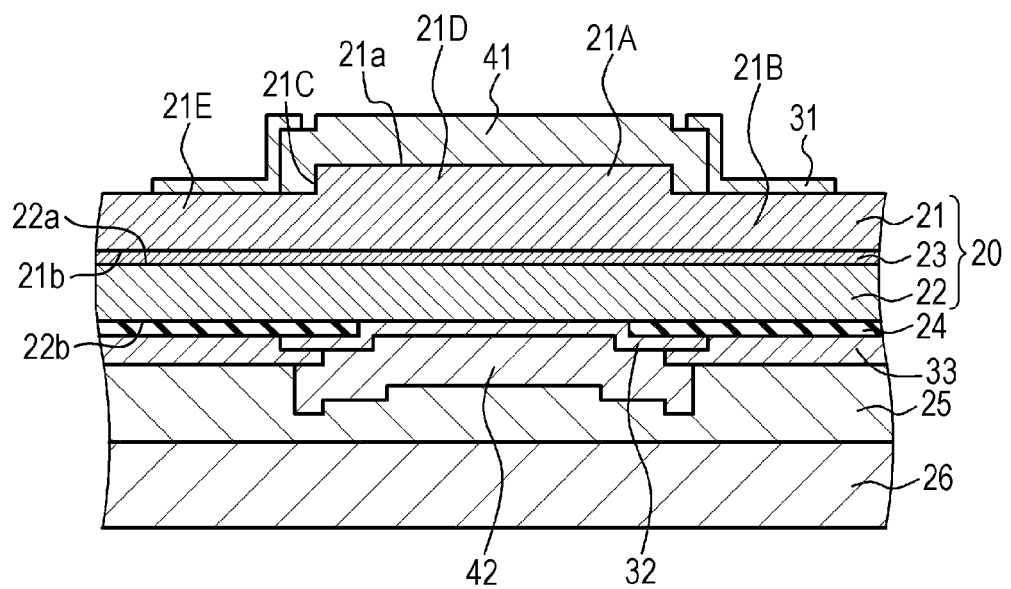

In the example of a light emitting element shown in FIG. 10A, the first light reflecting layer 41 includes the flat region 21A or all of the inside 21D of the step portion 21C, and the end portion of the first electrode 31 is formed from the step portion 21C to over the edge portion of the first light reflecting layer 41. That is, the first light reflecting layer 41 and the first electrode 31 are in contact. In the example of the light emitting element shown in FIGS. 10B and 11A, the first light reflecting layer 41 includes the flat region 21A or a part of the inside 21D of the step portion 21C. The first electrode 31 extends from the step portion 21C to the edge portion of the flat region 21A (refer to FIG. 10B), and the first light reflecting layer 41 and the first electrode 31 are in contact. Alternatively, the first electrode 31 extends from the step portion 21C to the edge portion of the flat region 21A, and further to on the edge portion of the first light reflecting layer 41 (refer to FIG. 11A), and the first light reflecting layer 41 and the first electrode 31 are in contact.

In the example of a light emitting element shown in FIGS. 11B, 12A, 12B, 13A, and 13B, the first light reflecting layer 41 includes the flat region 21A or all of the inside 21D of the step portion 21C, and further extends to the rough surface region 21B or the outside 21E of the step portion 21C. The end portion of the first electrode 31 is separated from the first light reflecting layer 41 (refer to FIG. 11B). Alternatively, the end portion of the first electrode 31 contacts the first light reflecting layer 41 (refer to FIG. 12A). Alternatively, the first light reflecting layer 41 is formed on the end portion of the first electrode 31, and the first electrode 31 contacts the step portion 21 (refer to FIG. 12B). Alternatively, the first light reflecting layer 41 is formed on the end portion of the first electrode 31, and the first electrode 31 is separated from the step portion 21C (refer to FIG. 13A). Alternatively, the first electrode 31 extends to on the edge portion of the first light reflecting layer 41 (refer to FIG. 13B).

In the example shown in FIGS. 14A, 14B, 15A, 15B, 16A, 16B, 17A, 17B, 18A, 18B, the first light reflecting layer 41 is formed on the concavity of the first surface 21a of the first compound semiconductor layer 21, and the first electrode 31 is formed on the convexity of the first surface 21a of the first compound semiconductor layer 21.

Figure 14A:
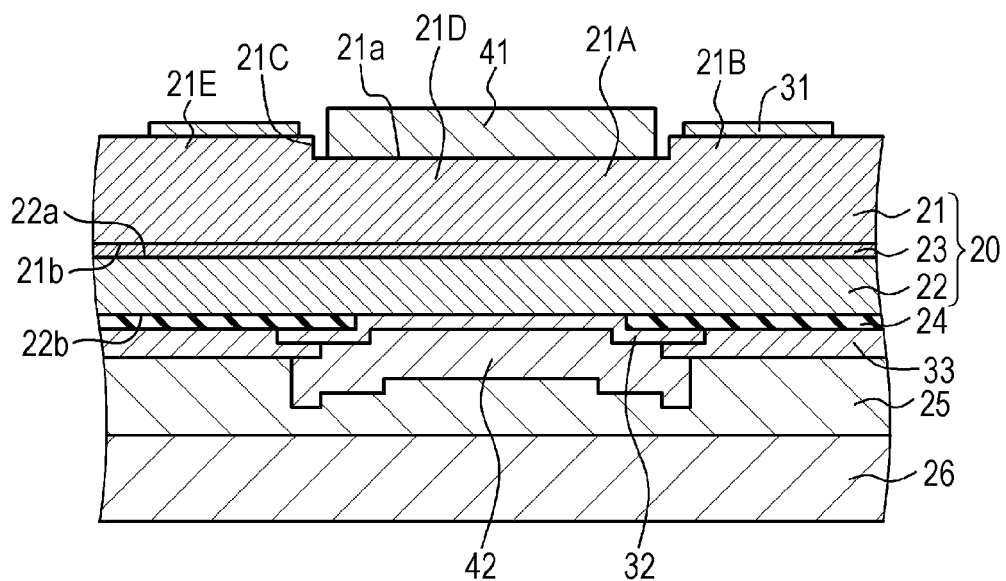
FIGS. 14A and 14B are both schematic partial end face views of a modification example of the light emitting element of Embodiment 1.
Figure 14B:
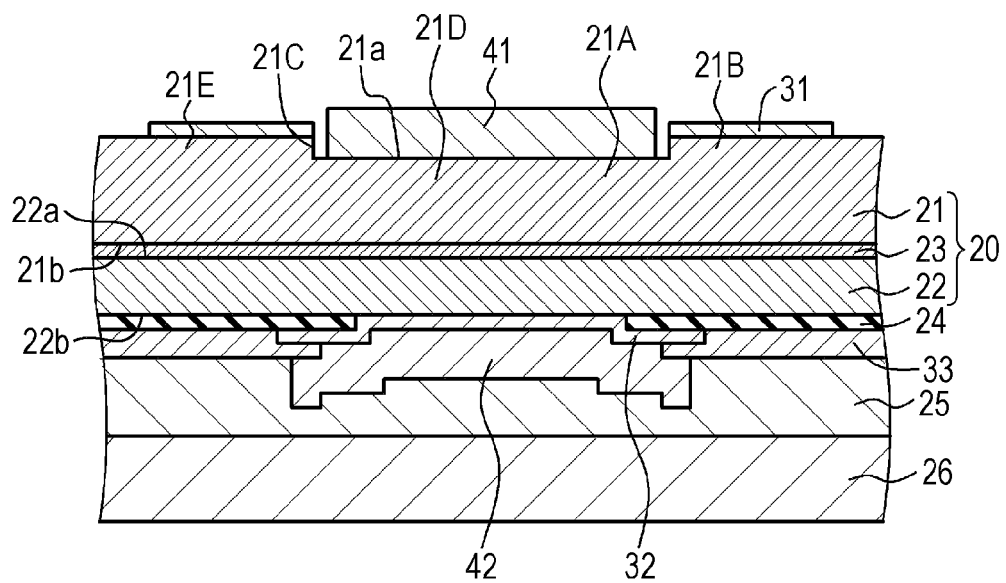
Figure 15A:
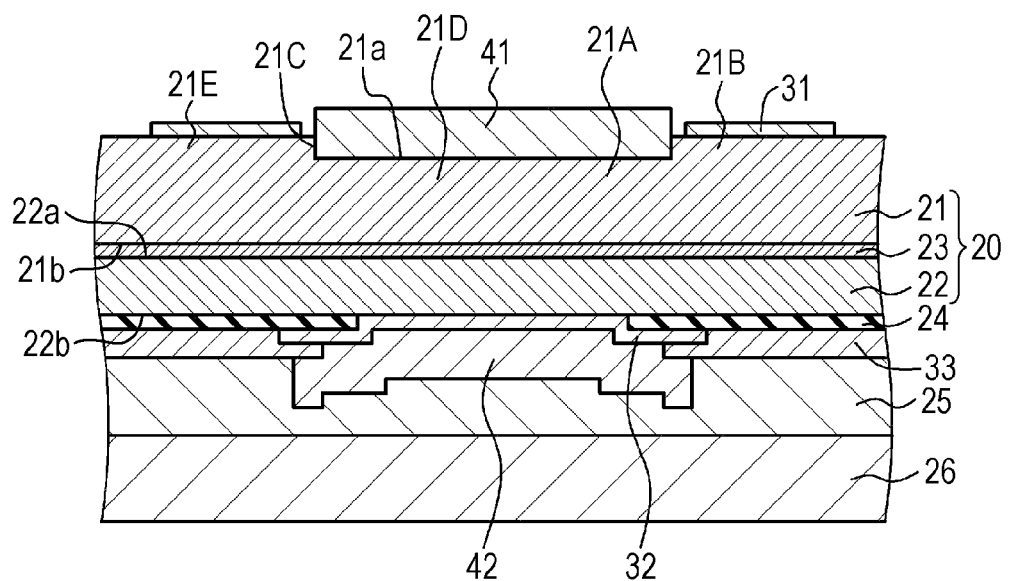
FIGS. 15A and 15B are both schematic partial end face views of a modification example of the light emitting element of Embodiment 1.
Figure 15B:
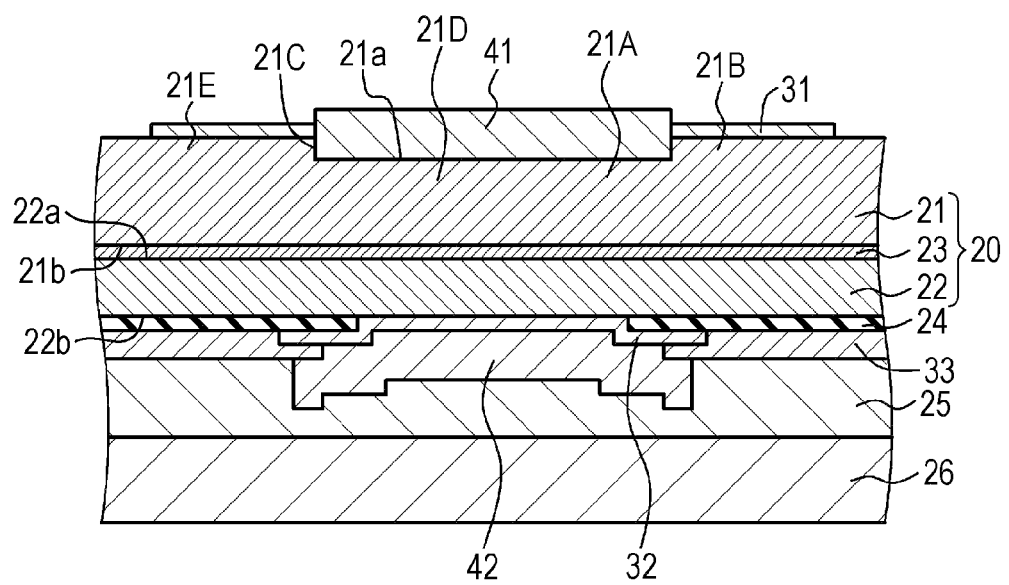
Figure 16A:
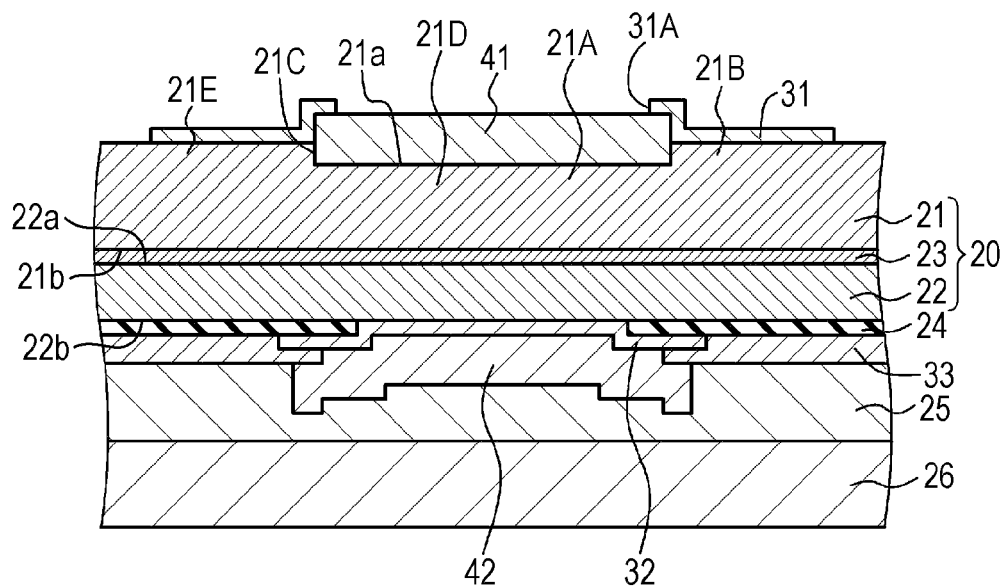
FIGS. 16A and 16B are both schematic partial end face views of a modification example of the light emitting element of Embodiment 1.
Figure 16B:
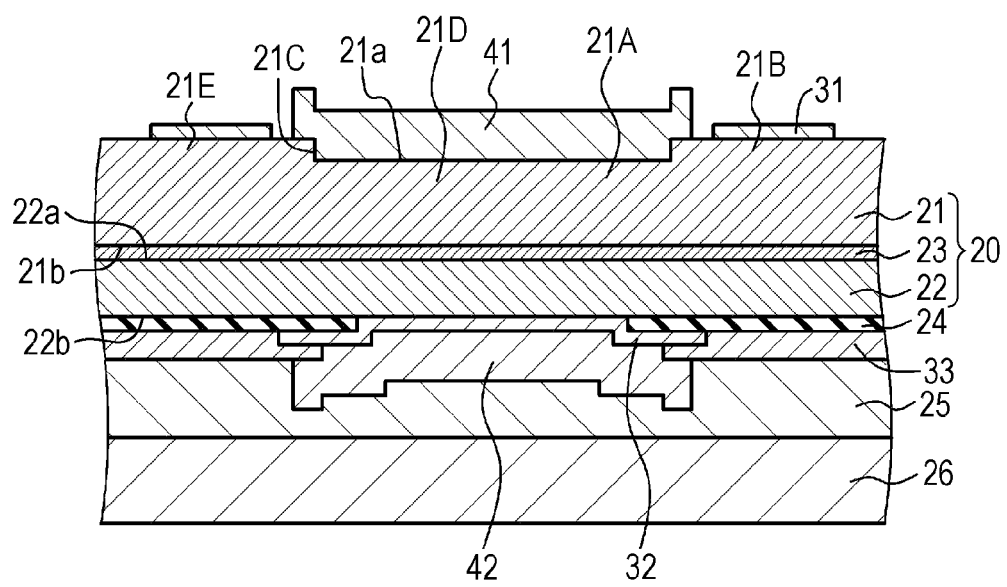
Figure 17A:
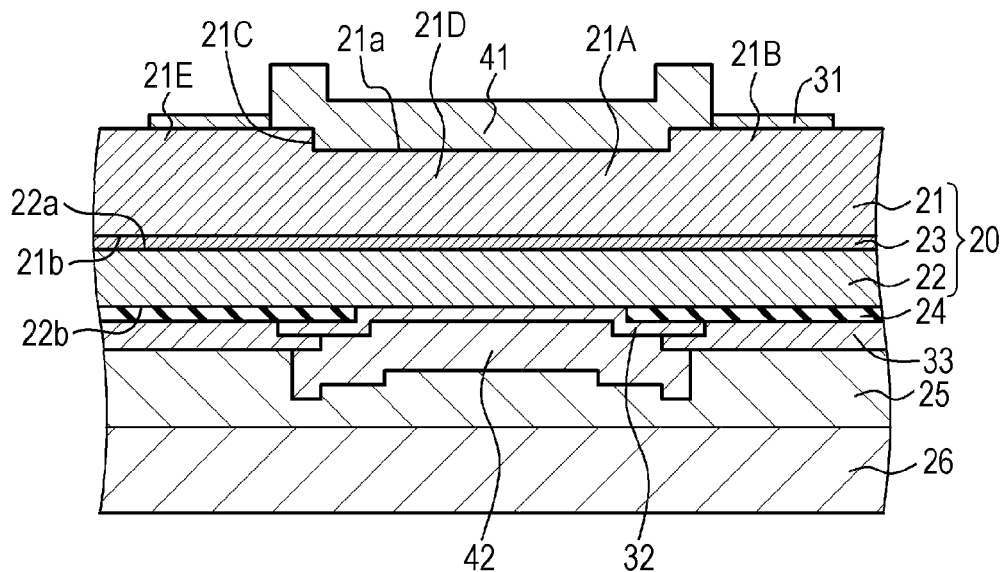
FIGS. 17A and 17B are both schematic partial end face views of a modification example of the light emitting element of Embodiment 1.
Figure 17B:
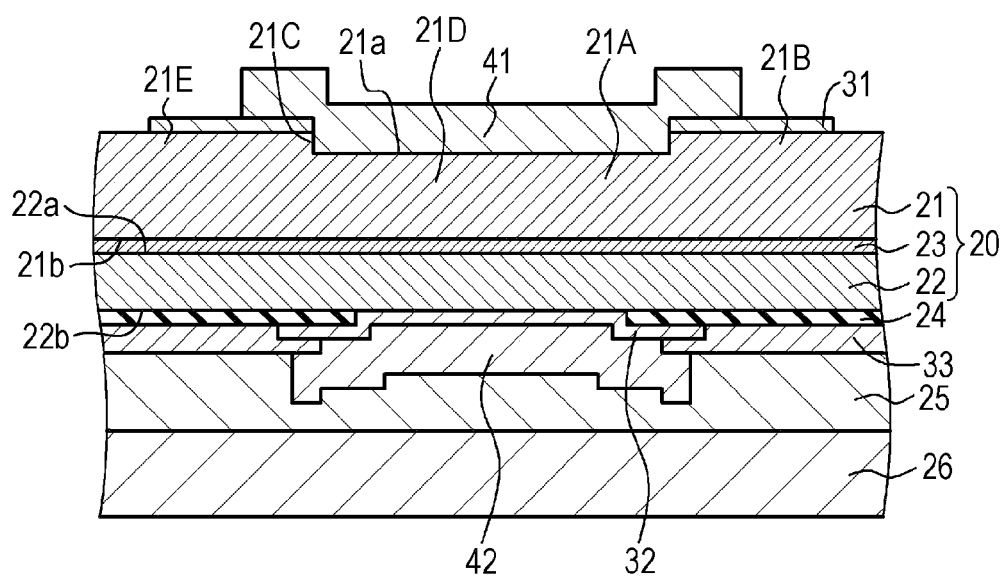
Figure 18A:
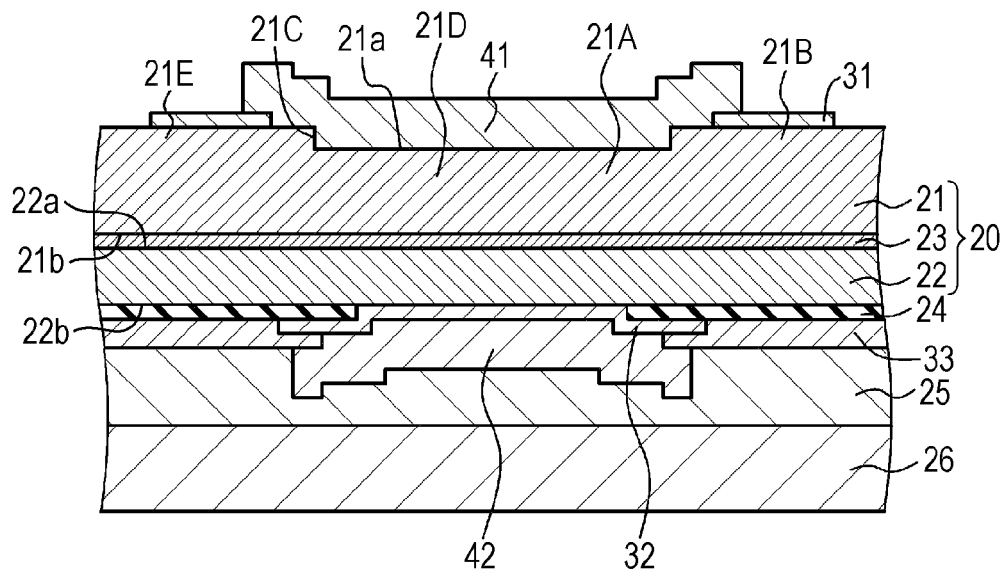
FIGS. 18A and 18B are both schematic partial end face views of a modification example of the light emitting element of Embodiment 1.
Figure 18B:
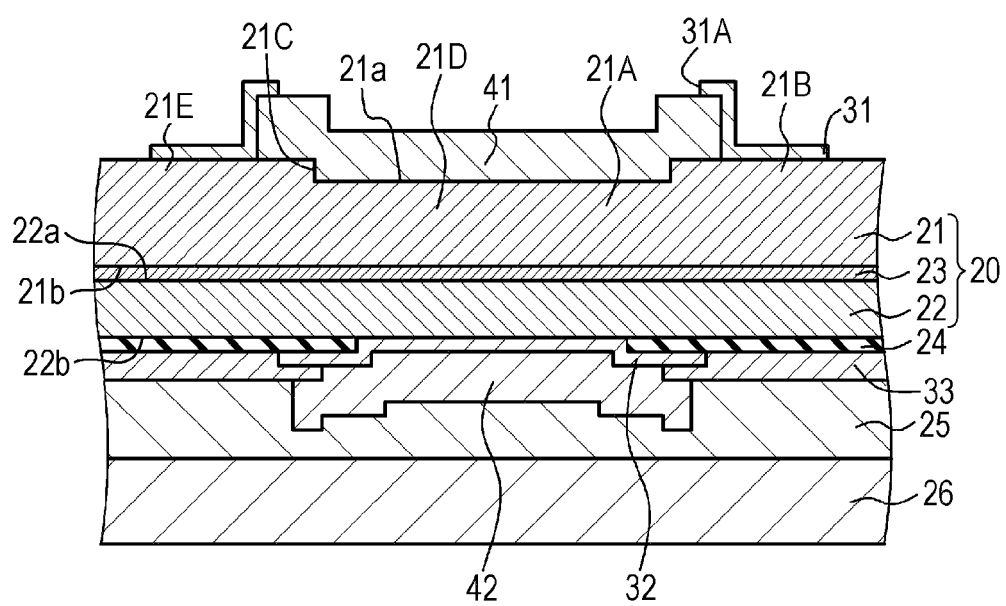
Figure 21:
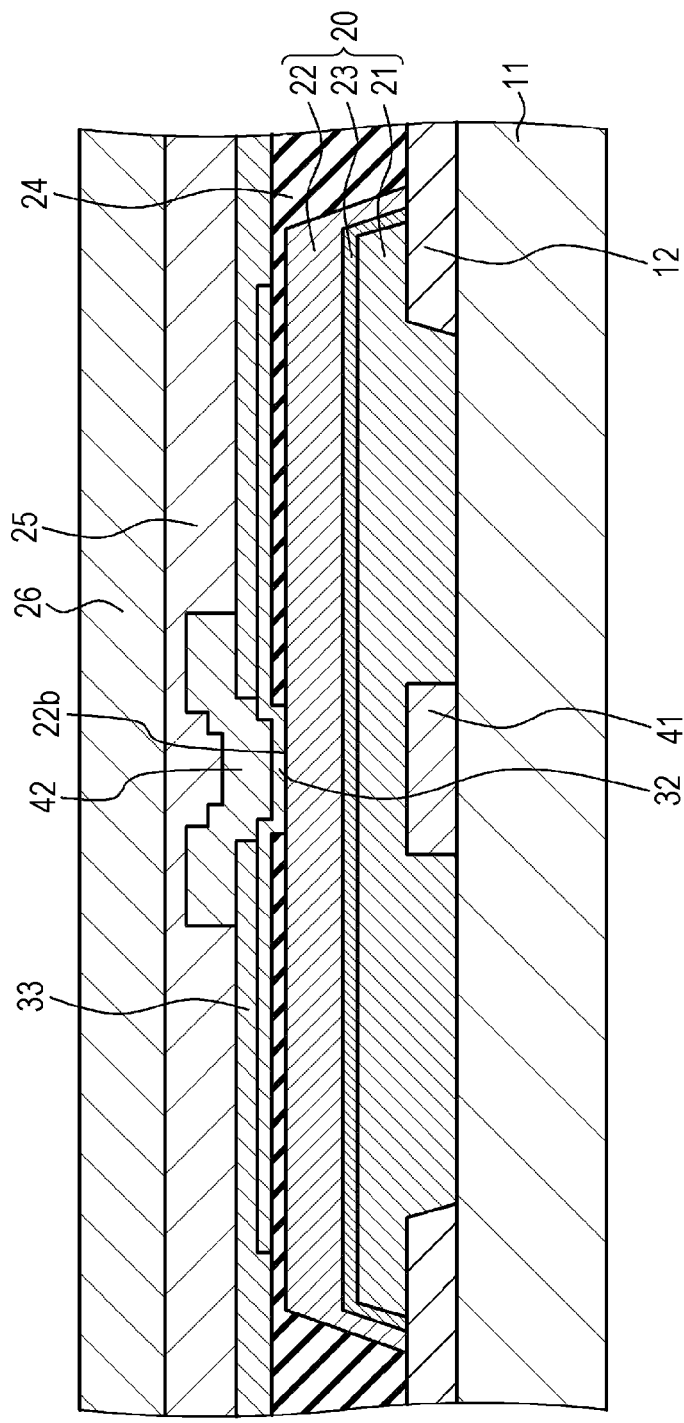
FIG. 21 is a schematic partial end face view of the layered structure body for illustrating the method of manufacturing a light emitting element of Embodiment 2, continued from FIG. 20B.

In the example of a light emitting element shown in FIGS. 14A and 14B, the first light reflecting layer 41 includes the flat region 21A or a part of the inside 21D of the step portion 21C, and the end portion of the first electrode 31 is separated from the step portion 21C (refer to FIG. 14A) or the end portion of the first electrode 31 extends to the step portion 21C (refer to FIG. 14B). In the example of a light emitting element shown in FIGS. 15A, 15B and 16A, the first light reflecting layer 41 includes the flat region 21A or all of the inside 21D of the step portion 21C, and the end portion of the first electrode 31 is separated from the step portion 21C (refer to FIG. 15A). Alternatively, the end portion of the first electrode 31 extends to the step portion 21C, and the end portion of the first electrode 31 contacts the first light reflecting layer 41 (refer to FIG. 15B). Alternatively, the end portion of the first electrode 31 extends to on the edge portion of the first light reflecting layer 41 (refer to FIG. 16A).

In the example of a light emitting element shown in FIGS. 16B, 17A, 17B, 18A, and 18B, the first light reflecting layer 41 includes the flat region 21A or all of the inside 21D of the step portion 21C, and further extends to the rough surface region 21B or the outside 21E of the step portion 21C. The first electrode 31 is separated is formed separated from the first light reflecting layer 41 (refer to FIG. 16B). Alternatively, the first electrode 31 contacts the first light reflecting layer 41 (refer to FIG. 17A). Alternatively, the first light reflecting layer 41 extends to on the first electrode 31, and the end portion of the first electrode 31 extends to the step portion 21C (refer to FIG. 17B). Alternatively, the first light reflecting layer 41 extends to on the first electrode 31, and the end portion of the first electrode 31 is separated from the step portion 21C (refer to FIG. 18A). Alternatively, the first electrode 31 extends to on the edge portion of the first light reflecting layer 41 (refer to FIG. 18B).

Embodiment 2

Embodiment 2 is a method of manufacturing a light emitting element according to the second embodiment of the disclosure.

Below, the method of manufacturing a light emitting element of Embodiment 2 will be described with reference to FIGS. 19A, 19B, 20A, 20B, 21, 22, and 23 which are schematic partial end face views of a layered structure body.

Step-200

First, a mask layer for selective growth 12 formed from a material different to the material that configures the first compound semiconductor layer 21 is formed on the region 14 outside the element forming region 13 on the substrate for manufacturing a light emitting element 11, and a first light reflecting layer 41 formed from a multilayer film and having a convex shape is formed on the element forming region 13. Specifically, similarly to [Step-100] of Embodiment 1, a patterned mask layer 12 formed from $SiO_2$ is formed, and a patterned first light reflecting layer 41 formed from a multilayer film is formed, based on an existing method, on the element forming region 13. In this way, it is possible to obtain the structure shown in FIG. 19A. The shape of the first light reflecting layer 41 is a disk-shape. However, the shape of the first light reflecting layer 41 is not limited thereto.

Step-210

Next, similarly to [Step-110] of Embodiment 1, a layered structure body 20 in which a first compound semiconductor layer 21 formed from a GaN-based compound semiconductor, and having a first surface 21a and a second surface 21b opposing the first surface 21a, an active layer 23 formed from a GaN-based compound semiconductor, that contacts the second surface 21b of the first compound semiconductor layer 21, and a second compound semiconductor layer 22 formed from a GaN-based compound semiconductor, having a first surface 22a and a second surface 22b opposing the first surface 22a, and in which the first surface 22a contacts the active layer 23 are layered is formed on the substrate for manufacturing a light emitting element 11 including the first light reflecting layer 41. Then, the current constriction layer 24 having an opening 24A is formed, based on an existing method, on the second surface 22b of the second compound semiconductor layer 22. In this way, it is possible to obtain the structure shown in FIG. 19B.

In the example depicted, the size of the first light reflecting layer 41 and the distance from the first light reflecting layer 41 to the mask 12 are selected so as to attain a state in which the first compound semiconductor layer 21 covers the top surface of the first light reflecting layer 41, the first compound semiconductor layer 21 is not formed on the center region 12A of the mask layer 12, and the center region 12A of the mask layer 12 is exposed, that is, so that a portion of the top surface of the mask layer 12 is covered by the layered structure body 20. However, the disclosure is not limited thereto, and a form may be adopted in which the entire surface of the mask layer 12 is covered by the layered structure body 20, or a form may be adopted in which all of the side surface or a portion (lower portion of the side surface) of the side surface of the mask layer 12 is covered by the layered structure body 20.

Step-220

Thereafter, similarly to [Step-120] of Embodiment 1, the second electrode 32 and the second light reflecting layer 42 formed from a multilayer film are formed on the second surface 22b of the second compound semiconductor layer 22 (refer to FIGS. 20A and 20B).

Step-230

Next, the second light reflecting layer 42 is fixed to the support substrate 26 via a bonding layer 25. In this way, it is possible to obtain the structure shown in FIG. 21. Step-240

Figure 22:
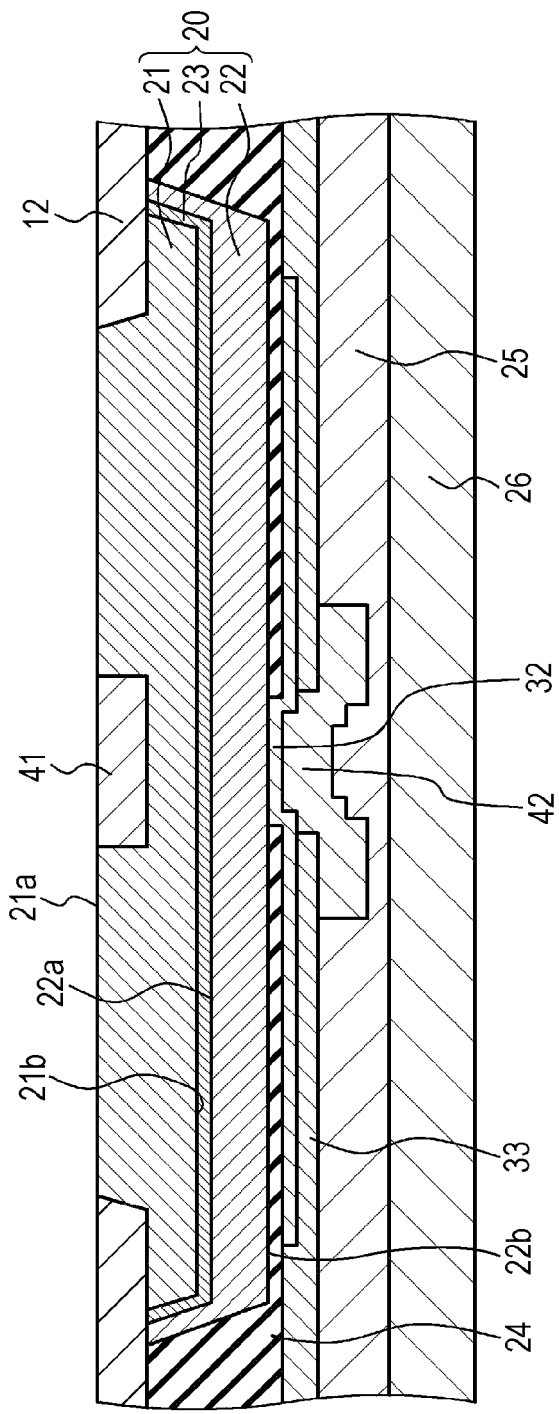
FIG. 22 is a schematic partial end face view of the layered structure body for illustrating the method of manufacturing a light emitting element of Embodiment 2, continued from FIG. 20B.

Thereafter, the substrate for manufacturing a light emitting element 11 is removed, and the first surface 21a of the first compound semiconductor layer 21, the mask layer 12 and the first light reflecting layer 41 are exposed (refer to FIG. 22). Specifically, similarly to [Step-140] of Embodiment 1, the thickness of the substrate for manufacturing a light emitting element 11 is thinned, then the remaining portion of the substrate for manufacturing a light emitting element 11 is removed based on a CMP method.

Step-250

Thereafter, the first electrode 31 is formed, based on an existing method, on at least the first surface 21a of the first compound semiconductor layer 21. In this way, it is possible to obtain the light emitting element of Embodiment 2 having the structure shown in FIG. 23. The first electrode 31 and the first light reflecting layer 41 are separated, that is, an offset is provided, and the separation distance is within 1 mm, specifically, for example, the same value as Embodiment 1.

Step-260

Next, the light emitting element is separated by performing so-called element separation as necessary, and the exposed surface of the side surface of the layered structure body is covered with an insulating film formed from, for example, $SiO_2$. Thereafter, a terminal or the like for connecting the first electrode 31 and the pad electrode 33 to an external circuit or the like is formed based on an existing method, and the light emitting element of Embodiment 2 is completed by packaging or sealing. Cases of separating a light emitting element from another light emitting element, for example, may be performed along the arrow B in FIG. 23, or may be performed along the arrows C.

In the method of manufacturing a light emitting element of Embodiment 2, the substrate for manufacturing a light emitting element is removed in a state in which a mask layer for selective growth and a first light reflecting layer are formed. Therefore, when removing the substrate for manufacturing a light emitting element, the mask layer and the first light reflecting layer function as one type of polishing stopper, as a result it is possible to suppress removal variations in the substrate for manufacturing a light emitting element on the surface of the substrate for manufacturing a light emitting element, and further, the occurrence of thickness variations the first compound semiconductor layer, and since it is possible to achieve uniformity in the length of the resonator, it is possible to achieve stability in the characteristics of the obtained light emitting element.

Between [Step-240] and [Step-250], a part of the first surface 21a of the first compound semiconductor layer 21 may be etched before forming the first electrode 31 on the first surface 21a of the first compound semiconductor layer 21.

The part of the first surface 21a of the first compound semiconductor layer 21 on which the first electrode 31 is to be formed may be etched based on a reactive ion etching method (RIE method). Thereby, a rough surface region 21F is formed on the first surface 21a of the first compound semiconductor layer 21. Next, in [Step-250], the first electrode 31 is formed on at least the etched first surface 21a of the first compound semiconductor layer 21. Specifically, the first electrode 31 is formed, based on an existing method, on the etched first surface 21a of the first compound semiconductor layer 21 (on the rough surface region 21F).

In this way, it is possible to suppress a rise in the contact resistance between the first compound semiconductor layer and the first electrode by etching a part of the first surface of the first compound semiconductor layer on which the first electrode 31 is to be formed based on a RIE method. Because the first surface of the first compound semiconductor layer in the interface between the first light reflecting layer and the first compound semiconductor layer is flat, it is possible to suppress scattering of light by the first surface of the first compound semiconductor layer to a minimal level.

Figure 23:
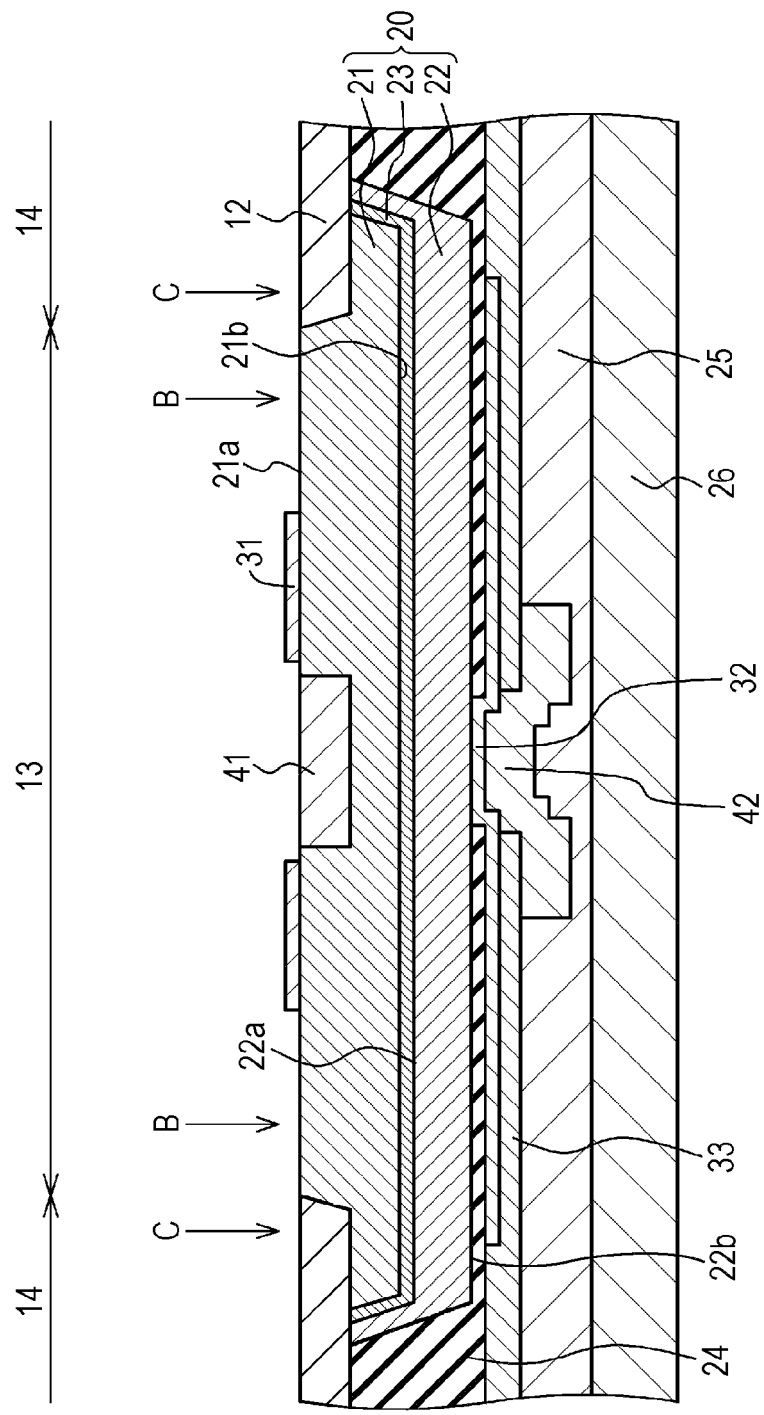
FIG. 23 is a schematic partial end face view of the layered structure body for illustrating the method of manufacturing a light emitting element of Embodiment 2, continued from FIG. 22.
Figure 24A:
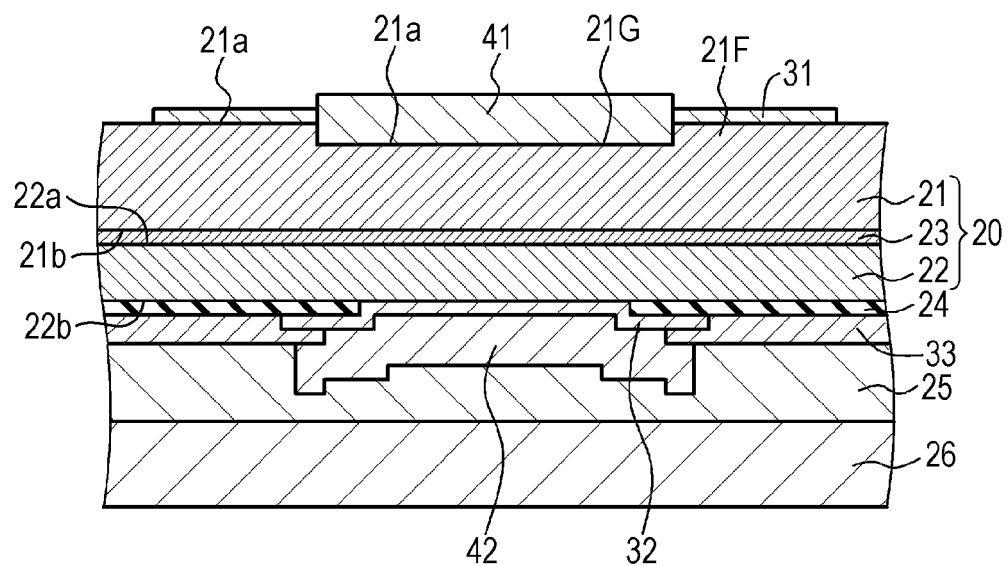
FIGS. 24A and 24B are both schematic partial end face views of a modification example of the light emitting element of Embodiment 2.
Figure 24B:
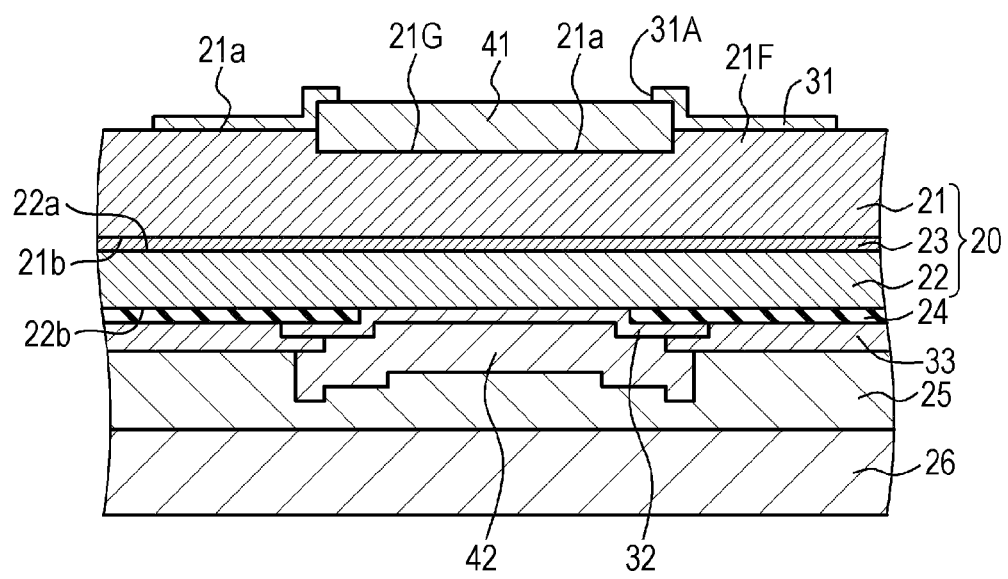
Figure 25A:
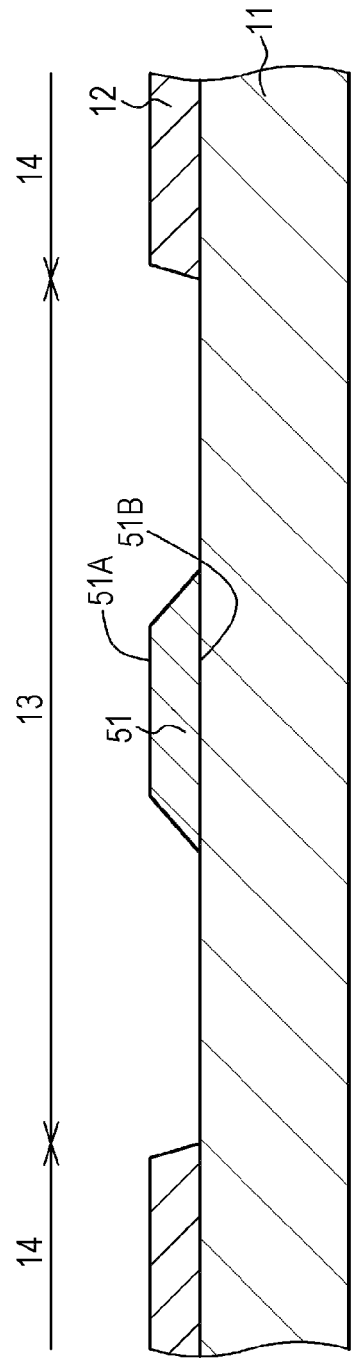
FIGS. 25A and 25B are schematic partial end face views of a layered structure body for illustrating a method of manufacturing a light emitting element of Embodiment 3.
Figure 25B:
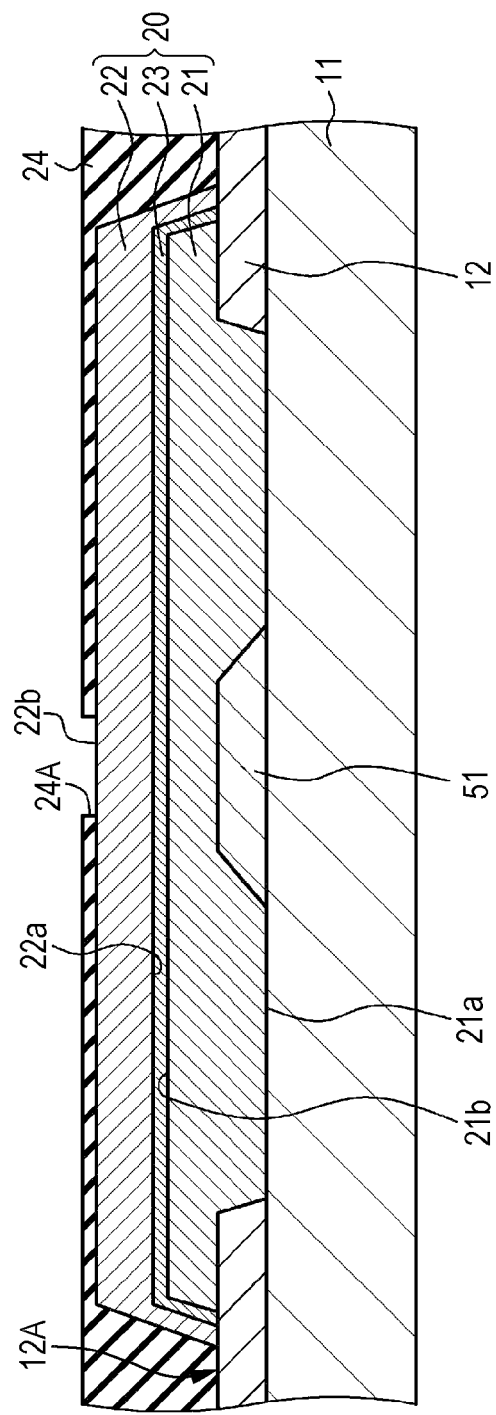
Figure 27:
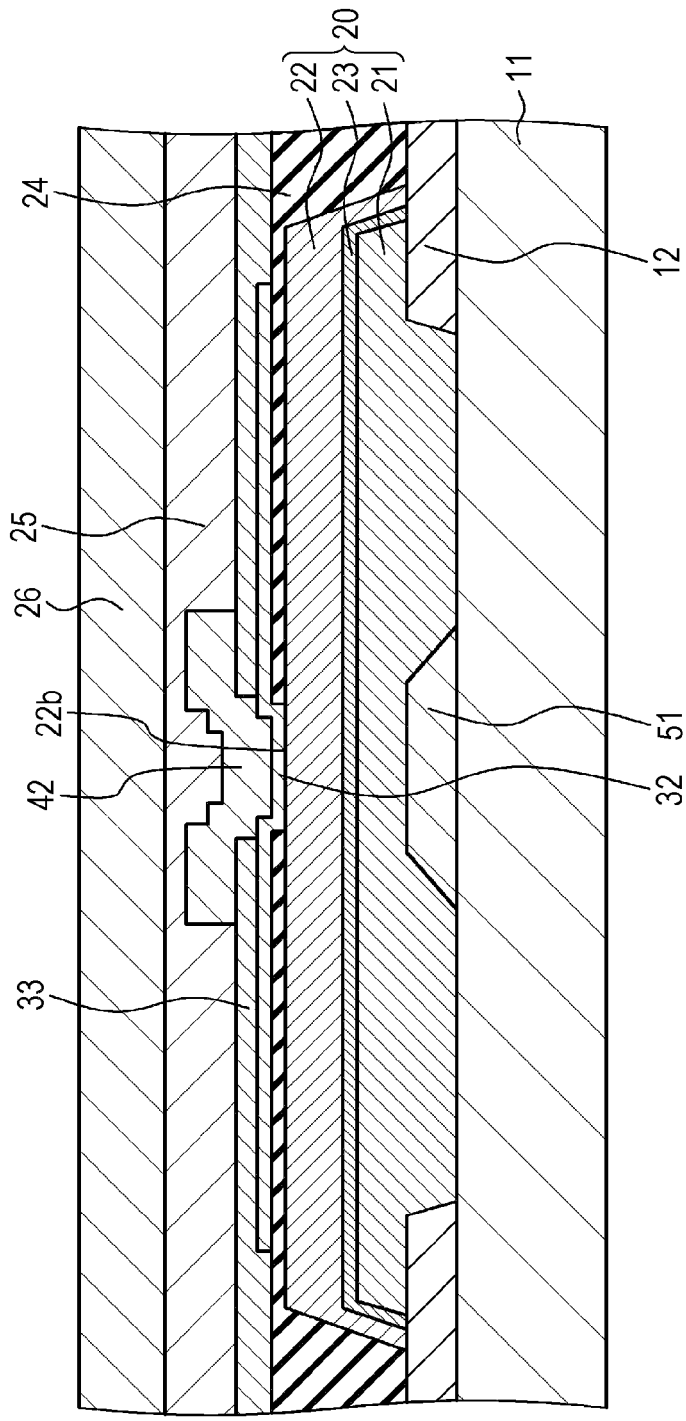
FIG. 27 is a schematic partial end face view of the layered structure body for illustrating the method of manufacturing a light emitting element of Embodiment 3, continued from FIG. 26B.

In the example of the light emitting element shown in FIG. 24A, the end portion of the first electrode 31 contacts the first light reflecting layer 41. In the example of a light emitting element shown in FIG. 24B, the first electrode 31 extends to on the edge portion of the first light reflecting layer 41. In FIGS. 24A and 24B, only the element forming region 13 (refer to FIG. 23) is shown. Similarly to the depiction in FIG. 23, the first electrode 31 may be provided separated from the first light reflecting layer 41. It is possible to adopt a structure in which the first surface 21a in the rough surface region 21F is positioned lower than the surface of the first compound semiconductor layer 21 (below, referred to as "flat surface 21G", as a matter of convenience) in the interface between the first light reflecting layer 41 and the first surface 21a of the first compound semiconductor layer 21.

Here, the value of the surface roughness Ra of the flat surface 21G is $3 \times 10^{-9}$ m, and the value of the surface roughness Ra of the rough surface region 21F exceeds the value of the surface roughness Ra of the flat surface 21G. Specifically, the value of the surface roughness Ra of the flat surface 21G is 0.2 nm, and the value of the surface roughness Ra of the rough surface region 21F is 3.1 nm.

$R_2/R_1 \le 1$ is satisfied, where the contact resistance value in the flat surface 21G is $R_1$ and the contact resistance value in the rough surface region 21F is $R_2$.

Embodiment 3

Embodiment 3 is a method of manufacturing a light emitting element according to the third embodiment of the present disclosure.

Figure 31:
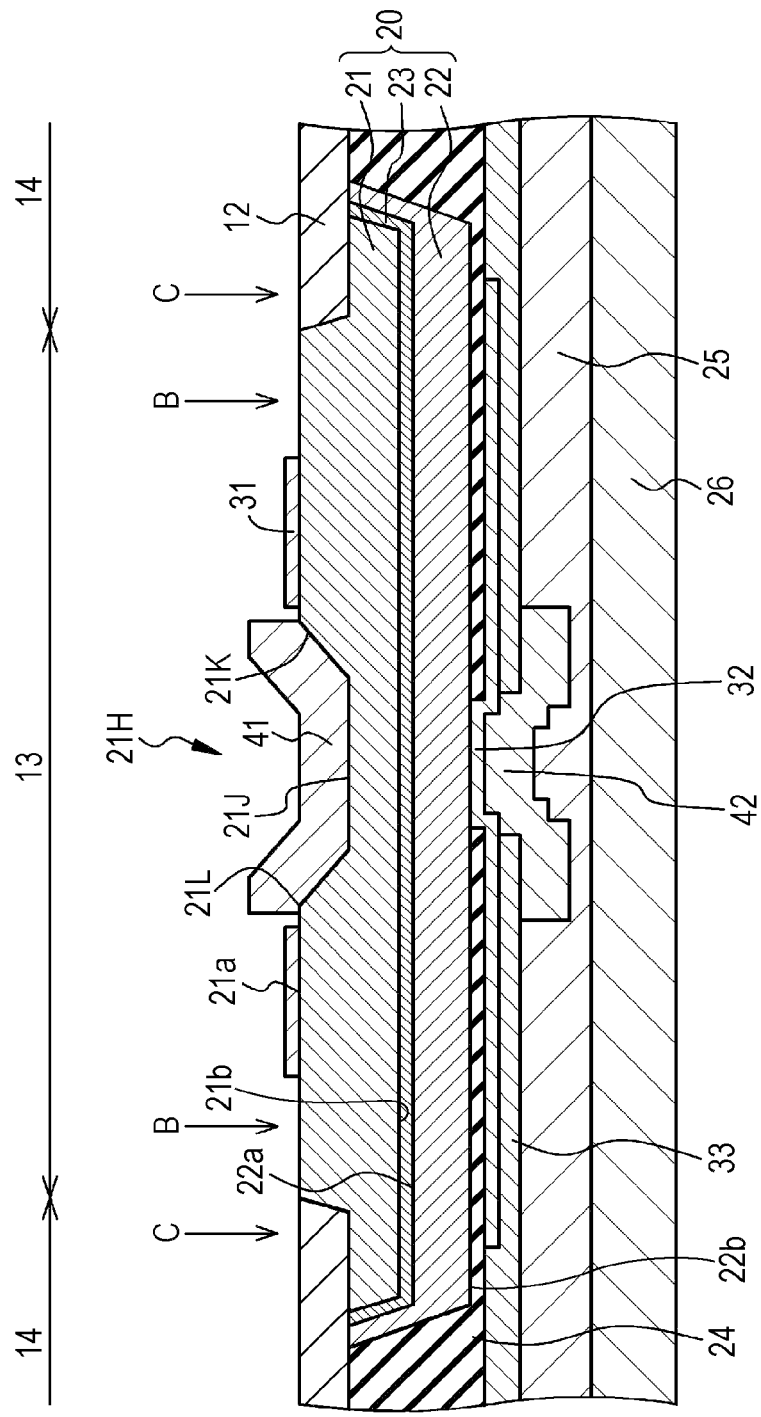
FIG. 31 is a schematic partial end face view of the layered structure body for illustrating the method of manufacturing a light emitting element of Embodiment 3, continued from FIG. 30.

Although FIG. 31 shows a schematic partial end face view of the light emitting element of Embodiment 3, the configuration and structure of the light emitting element of Embodiment 3 is substantially the same as the configuration and structure of the light emitting element of Embodiment 1, except that the configuration and structure of the first light reflecting layer 41, the first electrode 31 and the periphery thereof are slightly different. Therefore, in the light emitting element of Embodiment 3, the configuration and structure of the first light reflecting layer 41, the first electrode 31 and the periphery thereof will be exclusively described.

In the light emitting element of Embodiment 3, a concavity 21H with a forward tapered side surface 21K is formed on the first surface 21a of the first compound semiconductor layer 21. That is, the bottom surface 21J of the concavity 21H positioned on the active layer side is smaller than the opening portion 21L positioned on the first surface 21a of the first compound semiconductor layer 21. The first light reflecting layer 41 is formed on at least the concavity 21H, and the first electrode 31 is formed on at least the first surface 21a of the first compound semiconductor layer 21. The end portion of the first electrode 31 is separated from the first light reflecting layer 41.

Below, the method of manufacturing a light emitting element of Embodiment 3 will be described with reference to FIGS. 25A, 25B, 26A, 26B, 27, 28, 29, 30, and 31 which are schematic partial end face views of a layered structure body.

Step-300

First, a mask layer for selective growth 12 formed from a material different from the material that configures the first compound semiconductor layer 21 is formed on the region 14 outside the element forming region 13 on the substrate for manufacturing a light emitting element 11, a convexity 51 formed from a material different from the material that configures the first compound semiconductor layer 21 is formed on the element forming region 13. Specifically, similarly to [Step-100] of Embodiment 1, a patterned mask layer 12 formed from $SiO_2$ is formed, and a patterned convexity 51 formed from $SiO_2$ is formed, based on an existing method, on the element forming region 13. The top surface 51A of the convexity 51 is smaller than the bottom surface 51B of the convexity 51. In this way, it is possible to obtain the structure shown in FIG. 25A. The shape of the convexity 51 is a truncated cone. However, the shape of the convexity 51 is not limited thereto.

Step-310

Next, similarly to [Step-110] of Embodiment 1, a layered structure body 20 in which a first compound semiconductor layer 21 formed from a GaN-based compound semiconductor, and having a first surface 21a and a second surface 21b opposing the first surface 21a, an active layer 23 formed from a GaN-based compound semiconductor, that contacts the second surface 21b of the first compound semiconductor layer 21, and a second compound semiconductor layer 22 formed from a GaN-based compound semiconductor, having a first surface 22a and a second surface 22b opposing the first surface 22a, and in which the first surface 22a contacts the active layer 23 are layered is formed on the substrate for manufacturing a light emitting element 11 including the convexity 51. Then, the current constriction layer 24 having an opening 24A is formed, based on an existing method, on the second surface 22b of the second compound semiconductor layer 22. In this way, it is possible to obtain the structure shown in FIG. 25B.

In the example depicted, the size of the convexity 51 and the distance from the convexity 51 to the mask 12 are selected so as to attain a state in which the first compound semiconductor layer 21 covers the top surface of the convexity 51, the first compound semiconductor layer 21 is not formed on the center region 12A of the mask layer 12, and the center region 12A of the mask layer 12 is exposed. However, the disclosure is not limited thereto, and a form in which the entire surface of the mask layer 12 is covered by the layered structure body 20 may be adopted, or a form may be adopted in which all of the side surface or a portion (lower portion of the side surface) of the side surface of the mask layer 12 is covered by the layered structure body 20.

Step-320

Thereafter, similarly to [Step-120] of Embodiment 1, the second electrode 32 and the second light reflecting layer 42 formed from a multilayer film are formed on the second surface 22b of the second compound semiconductor layer 22 (refer to FIGS. 26A and 26B).

Step-330

Thereafter, the second light reflecting layer 42 is fixed to the support substrate 26 via a bonding layer 25. In this way, it is possible to obtain the structure shown in FIG. 27.

Step-340

Figure 28:
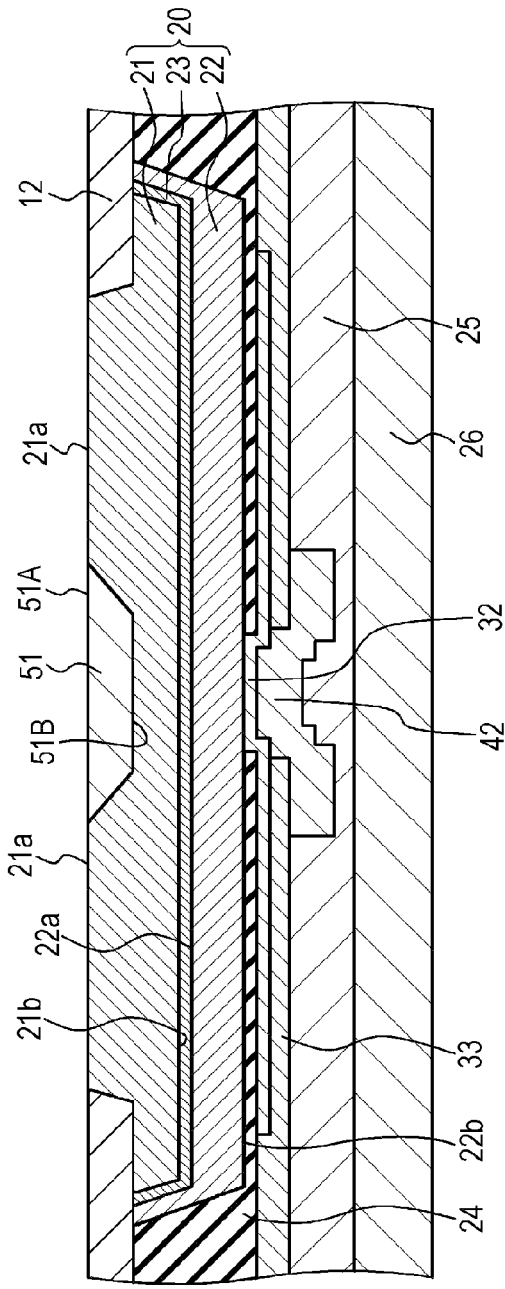
FIG. 28 is a schematic partial end face view of the layered structure body for illustrating the method of manufacturing a light emitting element of Embodiment 3, continued from FIG. 27.
Figure 29:
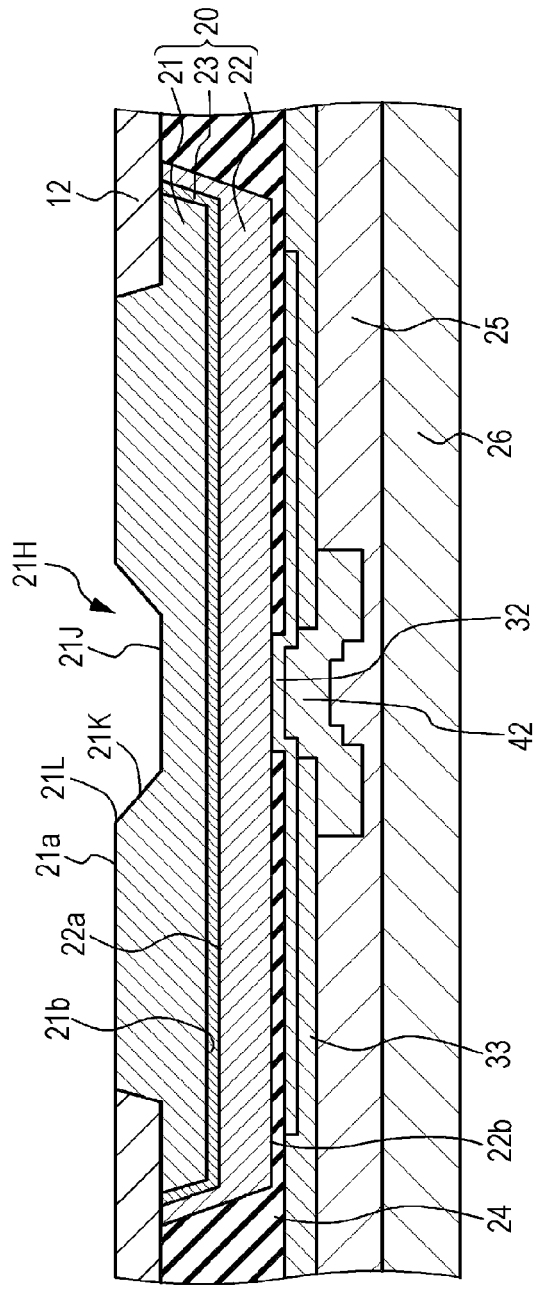
FIG. 29 is a schematic partial end face view of the layered structure body for illustrating the method of manufacturing a light emitting element of Embodiment 3, continued from FIG. 28.
Figure 30:
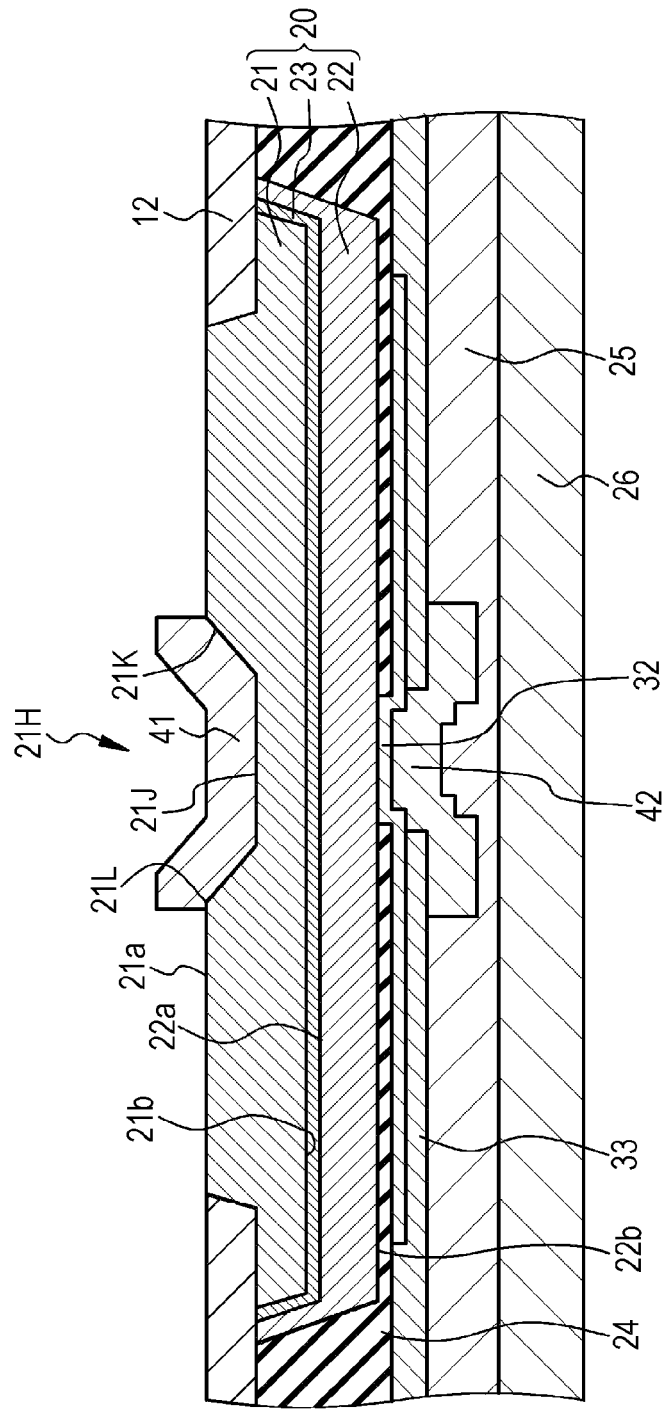
FIG. 30 is a schematic partial end face view of the layered structure body for illustrating the method of manufacturing a light emitting element of Embodiment 3, continued from FIG. 29.

Thereafter, the substrate for manufacturing a light emitting element 11 is removed, and the first surface 21a of the first compound semiconductor layer 21, the mask layer 12 and the convexity 51 are exposed (refer to FIG. 28). Specifically, similarly to [Step-140] of Embodiment 1, the thickness of the substrate for manufacturing a light emitting element 11 is thinned, then the remaining portion of the substrate for manufacturing a light emitting element 11 is removed based on a CMP method.

Step-350

Thereafter, the convexity 51 is removed, the first light reflecting layer 41 formed from a multilayer film is formed on at least that part of the first surface 21a of the first compound semiconductor layer 21 from which the convexity 51 is removed, and the first electrode 31 is formed on at least a part of the first surface 21a of the first compound semiconductor layer 21 on which the first electrode 31 is to be formed.

Specifically, removal of the convexity 51, formation of the first light reflecting layer 41 and formation of the first electrode 31 are performed in that order. That is, first, the convexity 51 formed from SiO₂ is removed based on an existing method. In this way, it is possible to obtain the structure shown in FIG. 29. A concavity 21H with a forward tapered side surface 21K is formed on the first surface 21a of the first compound semiconductor layer 21. That is, the bottom surface 21J of the concavity 21H positioned on the active layer side is smaller than the opening portion 21L positioned on the first surface 21a of the first compound semiconductor layer 21. Next, the first light reflecting layer 41 is formed at least in the concavity 21H. Specifically, the patterned first light reflecting layer 41 formed from a multilayer film is formed, based on an existing method, from the concavity 21H over the first surface 21a of the substrate for manufacturing a light emitting element 11. In this way, it is possible to obtain the structure shown in FIG. 30. The first light reflecting layer 41 is formed from the inner portion of the concavity 21H to over the first surface 21a of the first compound semiconductor layer 21. The external shape of the first light reflecting layer 41 is a circle. Thereafter, the first electrode 31 is formed, based on an existing method, on the part of the first surface 21a of the first compound semiconductor layer 21 on which the first electrode 31 is to be formed. In this way, it is possible to obtain the light emitting element of Embodiment 3 having the structure shown in FIG. 31. The first electrode 31 and the first light reflecting layer 41 are separated, that is, an offset is provided, and the separation distance is within 1 mm, specifically, for example, the same value as Embodiment 1.

Step-360

Next, the light emitting element is separated by performing so-called element separation as necessary, and the exposed surface or the side surface of the layered structure body is covered with an insulating film formed from, for example, SiO₂. Thereafter, a terminal or the like for connecting the first electrode 31 and the pad electrode 33 to an external circuit or the like is formed based on an existing method, and the light emitting element of Embodiment 3 is completed by packaging or sealing. Cases of separating a light emitting element from another light emitting element, for example, may be performed along the arrow B in FIG. 31, or may be performed along the arrows C.

In the method of manufacturing a light emitting element of Embodiment 3, the substrate for manufacturing a light emitting element is removed in a state in which a mask layer for selective growth and a convexity are formed. Therefore, when removing the substrate for manufacturing a light emitting element, the mask layer and the convexity function as one type of polishing stopper, as a result it is possible to suppress removal variations in the substrate for manufacturing a light emitting element on the surface of the substrate for manufacturing a light emitting element, and further, the occurrence of thickness variations the first compound semiconductor layer, and since it is possible to achieve uniformity in the length of the resonator, it is possible to achieve stability in the characteristics of the obtained light emitting element.

Figure 32A:
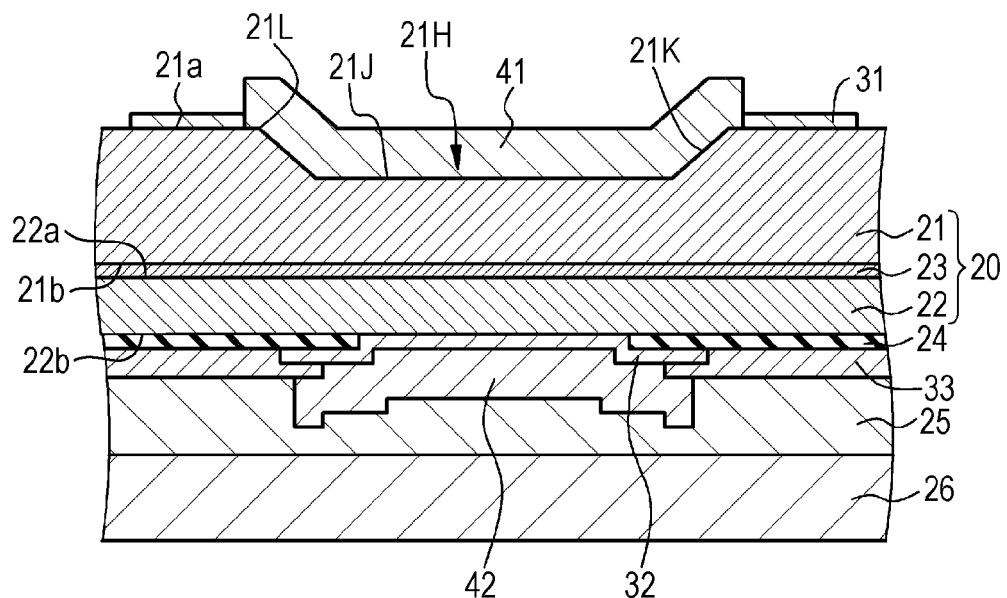
FIGS. 32A and 32B are both schematic partial end face views of a modification example of the light emitting element of Embodiment 3.
Figure 32B:
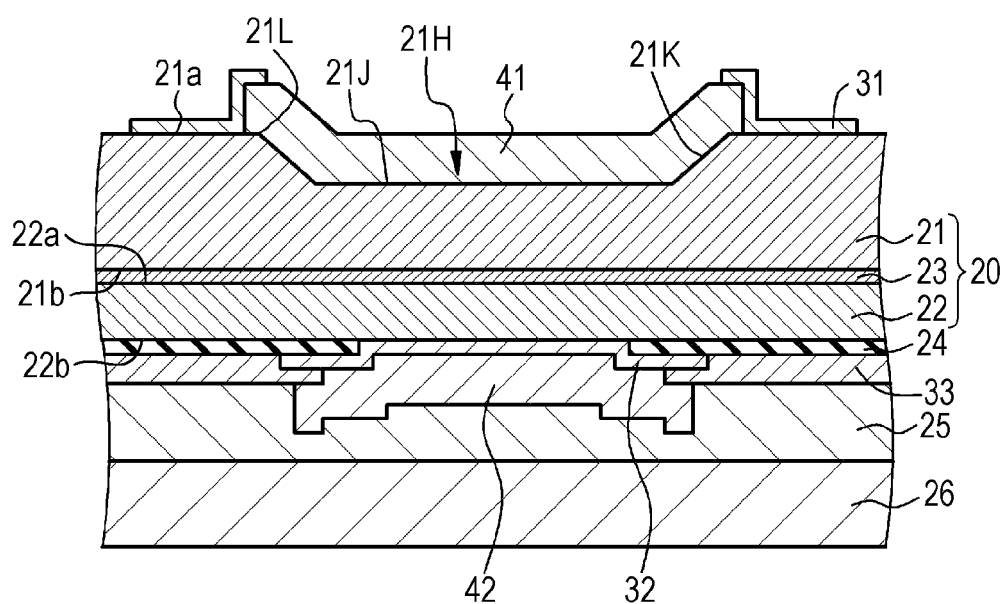
Figure 33A:
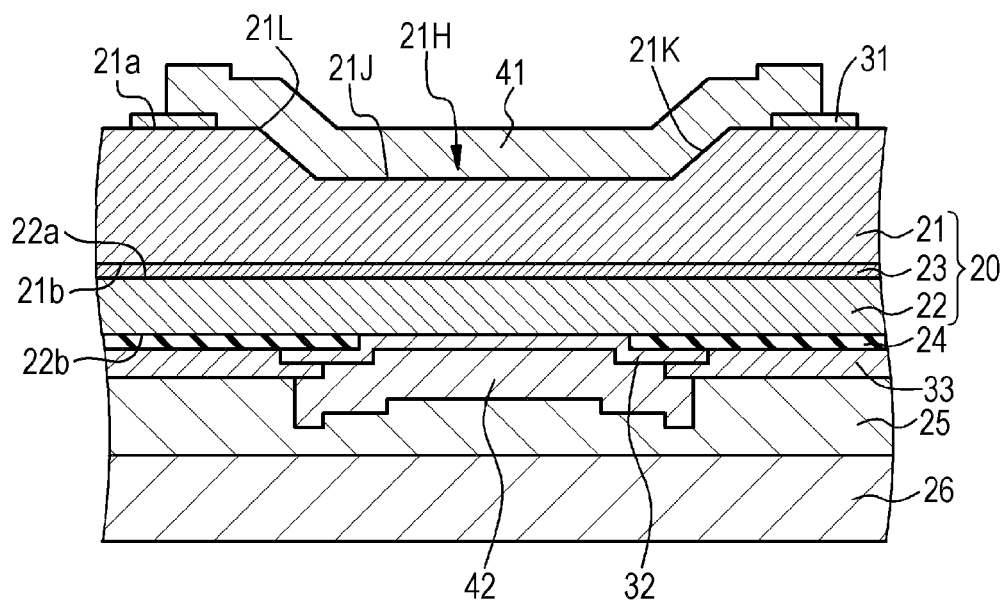
FIGS. 33A and 33B are both schematic partial end face views of a modification example of the light emitting element of Embodiment 3.
Figure 33B:
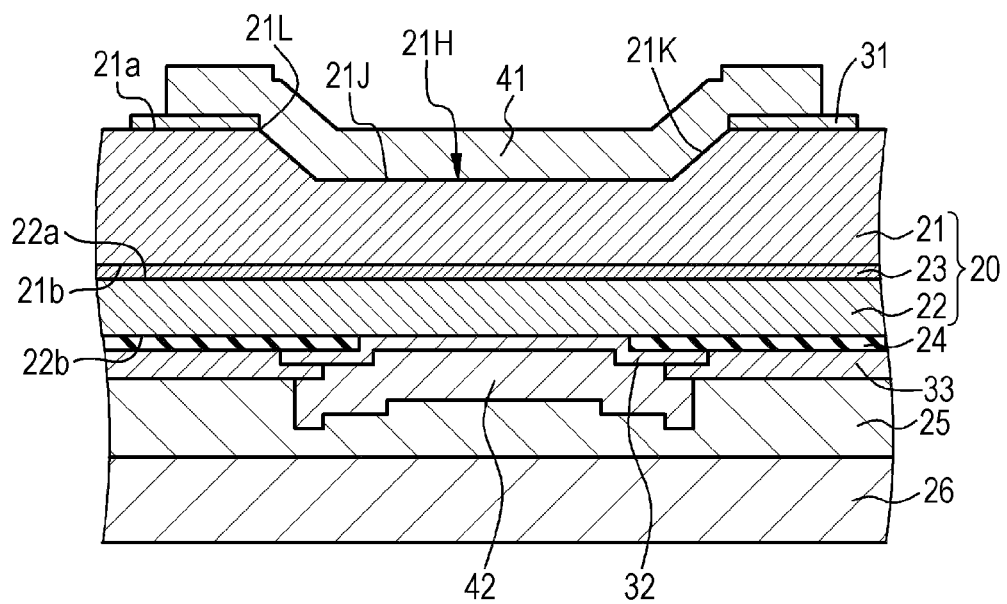

In the example of the light emitting element described above and shown in FIG. 31, the end portion of the first electrode 31 is separated from the first light reflecting layer 41. Meanwhile, in the example of the light emitting element shown in FIG. 32A, the end portion of the first electrode 31 contacts the first light reflecting layer 41. In the example of the light emitting element shown in FIG. 32B, the end portion of the first electrode 31 is formed over the edge portion of the first light reflecting layer 41. In the example of a light emitting element shown in FIGS. 33A and 33B, the first light reflecting layer 41 extends to on the first electrode 31. In the example of a light emitting element shown in FIG. 33A, the end portion of the first electrode 31 is separated from the opening portion 21L, and in the example of a light emitting element shown in FIG. 33B, the end portion of the first electrode 31 extends to the opening portion 21L. In FIGS. 32A, 32B, 33A, 33B, 34A, 34B, 35A, 35B, 36A, 36B, 37A, 37B, and 38, only the element forming region 13 (refer to FIG. 31) is depicted.

Between [Step-340] and [Step-350], a part of the first surface 21a of the first compound semiconductor layer 21 on which the first electrode 31 is to be formed may be etched before forming the first electrode 31 on the first surface 21a of the first compound semiconductor layer 21.

The part of the first surface 21a of the first compound semiconductor layer 21 on which the first electrode 31 is to be formed may be etched based on a reactive ion etching method (RIE method). Thereby, a rough surface region 21F is formed on the first surface 21a of the first compound semiconductor layer 21. Next, in [Step-350], the first electrode 31 is formed on at least the etched first surface 21a of the first compound semiconductor layer 21. Specifically, the first electrode 31 is formed, based on an existing method, on the etched first surface 21a of the first compound semiconductor layer 21 (on the rough surface region 21F).

In this way, it is possible to suppress a rise in the contact resistance between the first compound semiconductor layer and the first electrode by etching a part of the first surface of the first compound semiconductor layer on which the first electrode is to be formed based on a RIE method. Because the first surface of the first compound semiconductor layer in the interface between the first light reflecting layer and the first compound semiconductor layer is flat, it is possible to suppress scattering of light by the first surface of the first compound semiconductor layer to a minimal level. In the light emitting element of Embodiment 3, since the first light reflecting layer is formed on a concavity in which the side surface has a forward taper, it is possible to suppress disturbances in the formation of a multilayer film of a portion of the first light reflecting layer formed on the side surface of the concavity and in the vicinity of the side surface that is the bottom surface of the concavity.

Figure 34A:
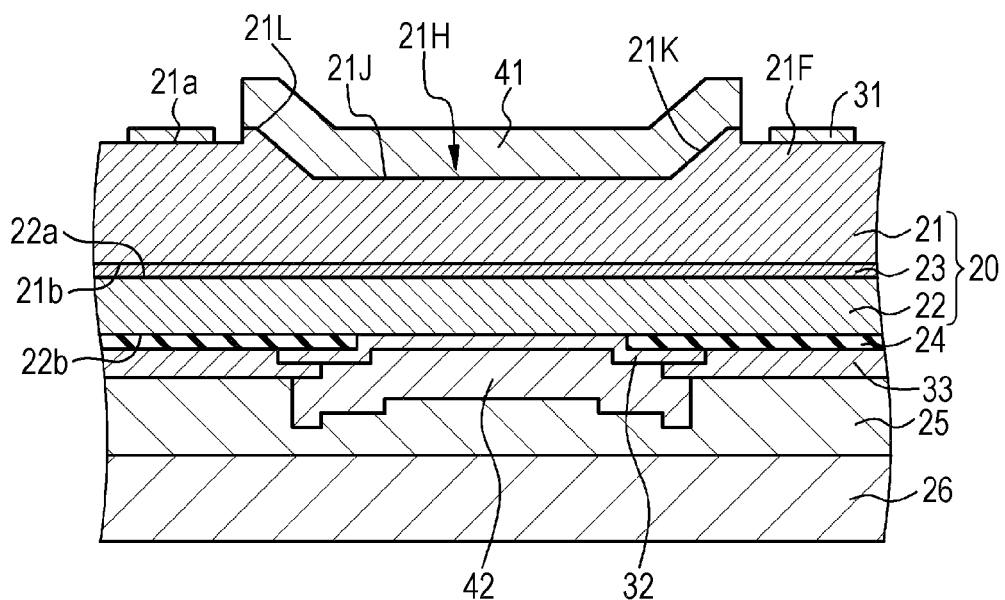
FIGS. 34A and 34B are both schematic partial end face views of a modification example of the light emitting element of Embodiment 3.
Figure 34B:
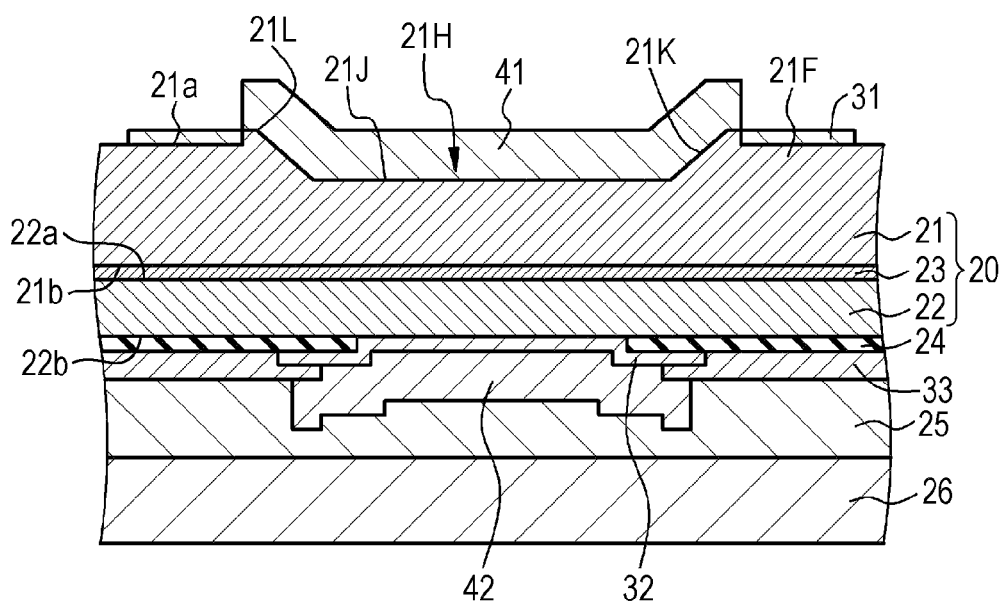
Figure 35A:
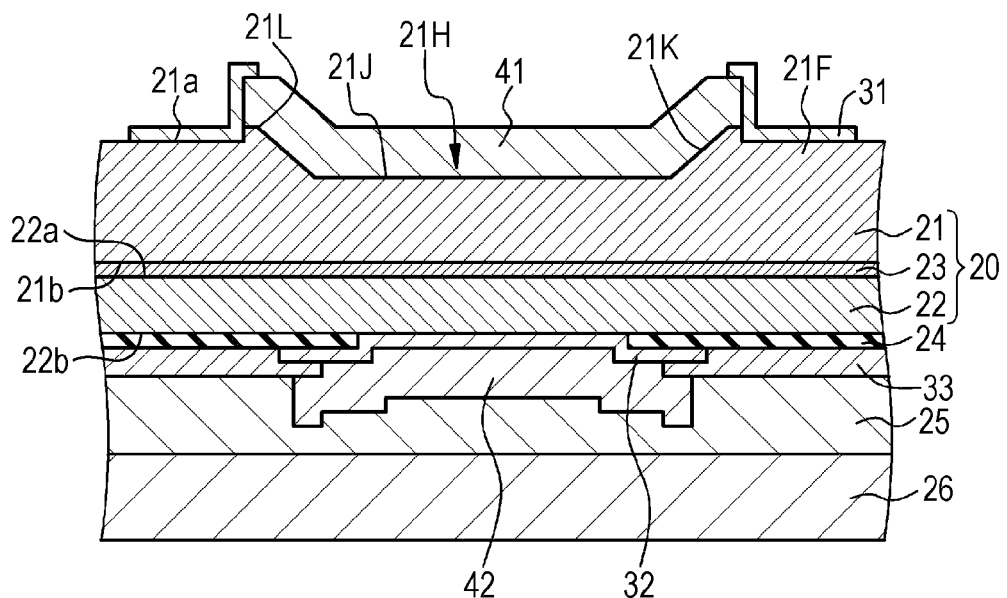
FIGS. 35A and 35B are both schematic partial end face views of a modification example of the light emitting element of Embodiment 3.
Figure 35B:
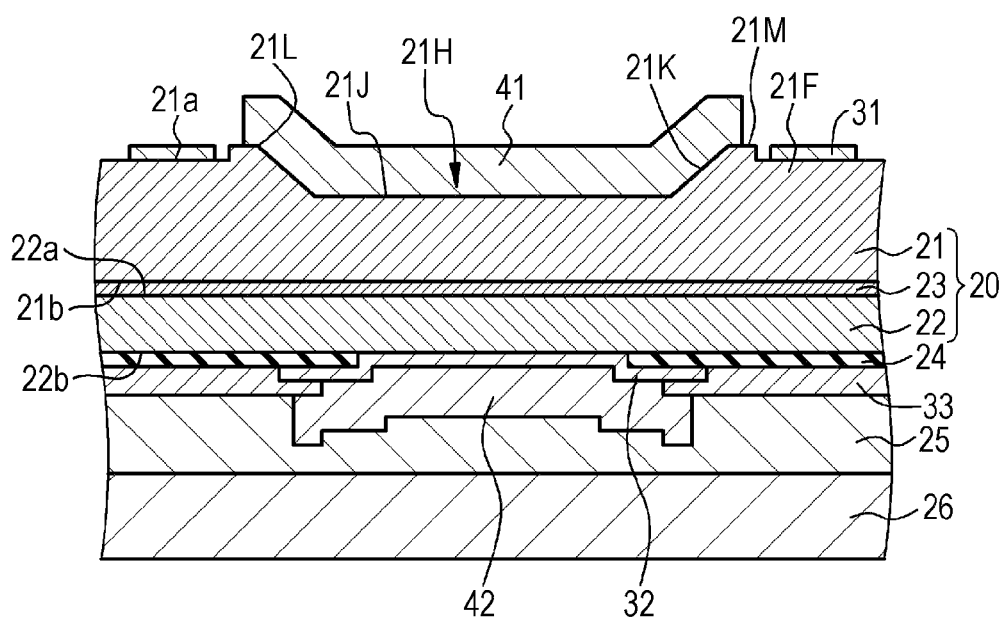
Figure 36A:
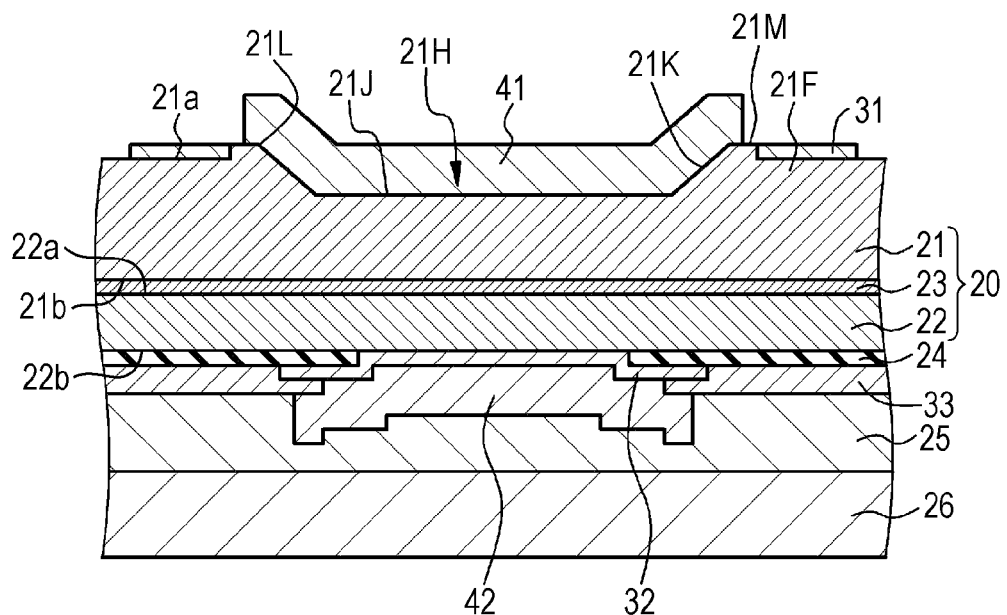
FIGS. 36A and 36B are both schematic partial end face views of a modification example of the light emitting element of Embodiment 3.
Figure 36B:
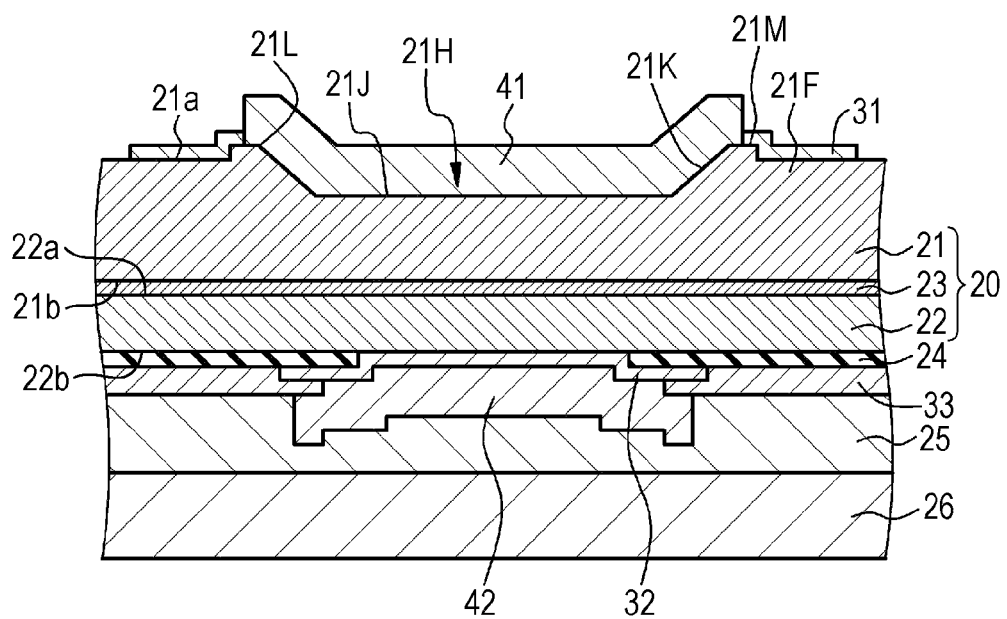

Although schematic partial end face views of the light emitting element obtained in this way are shown in FIGS. 34A, 34B, and 35A, in the example of the light emitting element shown in FIG. 34A, the end portion of the first electrode 31 is separated from the first light reflecting layer 41. Meanwhile, in the example of the light emitting element shown in FIG. 34B, the end portion of the first electrode 31 contacts the first light reflecting layer 41. In the example of the light emitting element shown in FIG. 35A, the end portion of the first electrode 31 is formed over the edge portion of the first light reflecting layer 41. Since the first electrode 31 is formed on the rough surface region 21F, it is possible to suppress a rise in the contact resistance between the first compound semiconductor layer 21 and the first electrode 31.

The value of the surface roughness Ra of the first surface 21a of the first compound semiconductor layer 21 in the interface between the first light reflecting layer 41 and the first surface 21a of the first compound semiconductor layer 21 is $3 \times 10^{-9}$ m or less, and the value of the surface roughness Ra of the first surface 21a of the first compound semiconductor layer 21 on which the first electrode 31 is to be formed exceeds the value of the surface roughness Ra of the first surface 21a of the first compound semiconductor layer 21 in the interface between the first light reflecting layer 41 and the first surface 21a of the first compound semiconductor layer 21.

$R_1/R_2 \leq 1$ is satisfied, where the contact resistance value of the first surface 21a of the first compound semiconductor layer 21 in the interface between the first light reflecting layer 41 and the first surface 21a of the first compound semiconductor layer 21 is $R_1$, and the contact resistance value in the first surface 21a of the first compound semiconductor layer 21 on which the first electrode 31 is to be formed is $R_2$.

As the procedure of removing the convexity, forming the first light reflecting layer, etching the first compound semiconductor layer, and forming the first electrode, it is possible to use the procedures below in addition to the above procedure.
(1) removal of the convexity, etching of the first compound semiconductor layer, formation of the first light reflecting layer, formation of the first electrode
(2) removal of the convexity, etching of the first compound semiconductor layer, formation of the first electrode, formation of the first light reflecting layer
(3) etching of the first compound semiconductor layer, removal of the convexity, formation of the first light reflecting layer, formation of the first electrode
(4) etching of the first compound semiconductor layer, removal of the convexity, formation of the first electrode, formation of the first light reflecting layer
(5) etching of the first compound semiconductor layer, formation of the first electrode, removal of the convexity, formation of the first light reflecting layer In the example of the light emitting element shown in FIGS. 34A, 34B, and 35A, although the first surface 21a of the first compound semiconductor layer 21 is etched so that the side surface of the first light reflecting layer 41 and the side surface of the rough surface region 21F of the first surface 21a of the first compound semiconductor layer 21 match, the side surface of the rough surface region 21F of the first surface 21a of the first compound semiconductor layer 21 may be formed further to the outside than the side surface of the first light reflecting layer 41, as shown in FIGS. 35B, 36A, 36B, and 37A. In the example of the light emitting element shown in FIGS. 35B and 36A, the end portion of the first electrode 31 is separated from the first light reflecting layer 41. In the example of a light emitting element shown in FIG. 35B, the end portion of the first electrode 31 is separated from the side surface of the rough surface region 21F, and in the example of a light emitting element shown in FIG. 36A, the end portion of the first electrode 31 contacts the side surface of the rough surface region 21F. Meanwhile, in the example of the light emitting element shown in FIG. 36B, the end portion of the first electrode 31 contacts the first light reflecting layer 41. In the example of the light emitting element shown in FIG. 37A, the end portion of the first electrode 31 is formed over the edge portion of the first light reflecting layer 41. In the light emitting element shown in FIGS. 35B, 36A, 36B, and 37A, a protrusion part 21M of the first compound semiconductor layer is present between the first light reflecting layer 41 and the first electrode 31.

Figure 37A:
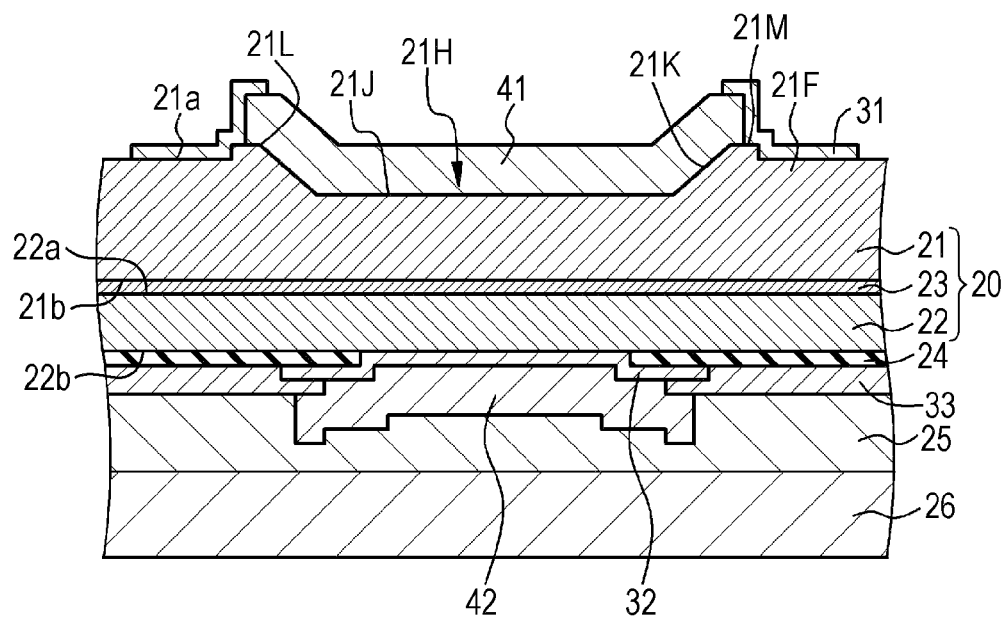
FIGS. 37A and 37B are both schematic partial end face views of a modification example of the light emitting element of Embodiment 3.
Figure 37B:
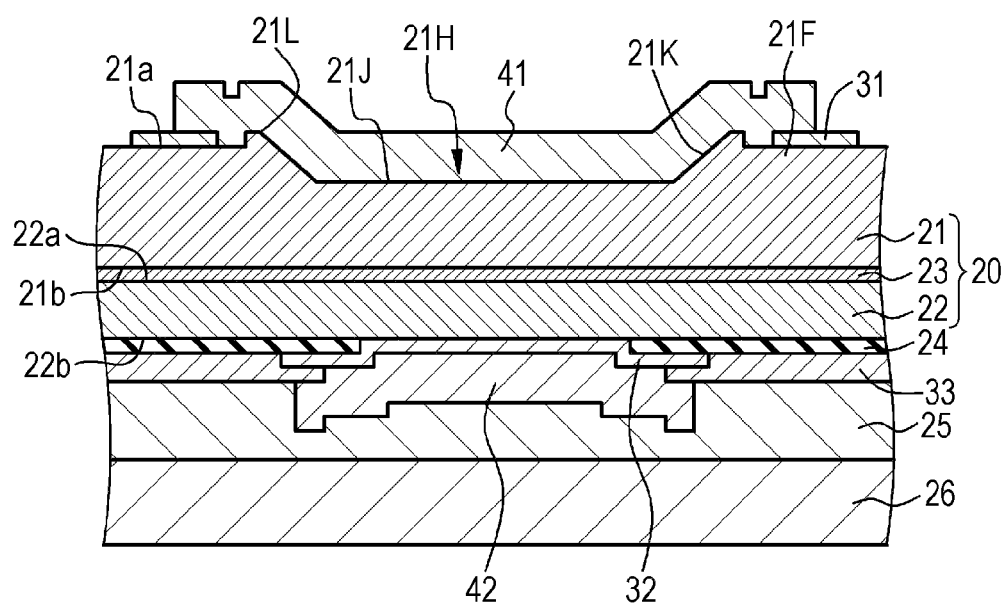
Figure 38:
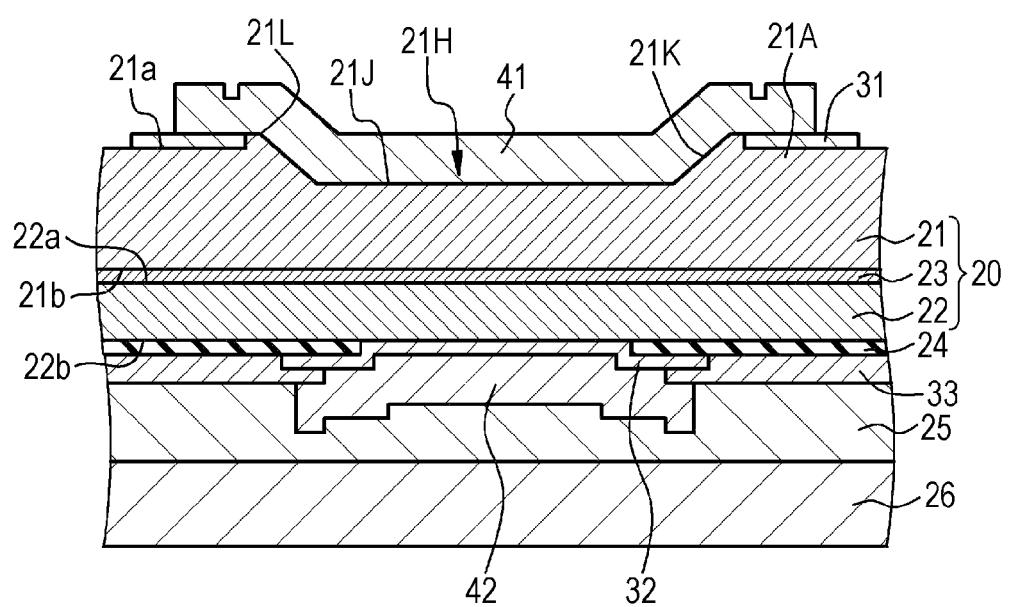
FIG. 38 is a schematic partial end face view of a modification example of the light emitting element of Embodiment 3.

In the example of a light emitting element shown in FIGS. 37B and 38, the first light reflecting layer 41 extends to on the first electrode 31. In the example of a light emitting element shown in FIG. 37B, the end portion of the first electrode 31 is separated from the side surface of the rough surface region 21F, and in the example of a light emitting element shown in FIG. 38, the end portion of the first electrode 31 contacts the side surface of the rough surface region 21F.

Embodiment 4

On the substrate for manufacturing a light emitting element 11 on which the first light reflecting layer 41 or the convexity 51 is formed, when the first compound semiconductor layer 21 is formed using horizontal growth using a method in which epitaxial growth is caused in the horizontal direction, such as an ELO method, if first compound semiconductor layers 21 that are epitaxially grown from the edge portion of the first light reflecting layer 41 or the convexity 51 towards the center portion of the first light reflecting layer 41 or the convexity 51 meet, there are cases in which numerous crystal defects occur in the meeting part.

Figure 39:
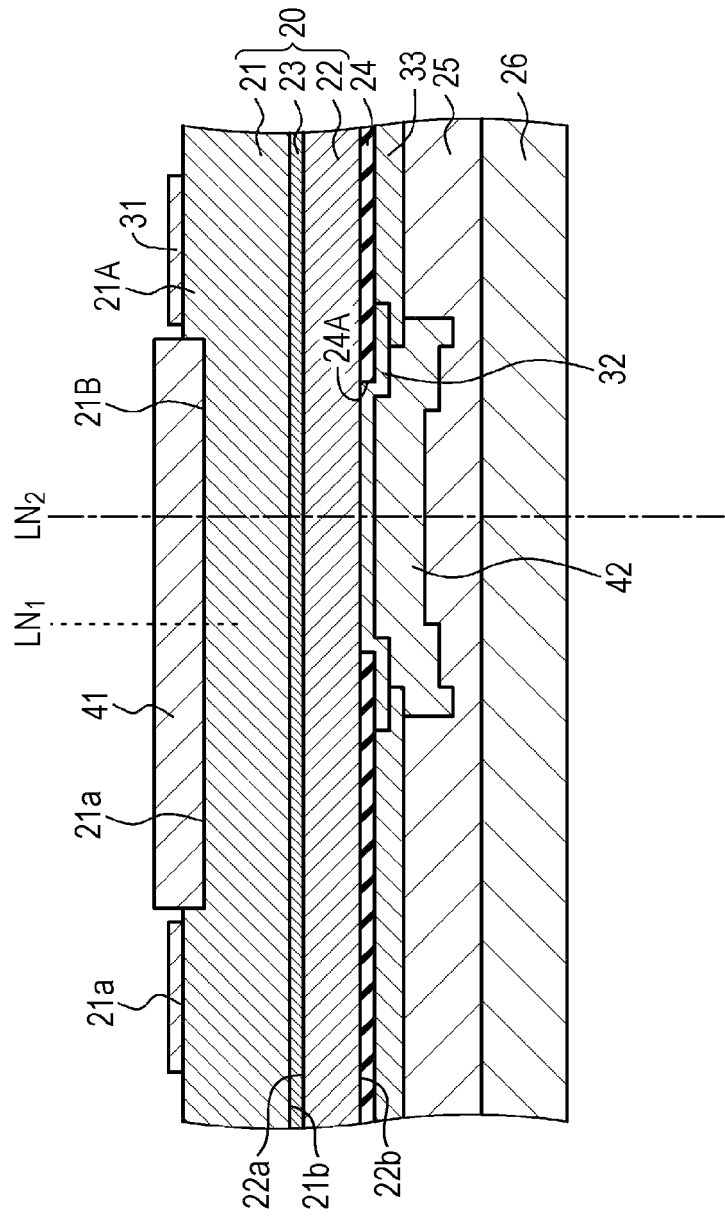
FIG. 39 is a schematic partial end face view of a light emitting element of Embodiment 4.
Figure 40:
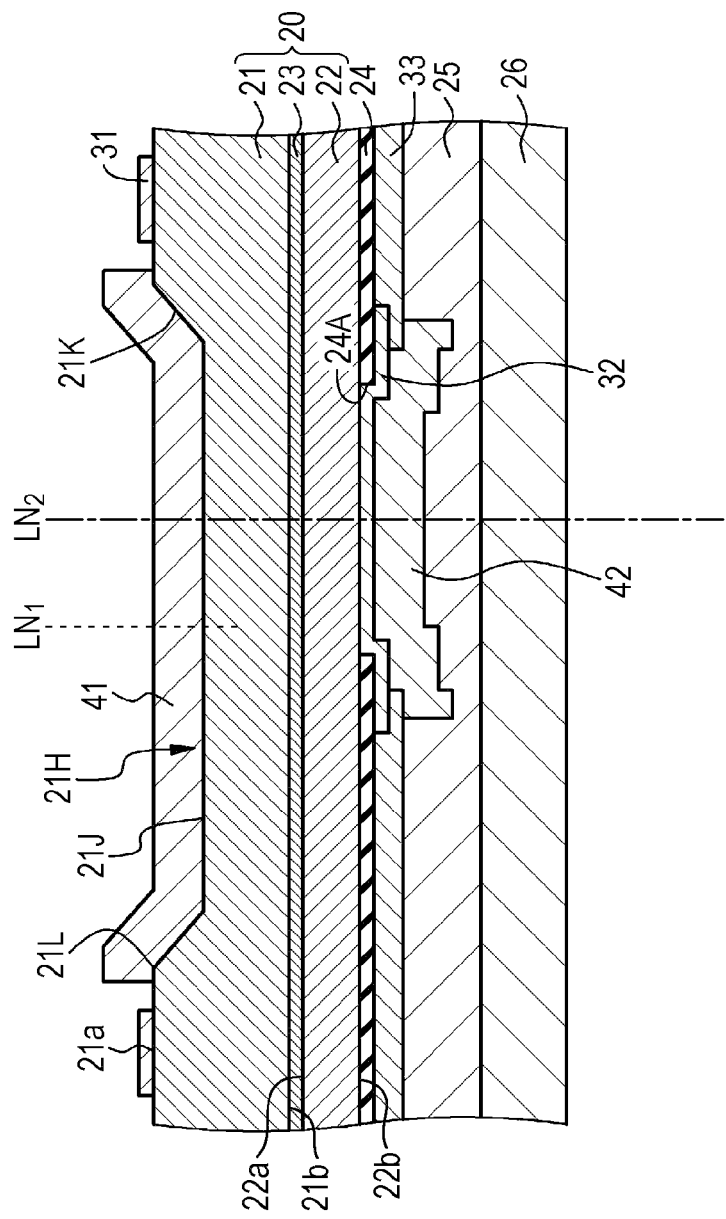
FIG. 40 is a schematic partial end face view of a modification example of the light emitting element of Embodiment 4.

In the method of manufacturing a light emitting element of Embodiment 4, the area centroid of the second light reflecting layer 42 is not present on the normal line $LN_1$ with respect to the first light reflecting layer 41 passing through area centroid of the first light reflecting layer 41, as shown in FIG. 39 by the modification example of the light emitting element shown in FIG. 23, and in FIG. 40 by the modification example of the light emitting element shown in FIG. 31. Alternatively, the area centroid of the active layer 23 is not present on the normal line $LN_1$ with respect to the first light reflecting layer 41 that passes through the area centroid of the first light reflecting layer 41. The normal line with respect to the second light reflecting layer 42 that passes through the area centroid of the second light reflecting layer 42 matches the normal line with respect to the active layer 23 that passes through the area centroid of the active layer 23, and this line is indicated by "$LN_2$". In FIGS. 39 and 40, only the element forming region is shown. Needless to say, it is possible to adopt the configuration and structure of a light emitting element of Embodiment 4 with respect to the light emitting element shown in FIGS. 24A, 24B, 32A, 32B, 33A, 33B, 34A, 34B, 35A, 35B, 36A, 36B, 37A, 37B, and 38. Other than the above points, since configuration and structure of the light emitting element of Embodiment 4 are the same as the configuration and structure of the light emitting element of Embodiments 2 and 3, a detailed description will not be made.

$S_3 > S_4$ is satisfied, where the area of a part of the first light reflecting layer 41 that contacts the first surface 21a of the first compound semiconductor layer 21 (part of the first light reflecting layer 41 opposing the second light reflecting layer 42) that configures the element region is $S_3$, and the area of a part of the second light reflecting layer 42 opposing the second surface 22b of the second compound semiconductor layer 22 (part of the second light reflecting layer 42 opposing the first light reflecting layer 41) that configures the element region is $S_4$.

In Embodiment 4, the meeting part in which numerous crystal defects are present (specifically, positioning on the normal line $LN_1$ or in the vicinity thereof) is not positioned in the center portion of the element region, and the occurrence of a negative influence on the characteristics of the light emitting element is eliminated, or the negative influence on the characteristics of the light emitting element is reduced.

Above, although the present disclosure has been described based on preferred examples, the present disclosure is not limited to these examples. The configuration and structure of the light emitting element described in the examples are examples and may be changed, as appropriate. It is also possible to change the method of manufacturing a light emitting element of the examples, as appropriate. It is possible to make a surface-emitting laser element that emits light from the top surface of the second compound semiconductor layer via the second light reflecting layer by suitably selecting the bonding layer and support substrate, according to the circumstances. It is possible to use a surface-emitting laser element that emits light from the top surface of the second compound semiconductor layer via the second light reflecting layer, also by making the light emitting element obtained in the steps up to [Step-230] into a completed product. Alternatively, in [Step-150], [Step-250], and [Step-350], by removing the support substrate after the first light reflecting layer and the first electrode are formed, it is possible for the surface-emitting laser element that emits light from the top surface of the second compound semiconductor layer via the second light reflecting layer to be completed, or after [Step-150], [Step-250] and [Step-350], by fixing the first light reflecting layer to the second support substrate, and thereafter the second light reflecting layer being exposed by removing the support substrate, it is possible for the surface-emitting laser element that emits light from the top surface of the second compound semiconductor layer via the second light reflecting layer to be completed.

Figure 41:
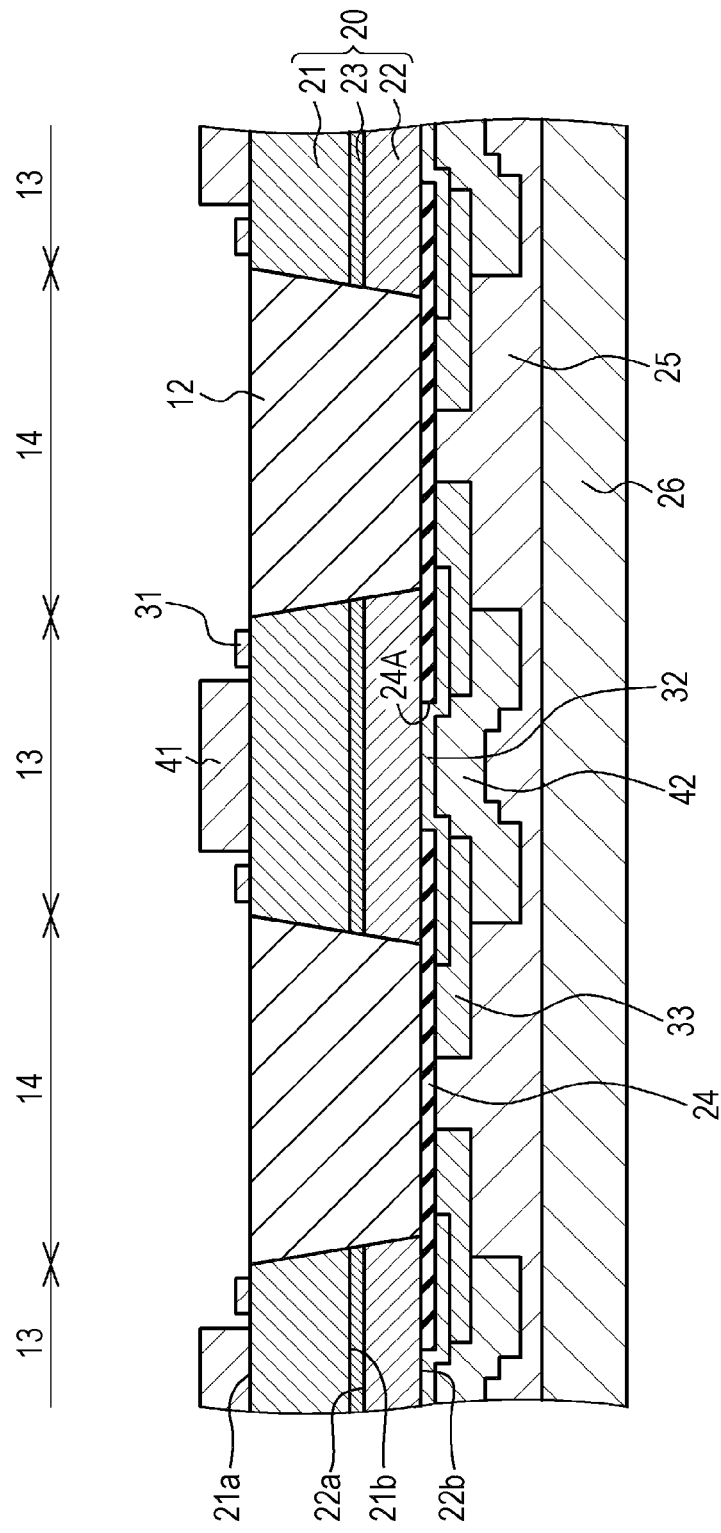
FIG. 41 is a schematic partial end face view of the modification example of the light emitting element of Embodiment 1.
Figure 42:
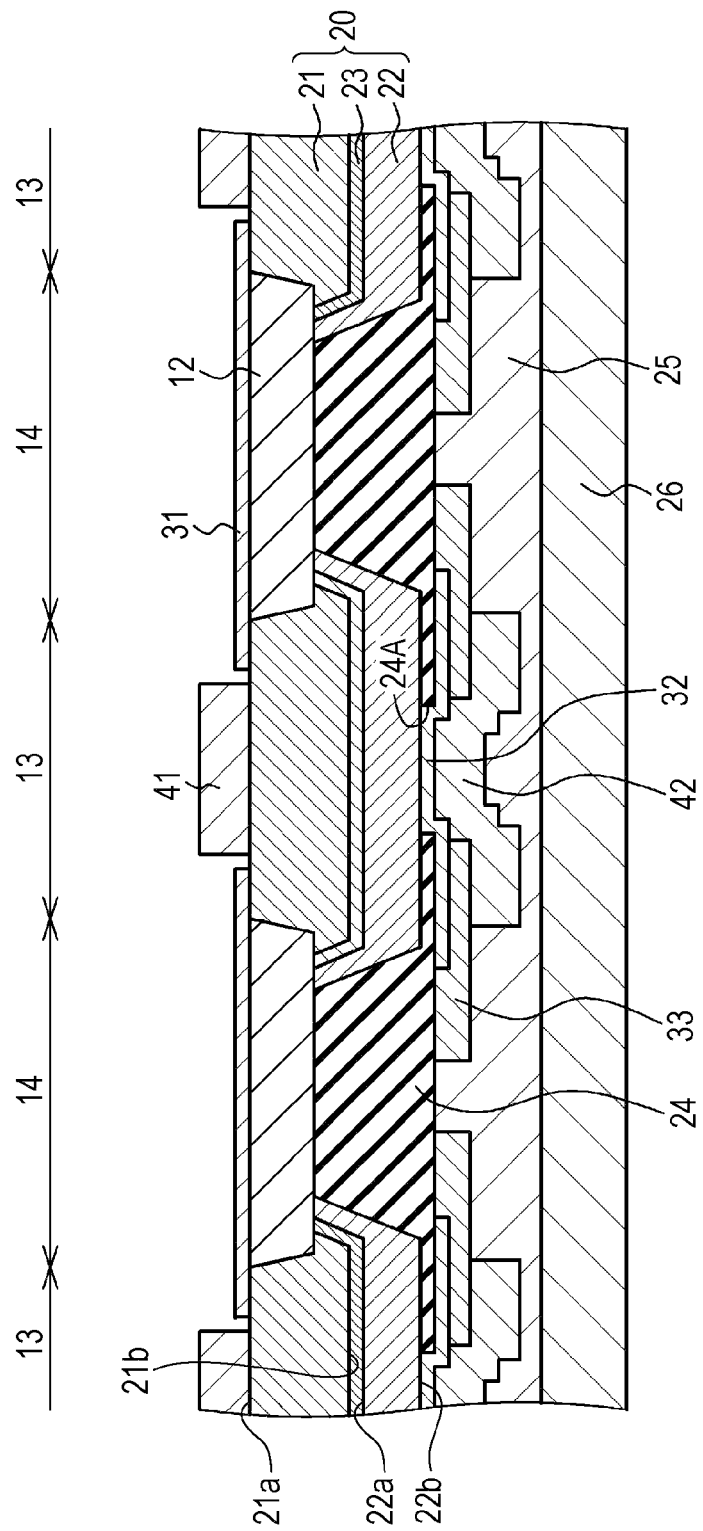
FIG. 42 is a schematic partial end face view of the modification example of the light emitting element of Embodiment 1.

In the examples, the thickness of the mask layer 12 may be thinner than the layered structure body 20, may be the same thickness as the layered structure body, may be substantially the same thickness as the layered structure body, or may be thicker than the layered structure body. Although FIG. 41 shows a modification example of the light emitting element of Embodiment 1 shown in FIG. 6, in the modification example, the thickness of the mask layer 12 is the same thickness as the layered structure body 20. FIG. 42 shows an example in which the light emitting elements of Embodiment 1 shown FIG. 6 are arranged in an array without performing element separation. In the modification example, the first electrode 31 is shared by a plurality of light emitting elements. Needless to say, it is possible to apply these modification examples to the other examples.

Figure 43:
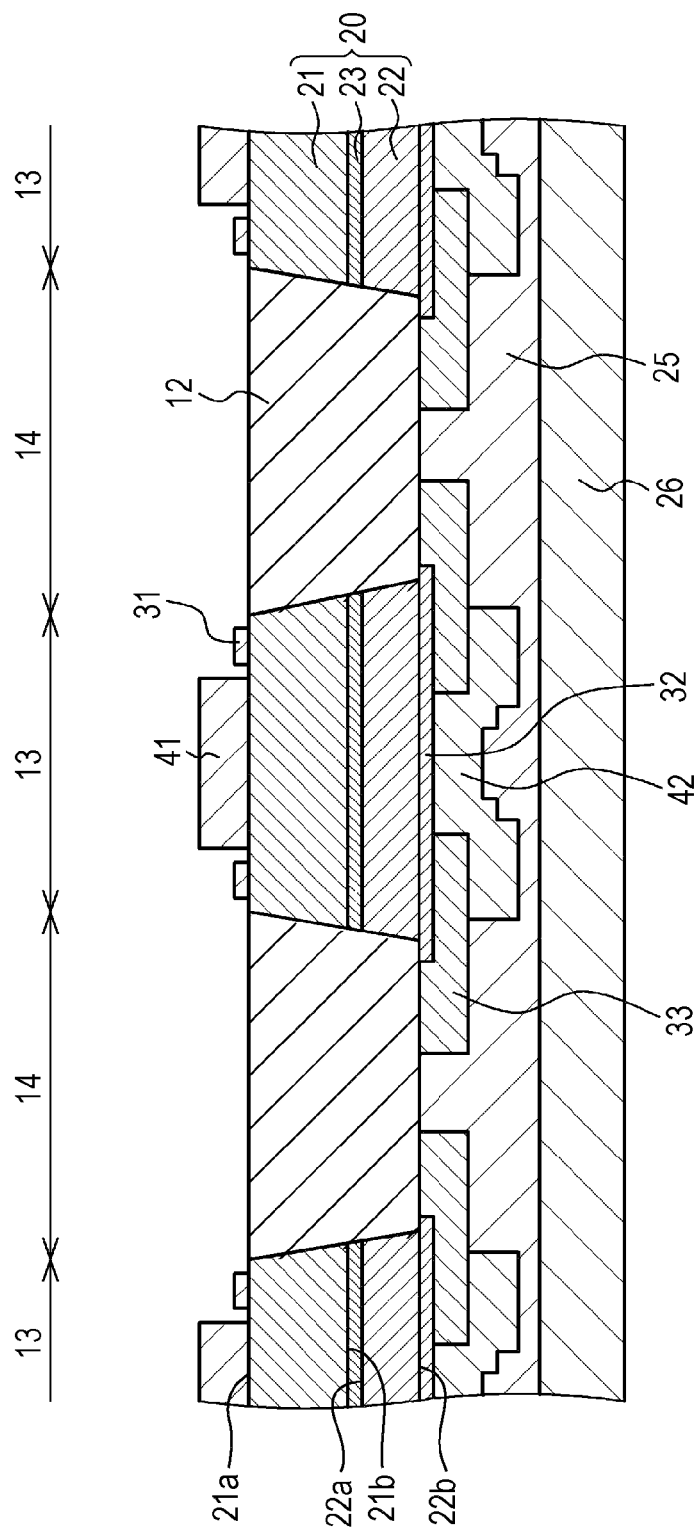
FIG. 43 is a schematic partial end face view of another modification example of the light emitting element of Embodiment 1.
Figure 44:
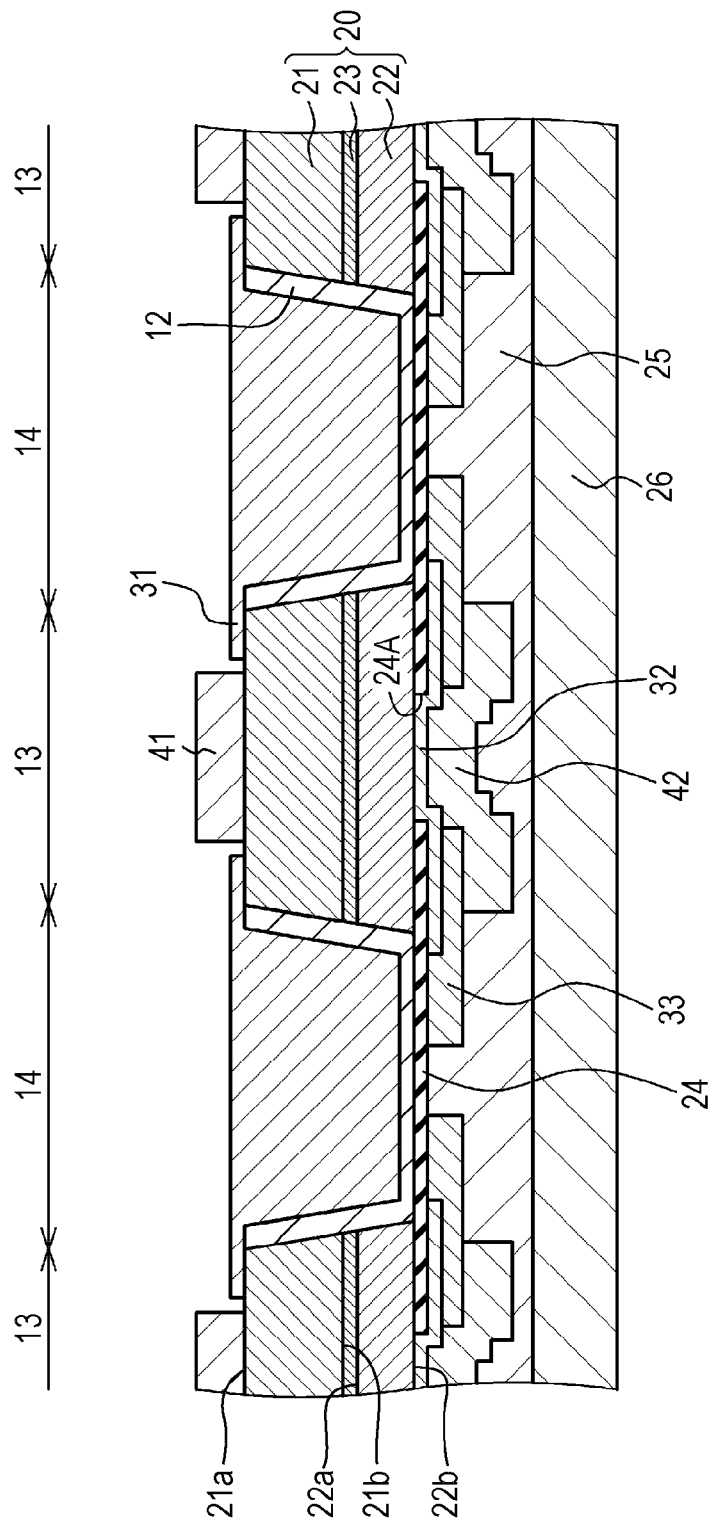
FIG. 44 is a schematic partial end face view of still another modification example of the light emitting element of Embodiment 1.

Alternatively, as the modification example of the light emitting element shown in FIG. 41, the entire mask layer 12 may serve a role as the current constriction layer 24 as shown in FIG. 43. By not forming the current constriction layer 24, it is possible to achieve simplification of the process for manufacturing the light emitting element. As a modification example of the light emitting element shown in FIGS. 41 and 43, as shown in FIGS. 44 and 45, a portion of the mask layer 12 may be removed, and a part from which the mask layer 12 is removed may be embedded in the first electrode 31. In the case of a thick mask layer 12, heat generated in the active layer (light emitting layer) 23 is easily accumulated in the layered structure body 20. Nevertheless, it is possible to increase the heat dissipation properties, by embedding a part from which the mask layer 12 is removed in the first electrode 31. Needless to say, it is possible to apply these modification examples to the other embodiments.

The present disclosure may take the configurations as below.

[A01] Method of Manufacturing Light Emitting Element First Embodiment

A method of manufacturing a light emitting element including, sequentially (a) forming a mask layer for selective growth formed from a material different from a material that configures a first compound semiconductor layer on a region outside an element forming region on a substrate for manufacturing a light emitting element; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the element forming region; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer and the mask layer; and (f) forming a first light reflecting layer formed from a multilayer film and a first electrode on the first surface of the first compound semiconductor layer.

[A02] The method of manufacturing a light emitting element according to [A01], in which exposure of the first surface of the first compound semiconductor layer and the mask layer in (e) is performed based on a chemical/mechanical polishing method.

[A03] The method of manufacturing a light emitting element according to [A01] or [A02], in which a step portion is formed on the first compound semiconductor layer is formed by etching a part of the first surface of the first compound semiconductor layer before the first electrode is formed on the first surface of the first compound semiconductor layer in (f), and the first light reflecting layer is formed on at least an inside of the step portion, and the first electrode is formed on at least the outside of the step portion in (f).

[A04] The method of manufacturing a light emitting element according to [A03], in which the step portion is configured from a simple closed curve.

[A05] The method of manufacturing a light emitting element according to [A03] or [A04], in which the first light reflecting layer is formed on a convexity of the first surface of the first compound semiconductor layer, and the first electrode is formed on a concavity of the first surface of the first compound semiconductor layer.

[A06] The method of manufacturing a light emitting element according to [A03] or [A04], in which the first light reflecting layer is formed on the concavity of the first surface of the first compound semiconductor layer, and the first electrode is formed on the convexity of the first surface of the first compound semiconductor layer.

[A07] The method of manufacturing a light emitting element according to any one of [A03] to [A06], in which the height of the step portion is less than the thickness of the first compound semiconductor layer.

[A08] The method of manufacturing a light emitting element according to any one of [A03] to [A06], in which the height of the step portion is $1\times10^{-8}$ m or more and $1\times10^5$ m or less.

[A09] The method of manufacturing a light emitting element according to any one of [A03] to [A08], in which a value of the surface roughness Ra of the first surface of the first compound semiconductor layer on an inside of the step portion is $3\times10^{-9}$ m or less, and the value of the surface roughness Ra of the first surface of the first compound semiconductor layer on the outside of the step portion exceeds the value of the surface roughness Ra of the first surface of the first compound semiconductor layer on the inside of the step portion.

[A10] The method of manufacturing a light emitting element according to any one of [A03] to [A09], in which $R_2/R_1 \leq 1$ is satisfied, where the contact resistance value of the first surface of the first compound semiconductor layer inside the step portion is $R_1$, and the contact resistance value of the first surface of the first compound semiconductor layer outside the step portion is $R_2$.

[A11] The method of manufacturing a light emitting element according to [A01] or [A02], in which in (f), a rough surface region is formed on the first compound semiconductor layer by etching a part of the first surface of the first compound semiconductor layer on which the first electrode is to be formed in (f), a first light reflecting layer is formed on at least a flat region that is a part of the first compound semiconductor layer surrounded by the rough surface region, and a first electrode is formed on at least the rough surface region.

[A12] The method of manufacturing a light emitting element according to [A11] in which the rough surface region surrounds the flat region.

[A13] The method of manufacturing a light emitting element according to [A11] or [A12], in which the value of the surface roughness Ra of the flat region is $3\times10^{-9}$ m or less, and the value of the surface roughness Ra of the rough surface region exceeds the value of the surface roughness of the flat region.

[A14] The method of manufacturing a light emitting element according to any one of [A11] to [A13], in which $R_2/R_1 \leq 1$ is satisfied, when the contact resistance value in the flat region is $R_1$ and the contact resistance value in the rough surface region is $R_2$.

[A15] The method of manufacturing a light emitting element according to [A01] or [A02], in which a part of the first surface of the first compound semiconductor layer on which the first electrode is to be formed is etched before the first electrode is formed on the first surface of the first compound semiconductor layer in (f).

[A16] The method of manufacturing a light emitting element according to [A15], in which a part of the first surface of the first compound semiconductor layer on which the first electrode is to be formed is etched based on a reactive ion etching method.

[A17] A method of manufacturing a light emitting element according to any one of [A01] to [A16] in which the first light reflecting layer and the first electrode are in contact.

[A18] The method of manufacturing a light emitting element according to any one of [A01] and [A16] in which the first light reflecting layer and the first electrode are separated, and the separation distance is within 1 mm.

[A19] The method of manufacturing a light emitting element according to any one of [A01] to [A18], in which the distance from the first light reflecting layer to the second light reflecting layer is 0.15 µm or more and 50 µm or less.

[A20] The method of manufacturing a light emitting element according to any one of [A01] to [A19], in which light generated in the active layer is emitted to the outside via the first light reflecting layer.

[A21] The method of manufacturing a light emitting element according [A20], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[A22] The method of manufacturing a light emitting element according to any one of [A01] to [A21], in which the first electrode is formed from a metal or an alloy.

[A23] The method of manufacturing a light emitting element according to any one of [A01] to [A22], in which the second electrode is formed from a transparent conductive material.

[A24] The method of manufacturing a light emitting element according to any one of [A01] to [A23], in which the light emitting element is formed from a surface-emitting laser element.

[B01] Method of Manufacturing Light Emitting Element Second Embodiment

A method of manufacturing a light emitting element including, sequentially (a) forming a mask layer for selective growth formed from a material different from a material that configures a first compound semiconductor layer on a region outside an element forming region on a substrate for manufacturing a light emitting element, and forming a first light reflecting layer formed from a multilayer film, which has a convex shape on the element forming region;

(b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element including the first light reflecting layer; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer, the mask layer, and the first light reflecting layer; and (f) forming a first electrode on at least the first surface of the first compound semiconductor layer.

[B02] The method of manufacturing a light emitting element according to [B01], in which exposure of the first surface of the first compound semiconductor layer, the mask layer, and the first light reflecting layer in (e) is performed based on a chemical/mechanical polishing method.

[B03] The method of manufacturing a light emitting element according to [B01] or [B02], in which a part of the first surface of the first compound semiconductor layer on which the first electrode is to be formed is etched, before the first electrode is formed on the first surface of the first compound semiconductor layer in (f).

[B04] The method of manufacturing a light emitting element according to [B03], in which a part of the first surface of the first compound semiconductor layer on which the first electrode is to be formed is etched based on a reactive ion etching method.

[B05] The method of manufacturing a light emitting element according to any one of [B01] to [B04], in which a value of the surface roughness Ra of a part of the first surface of the first compound semiconductor layer that contacts the first light reflecting layer is $3 \times 10^{-9}$ m or less, and the value of the surface roughness Ra of a part of the first surface of the first compound semiconductor layer on which the first electrode is formed exceeds the value of the surface roughness Ra of a part of the first surface of the first compound semiconductor layer that contacts the first light reflecting layer.

[B06] The method of manufacturing a light emitting element according to any one of [B01] to [B05], in which $R_2/R_1 \leq 1$ is satisfied, where the contact resistance value of a part of the first surface of the first compound semiconductor layer that contacts the first light reflecting layer is $R_1$, and the contact resistance value of a part of the first surface of the first compound semiconductor layer on which the first electrode is formed is $R_2$.

[B07] The method of manufacturing a light emitting element according to any one of [B01] to [B06], in which an area centroid of the second light reflecting layer is not present on a normal line with respect to the first light reflecting layer that passes through the area centroid of the first light reflecting layer.

[B08] The method of manufacturing a light emitting element according to any one of [B01] to [B07], in which an area centroid of the active layer is not present on a normal line with respect to the first light reflecting layer that passes through the area centroid of the first light reflecting layer.

[B09] The method of manufacturing a light emitting element according to any one of [B01] to [B08] in which the first light reflecting layer and the first electrode are in contact.

[B10] The method of manufacturing a light emitting element according to any one of [B01] to [B08] in which the first light reflecting layer and the first electrode are separated, and the separation distance is within 1 mm.

[B11] The method of manufacturing a light emitting element according to any one of [B01] and [B10], in which the distance from the first light reflecting layer to the second light reflecting layer is 0.15 μm or more and 50 μm or less.

[B12] The method of manufacturing a light emitting element according to any one of [B01] to [B12], in which light generated in the active layer is emitted to the outside via the first light reflecting layer.

[B13] The method of manufacturing a light emitting element according [B12], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[B14] The method of manufacturing a light emitting element according to any one of [B01] to [B13], in which the first electrode is formed from a metal or an alloy.

[B15] The method of manufacturing a light emitting element according to any one of [B01] to [B14], in which the second electrode is formed from a transparent conductive material.

[B16] The method of manufacturing a light emitting element according to any one of [B01] to [B15], in which the light emitting element is formed from a surface-emitting laser element.

[C01] Method Of Manufacturing Light Emitting Element Third Embodiment

A method of manufacturing a light emitting element including, sequentially (a) forming a mask layer formed from a material different from a material that configures a first compound semiconductor layer on a region outside an element forming region on a substrate for manufacturing a light emitting element, and forming a convexity formed from a material different to the material that configures the first compound semiconductor layer on the element forming region; (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element that includes the convexity; (c) forming, on the second surface of the second compound semiconductor layer, a second electrode and a second light reflecting layer formed from a multilayer film; (d) fixing the second light reflecting layer to a support substrate; (e) removing the substrate for manufacturing a light emitting element, and exposing the first surface of the first compound semiconductor layer, the mask layer, and the convexity; and (f) removing the convexity, forming a first light reflecting layer formed from a multilayer film on at least a part of the first surface on the first compound semiconductor layer from which the convexity is removed, and forming a first electrode on at least a part of the first surface of the first compound semiconductor layer on which the first electrode is to be formed.

[C02] The method of manufacturing a light emitting element according to [C01], in which exposure of the first surface of the first compound semiconductor layer, the mask layer, and the convexity in (e) is performed based on a chemical/mechanical polishing method.

[C03] The method of manufacturing a light emitting element according to [C01] or [C02], in which a part of the first surface of the first compound semiconductor layer on which the first electrode is to be formed is etched, before the first electrode is formed on the first surface of the first compound semiconductor layer in (f).

[C04] The method of manufacturing a light emitting element according to [C03], in which a part of the first surface of the first compound semiconductor layer on which the first electrode is to be formed is etched based on a reactive ion etching method.

[C05] The method of manufacturing a light emitting element according to any one of [C01] to [C04], in which the convexity formed in (a) has a top surface smaller than a bottom surface.

[C06] The method of manufacturing a light emitting element according to any one of [C01] to [C05], in which a value of the surface roughness Ra of a part of the first surface of the first compound semiconductor layer that contacts the first light reflecting layer is $3\times10^{-9}$ m or less, and the value of the surface roughness Ra of a part of the first surface of the first compound semiconductor layer on which the first electrode is formed exceeds the value of the surface roughness Ra of a part of the first surface of the first compound semiconductor layer that contacts the first light reflecting layer.

[C07] The method of manufacturing a light emitting element according to any one of [C01] to [C06], in which $R_2/R_1 \le 1$ is satisfied, where the contact resistance value of a part of the first surface of the first compound semiconductor layer that contacts the first light reflecting layer is $R_1$, and the contact resistance value of a part of the first surface of the first compound semiconductor layer on which the first electrode is formed is $R_2$.

[C08] The method of manufacturing a light emitting element according to any one of [C01] to [C07], in which an area centroid of the second light reflecting layer is not present on a normal line with respect to the first light reflecting layer that passes through the area centroid of the first light reflecting layer.

[C09] The method of manufacturing a light emitting element according to [C01] or [C08], in which an area centroid of the active layer is not present on a normal line with respect to the first light reflecting layer that passes through the area centroid of the first light reflecting layer.

[C10] The method of manufacturing a light emitting element according to any one of [C01] to [C09], in which the first light reflecting layer and the first electrode are in contact.

[C11] The method of manufacturing a light emitting element according to any one of [C01] to [C09] in which the first light reflecting layer and the first electrode are separated, and the separation distance is within 1 mm.

[C12] The method of manufacturing a light emitting element according to [C11], in which a protrusion part of the first compound semiconductor layer is present between the first light reflecting layer and the first electrode.

[C13] The light emitting element according to any one of [C01] to [C12], in which the distance from the first light reflecting layer to the second light reflecting layer is 0.15 μm or more and 50 μm or less.

[C14] The method of manufacturing a light emitting element according to any one of [C01] to [C13], in which light generated in the active layer is emitted to the outside via the first light reflecting layer.

[C15] The method of manufacturing a light emitting element according [C14], in which $S_1 > S_2$ is satisfied, where the area of a part of the first light reflecting layer that contacts the first surface of the first compound semiconductor layer is $S_1$, and the area of a part of the second light reflecting layer opposing the second surface of the second compound semiconductor layer is $S_2$.

[C16] The method of manufacturing a light emitting element according to any one of [C01] to [C15], in which the first electrode is formed from a metal or an alloy.

[C17] The method of manufacturing a light emitting element according to any one of [C01] to [C16], in which the second electrode is formed from a transparent conductive material.

[C18] The method of manufacturing a light emitting element according to any one of [C01] to [C17] in which the light emitting element is formed from a surface-emitting laser element.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a light emitting element comprising, sequentially:
    (a) forming a mask layer for selective growth formed from a material different from a material that configures a first compound semiconductor layer on a region outside an element forming region on a substrate for manufacturing a light emitting element, and forming a convexity formed from a material different to the material that configures the first compound semiconductor layer on the element forming region;
    (b) forming a layered structure body by layering a first compound semiconductor layer formed from a GaN-based compound semiconductor, which has a first surface and a second surface opposing the first surface, an active layer formed from a GaN-based compound semiconductor, which contacts the second surface of the first compound semiconductor layer, and a second compound semiconductor layer formed from a GaN-based compound semiconductor, which has a first surface and a second surface opposing the first surface, and in which the first surface contacts the active layer on the substrate for manufacturing a light emitting element that includes the convexity;
    (c) forming, on the second surface of the second compound semiconductor layer, a second electrode and a second light reflecting layer formed from a multilayer film;
    (d) fixing the second light reflecting layer to a support substrate;
    (e) removing the substrate for manufacturing a light emitting element, and exposing the first surface of the first compound semiconductor layer, the mask layer, and the convexity; and
    (f) removing the convexity, forming a first light reflecting layer formed from a multilayer film on at least a part of the first surface on the first compound semiconductor layer from which the convexity is removed, and forming a first electrode on a part of the first surface of the first compound semiconductor layer on which at least the first electrode is to be formed.

2. The method of manufacturing a light emitting element according to claim 1,
    wherein exposure of the first surface of the first compound semiconductor layer, the mask layer, and the convexity in (e) is performed based on a chemical/mechanical polishing method.

3. The method of manufacturing a light emitting element according to claim 1,
    wherein a part of the first surface of the first compound semiconductor layer on which the first electrode is to be formed is etched before the first electrode is formed on the first surface of the first compound semiconductor layer in (f).

4. The method of manufacturing a light emitting element according to claim 1,
    wherein the convexity formed in (a) has a top surface smaller than a bottom surface.

5. The method of manufacturing a light emitting element according to claim 1,
    wherein an area centroid of the second light reflecting layer is not present on a normal line with respect to the first light reflecting layer that passes through the area centroid of the first light reflecting layer.

6. The method of manufacturing a light emitting element according to claim 1,
wherein an area centroid of the active layer is not present on a normal line with respect to the first light reflecting layer that passes through the area centroid of the first light reflecting layer.

* * * * *